United States Patent
Zhang et al.

(10) Patent No.: US 10,032,757 B2
(45) Date of Patent: Jul. 24, 2018

(54) PROJECTION DISPLAY SYSTEM

(71) Applicant: Hong Kong Beida Jade Bird Display Limited, Hong Kong (CN)

(72) Inventors: Lei Zhang, Albuquerque, NM (US); Fang Ou, Monterey Park, CA (US); Qiming Li, Albuquerque, NM (US)

(73) Assignee: Hong Kong Beida Jade Bird Display Limited, Hong Kong (CN)

( * ) Notice: Subject to any disclaimer, the term of this patent is extended or adjusted under 35 U.S.C. 154(b) by 0 days.

(21) Appl. No.: 15/246,447

(22) Filed: Aug. 24, 2016

(65) Prior Publication Data

US 2017/0069612 A1 Mar. 9, 2017

Related U.S. Application Data

(63) Continuation-in-part of application No. 15/239,467, filed on Aug. 17, 2016, which is a
(Continued)

(51) Int. Cl.
*H01L 33/00* (2010.01)
*H01L 25/16* (2006.01)
(Continued)

(52) U.S. Cl.
CPC .......... *H01L 25/167* (2013.01); *G03B 21/005* (2013.01); *H01L 25/0753* (2013.01);
(Continued)

(58) Field of Classification Search
None
See application file for complete search history.

(56) References Cited

U.S. PATENT DOCUMENTS 3,950,738 A 4/1976 Hayashi et al.
5,264,699 A 11/1993 Barton et al.
(Continued)

FOREIGN PATENT DOCUMENTS

CN 1619846 A 5/2005
CN 101241882 A 8/2008
(Continued)

OTHER PUBLICATIONS

Office Action for U.S. Appl. 15/239,467 dated Apr. 4, 2017.
(Continued)

*Primary Examiner* — Minh-Loan Tran
(74) *Attorney, Agent, or Firm* — Finnegan, Henderson, Farabow, Garrett & Dunner, LLP.

(57) ABSTRACT

A light-emitting diode (LED) projector includes an LED display panel and a projection lens arranged in front of LED display panel and configured to collect and project light emitted by the LED display panel. The LED display panel includes an LED panel and a micro lens array arranged over the LED panel. The LED panel includes a substrate, a driver circuit array on the substrate and including a plurality of pixel driver circuits arranged in an array, and an LED array including a plurality of LED dies each being coupled to one of the pixel driver circuits. The micro lens array includes a plurality of micro lenses each corresponding to and being arranged over at least one of the LED dies.

16 Claims, 41 Drawing Sheets

Related U.S. Application Data continuation-in-part of application No. 15/007,959, filed on Jan. 27, 2016.

(60) Provisional application No. 62/214,395, filed on Sep. 4, 2015, provisional application No. 62/258,072, filed on Nov. 20, 2015, provisional application No. 62/259,810, filed on Nov. 25, 2015.

(51) Int. Cl.

| | |
|---|---|
| H01L 27/15 | (2006.01) |
| H01L 33/60 | (2010.01) |
| H01L 25/075 | (2006.01) |
| H01L 25/00 | (2006.01) |
| H01L 33/52 | (2010.01) |
| H01L 33/58 | (2010.01) |
| H01L 33/62 | (2010.01) |
| G03B 21/00 | (2006.01) |

(52) U.S. Cl.
CPC ............ *H01L 25/50* (2013.01); *H01L 27/153* (2013.01); *H01L 27/156* (2013.01); *H01L 33/52* (2013.01); *H01L 33/58* (2013.01); *H01L 33/60* (2013.01); *H01L 33/62* (2013.01); *H01L 2224/04105* (2013.01); *H01L 2224/19* (2013.01); *H01L 2224/24* (2013.01); *H01L 2224/32145* (2013.01); *H01L 2224/32225* (2013.01); *H01L 2224/73267* (2013.01); *H01L 2224/82* (2013.01); *H01L 2224/92244* (2013.01); *H01L 2924/10253* (2013.01); *H01L 2924/1203* (2013.01); *H01L 2924/12032* (2013.01); *H01L 2924/13055* (2013.01); *H01L 2924/13064* (2013.01); *H01L 2924/13069* (2013.01); *H01L 2924/13091* (2013.01); *H01L 2924/14* (2013.01); *H01L 2924/1461* (2013.01); *H01L 2933/0058* (2013.01); *H01L 2933/0066* (2013.01)

(56) References Cited

U.S. PATENT DOCUMENTS

| | | | |
|---|---|---|---|
| 5,621,225 | A | 4/1997 | Shieh et al. |
| 5,624,174 | A * | 4/1997 | Loucks .............. G02B 27/1073 348/E9.027 |
| 5,653,522 | A | 8/1997 | Loucks |
| 6,005,262 | A | 12/1999 | Cunningham et al. |
| 6,262,540 | B1 | 7/2001 | Seko |
| 7,829,902 | B2 | 11/2010 | El-Ghoroury et al. |
| 8,535,961 | B1 | 9/2013 | Kuo et al. |
| 8,557,616 | B2 | 10/2013 | Lau et al. |
| 8,567,960 | B2 | 10/2013 | El-Ghoroury et al. |
| 8,642,363 | B2 | 2/2014 | Lau et al. |
| 8,851,682 | B2 * | 10/2014 | Tanigawa .............. G02B 3/0018 353/102 |
| 8,931,906 | B2 * | 1/2015 | Huang ................ G03B 21/2033 257/100 |
| 9,041,025 | B2 | 5/2015 | Lau et al. |
| 2002/0135553 | A1 * | 9/2002 | Nagai ...................... G09G 3/34 345/89 |
| 2002/0153529 | A1 | 10/2002 | Shie |
| 2002/0196431 | A1 | 12/2002 | DeFelice et al. |
| 2004/0208596 | A1 | 10/2004 | Bringans et al. |
| 2005/0067944 | A1 | 3/2005 | Masuda et al. |
| 2006/0023167 | A1 | 2/2006 | Chiang et al. |
| 2006/0274189 | A1 | 12/2006 | Mouli |
| 2007/0099395 | A1 | 5/2007 | Sridhar et al. |
| 2007/0211492 | A1 | 9/2007 | Lin |
| 2008/0308820 | A1 | 12/2008 | Louwsma et al. |
| 2009/0085045 | A1 | 4/2009 | Marion et al. |
| 2010/0020502 | A1 | 1/2010 | Tain et al. |
| 2010/0283069 | A1 | 11/2010 | Rogers et al. |
| 2010/0295070 | A1 | 11/2010 | Su et al. |
| 2010/0327386 | A1 | 12/2010 | Nagai et al. |
| 2011/0096045 | A1 | 4/2011 | Ito et al. |
| 2011/0169157 | A1 | 7/2011 | Fan |
| 2011/0233586 | A1 | 9/2011 | Kojima et al. |
| 2011/0300644 | A1 | 12/2011 | Akimoto et al. |
| 2012/0043563 | A1 | 2/2012 | Ibbetson et al. |
| 2012/0050694 | A1 | 3/2012 | Huang et al. |
| 2012/0220059 | A1 | 8/2012 | Ito et al. |
| 2012/0223875 | A1 | 9/2012 | Lau et al. |
| 2012/0288995 | A1 | 11/2012 | El-Ghoroury et al. |
| 2013/0002730 | A1 | 1/2013 | Tanigawa et al. |
| 2013/0126081 | A1 | 5/2013 | Hu et al. |
| 2013/0126098 | A1 | 5/2013 | Bibl et al. |
| 2013/0126827 | A1 | 5/2013 | Bibl et al. |
| 2013/0126914 | A1 | 5/2013 | Pan et al. |
| 2013/0126921 | A1 | 5/2013 | Mohammed et al. |
| 2013/0128585 | A1 | 5/2013 | Bibl et al. |
| 2013/0130440 | A1 | 5/2013 | Hu et al. |
| 2013/0187174 | A1 | 7/2013 | Tischler |
| 2013/0207964 | A1 | 8/2013 | Fleck et al. |
| 2013/0210194 | A1 | 8/2013 | Bibl et al. |
| 2013/0217161 | A1 | 8/2013 | Hsu |
| 2013/0240962 | A1 | 9/2013 | Wang et al. |
| 2014/0008667 | A1 | 1/2014 | Lau et al. |
| 2014/0008813 | A1 | 1/2014 | Golda et al. |
| 2014/0048909 | A1 | 2/2014 | Golda et al. |
| 2014/0061687 | A1 | 3/2014 | Hu et al. |
| 2014/0061705 | A1 | 3/2014 | Tischler |
| 2014/0084482 | A1 | 3/2014 | Hu et al. |
| 2014/0091420 | A1 | 4/2014 | Payne |
| 2014/0111408 | A1 | 4/2014 | Lau et al. |
| 2014/0158415 | A1 | 6/2014 | Golda et al. |
| 2014/0159043 | A1 | 6/2014 | Sakariya et al. |
| 2014/0159064 | A1 | 6/2014 | Sakariya et al. |
| 2014/0159065 | A1 | 6/2014 | Hu et al. |
| 2014/0159066 | A1 | 6/2014 | Hu et al. |
| 2014/0159067 | A1 | 6/2014 | Sakariya et al. |
| 2014/0159324 | A1 | 6/2014 | Golda et al. |
| 2014/0168037 | A1 | 6/2014 | Sakariya et al. |
| 2014/0168988 | A1 | 6/2014 | Petersen et al. |
| 2014/0169924 | A1 | 6/2014 | Golda et al. |
| 2014/0169927 | A1 | 6/2014 | Golda et al. |
| 2014/0196851 | A1 | 7/2014 | Golda et al. |
| 2014/0209248 | A1 | 7/2014 | Golda et al. |
| 2014/0218912 | A1 | 8/2014 | Guehne et al. |
| 2014/0241843 | A1 | 8/2014 | Golda et al. |
| 2014/0241844 | A1 | 8/2014 | Golda et al. |
| 2014/0267683 | A1 | 9/2014 | Bibl et al. |
| 2014/0319560 | A1 | 10/2014 | Tischler |
| 2014/0340900 | A1 | 11/2014 | Bathurst et al. |
| 2014/0367633 | A1 | 12/2014 | Bibl et al. |
| 2014/0367705 | A1 | 12/2014 | Bibl et al. |
| 2014/0367711 | A1 | 12/2014 | Bibl et al. |
| 2015/0003056 | A1 | 1/2015 | Choi et al. |
| 2015/0008389 | A1 | 1/2015 | Hu et al. |
| 2015/0021466 | A1 | 1/2015 | Bibl et al. |
| 2015/0028362 | A1 | 1/2015 | Chan et al. |
| 2015/0071320 | A1 | 3/2015 | Gronenborn et al. |
| 2015/0076528 | A1 | 3/2015 | Chan et al. |
| 2015/0093842 | A1 | 4/2015 | Higginson et al. |
| 2015/0137153 | A1 | 5/2015 | Bibl et al. |
| 2015/0169011 | A1 | 6/2015 | Bibl et al. |
| 2015/0179703 | A1 | 6/2015 | Sakariya et al. |
| 2015/0179876 | A1 | 6/2015 | Hu et al. |
| 2015/0179877 | A1 | 6/2015 | Hu et al. |
| 2015/0187740 | A1 | 7/2015 | McGroddy et al. |
| 2015/0187991 | A1 | 7/2015 | McGroddy et al. |
| 2015/0214420 | A1 | 7/2015 | Hu et al. |
| 2015/0216042 | A1 | 7/2015 | Golda et al. |
| 2015/0228525 | A1 | 8/2015 | Golda et al. |

(56) References Cited

U.S. PATENT DOCUMENTS

2015/0235121 A1    8/2015   Pavate et al.
2016/0276329 A1    9/2016   Bono et al.

FOREIGN PATENT DOCUMENTS

| CN | 101634800 A  | 1/2010  |
| CN | 201464787 U  | 5/2010  |
| CN | 101064330 A  | 10/2017 |
| JP | 2012-19201 A | 1/2012  |

OTHER PUBLICATIONS

International Search Report and Written Opinion issued by the State Intellectual Property Office (SIPO) of the People's Republic of China for International Application No. PCT/IB2016/001260 dated Dec. 28, 2016.

International Search Report and Written Opinion issued by the State Intellectual Property Office (SIPO) of the People's Republic of China for International Application No. PCT/IB2016/001259 dated Jan. 22, 2017.

International Search Report and Written Opinion issued by the State Intellectual Property Office (SIPO) of the People's Republic of China for International Application No. PCT/IB2016/001342 dated Feb. 17, 2017.

\* cited by examiner

 Non-uniform screen brightness distribution
 Non-uniform lens transfer function
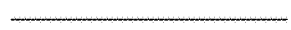 Uniform LED panel brightness distribution
FIG. 32A
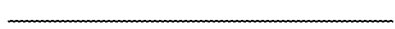 Uniform screen brightness distribution
 Non-uniform lens transfer function
 Pre-compensated non-uniform LED panel brightness distribution
FIG. 32B

PROJECTION DISPLAY SYSTEM

CROSS-REFERENCE TO RELATED APPLICATIONS

This application is a continuation-in-part of application Ser. No. 15/239,467, filed on Aug. 17, 2016, which is a continuation-in-part of application Ser. No. 15/007,959, filed on Jan. 27, 2016, which is based upon and claims the benefit of priority from Provisional Application Nos. 62/214,395, 62/258,072, and 62/259,810, filed on Sep. 4, 2015, Nov. 20, 2015, and Nov. 25, 2015, respectively, the entire contents of all of which are incorporated herein by reference.

TECHNOLOGY FIELD

The disclosure relates to a projection display system and, more particularly, to a projection display system having one or more light-emitting diode (LED) display panels.

BACKGROUND

Since the first television set was invented in the early 1920's, display technology has developed quickly over the past 90 years. One of the display technologies is digital display, which has now become one of the largest branches in the field of modern electronics and optoelectronics and generates demands in various applications where an image forming function is needed. Among those applications, projection-based display, which has the potential of generating a large size image with low cost, is of great interest.

In a conventional projection system based on a passive imager device, such as liquid crystal display (LCD), digital mirror devices (DMD), and liquid crystal on silicon (LCOS), the passive imager device itself does not emit light. Specifically, the conventional projection system projects images by optically modulating collimated light emitted from a light source, i.e., by either transmitting, e.g., by an LCD panel, or reflecting, e.g., by a DMD panel, part of the light at the pixel level. However, the part of the light that is not transmitted or reflected is lost, which reduces the efficiency of the projection system. Furthermore, to provide the collimated light, complex illumination optics is required to collect divergent light emitted from the light source. The illumination optics not only causes the system to be bulky but also introduces additional optical loss into the system, which further impacts the performance of the system. In a conventional projection system, typically less than 10% of the illumination light generated by the light source is used to form the projection image.

Moreover, a conventional LCD projection display system usually includes a high-pressure Hg lamp as a light source, and three LCD panels to control the passing-through of light of different colors. The conventional LCD projection display system usually also requires a plurality of light-splitting components to separate the light from the light source into light beams of different colors, a plurality of reflection mirrors to direct the light beams to corresponding LCD panels, and a plurality of fans to dissipate heat. As a result, the conventional LCD projection display system can be bulky and not energy efficient. For example, the conventional LCD projection display system can have a size of 232 mm×132 mm×40 mm, and an efficiency of only about 10 lumen/W.

Light-emitting diodes (LEDs) made of semiconductor materials can be used in mono-color or full-color displays. In current displays that employs LEDs, the LEDs are usually used as the light source to provide the light to be optically modulated by, e.g., the LCD or the DMD panel. That is, the light emitted by the LEDs does not form images by itself. LED displays using LED panels including a plurality of LED dies as the imager devices have also been studied. In such an LED display, the LED panel is a self-emissive imager device, where each pixel can include one LED die (mono-color display) or a plurality of LED dies each of which represents one of primary colors (full-color display). However, projection display systems using an LED panel as the imager device have not been developed.

SUMMARY

In accordance with the disclosure, there is provided a light-emitting diode (LED) projector including an LED display panel and a projection lens arranged in front of LED display panel and configured to collect and project light emitted by the LED display panel. The LED display panel includes an LED panel and a micro lens array arranged over the LED panel. The LED panel includes a substrate, a driver circuit array on the substrate and including a plurality of pixel driver circuits arranged in an array, and an LED array including a plurality of LED dies each being coupled to one of the pixel driver circuits. The micro lens array includes a plurality of micro lenses each corresponding to and being arranged over at least one of the LED dies.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIGS. 32A and 32B schematically show brightness distributions of an LED panel and on a screen and a transfer function of a projection lens or lens set without and with brightness compensation.

DESCRIPTION OF THE EMBODIMENTS

Hereinafter, embodiments consistent with the disclosure will be described with reference to the drawings. Wherever possible, the same reference numbers will be used throughout the drawings to refer to the same or like parts.

Light emitted by an light-emitting diode (LED) die is generated from spontaneous emission and is thus not directional, resulting in a large divergence angle. In a projection system employing an LED array having a plurality of LED dies as a self-emissive imager device, a projection lens or a projection lens set is needed to project the image generated by the LED array, and the projection lens may have a limited numerical aperture. Thus, due to the large divergence angle of the LED dies, only a portion of the light emitted by the LED dies can be collected by the projection lens. This reduces the brightness of the LED-based projection system and/or increases the power consumption.

Embodiments consistent with the disclosure include a monolithically integrated LED display panel as a self-emissive imager device, including a substrate with an array of pixel driver circuits, an array of LED dies formed over the substrate, and an array of micro lens formed over the array of LED dies, and methods of making the LED display panel. The LED display panel and projection systems based on the LED display panel combine the light source, the image forming function, and the light beam collimation function into a single monolithic device and are capable of overcoming the drawbacks of conventional projection systems.

Figure 1:
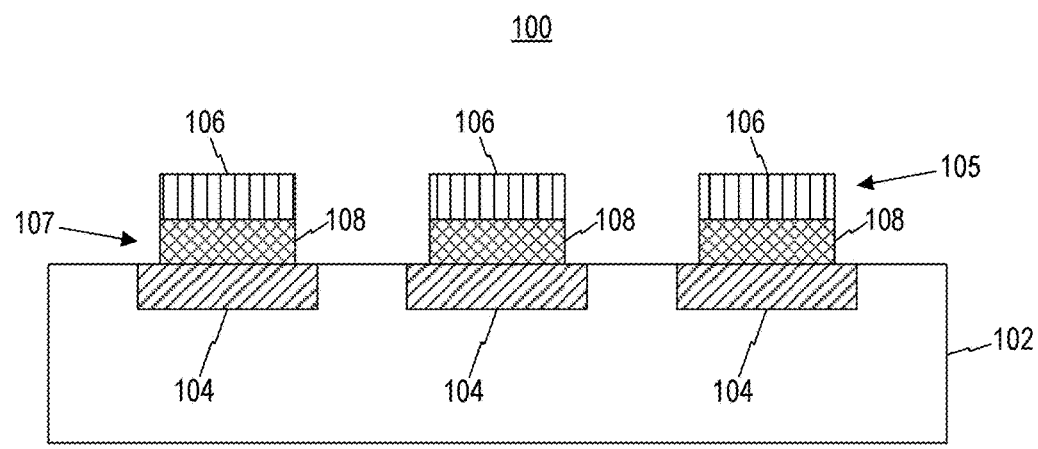
FIG. 1 is a cross-sectional view schematically showing a vertically-integrated semiconductor apparatus according to an exemplary embodiment.

FIG. 1 is a cross-sectional view schematically showing an exemplary vertically-integrated semiconductor apparatus 100 consistent with embodiments of the present disclosure. The semiconductor apparatus 100 includes a driver circuit wafer 102 having a plurality of driver circuits 104 formed therein as an array. As used herein, the term "wafer" refers to a thin portion of material that may or may not have device structures or other fine structure formed therein. The semiconductor apparatus 100 further includes a functional device epi-layer 105 formed over the driver circuit wafer 102. The functional device epi-layer 105 includes a plurality of functional device dies 106 arranged in an array. As used herein, the term "die" refers to a small block of semiconductor material or a small area of a portion of semiconductor material that includes one or more individual functional devices. The semiconductor apparatus 100 also includes a bonding metal layer 107 formed between the driver circuit wafer 102 and the functional device epi-layer 105. The bonding metal layer 107 includes a plurality of bonding metal pads 108 arranged in an array and isolated, both spatially and electrically, from each other.

Consistent with the present disclosure, each of the driver circuits 104 corresponds to and is horizontally aligned with one of the bonding metal pads 108. In addition, each of the functional device dies 106 corresponds to and is horizontally aligned with one of the driver circuits 104 and one of the bonding metal pads 108. That is, a driver circuit 104 and a corresponding functional device 106 are bonded together through only one corresponding bonding metal pad 108. In other words, the driver circuits 104, the bonding metal pads 108, and the functional devices 106 have a one-to-one relationship.

Consistent with the present disclosure, each of the bonding metal pads 108 includes one or more electrically conductive materials, such as one or more metals or alloys, and also serves as an electrical contact between the corresponding driver circuit 104 and functional device die 106 for transmitting electrical signals therebetween. For example, the bonding material for the bonding metal pads 108 can include tin (Sn), gold (Au), nickel (Ni), indium (In), palladium (Pd), or copper (Cu), or an alloy of any two or more of these metals, such as Au—Sn metal alloy. Alternatively, each of the bonding metal pads 108 can include a composite layer having multiple sublayers each including one or more suitable bonding materials or alloys thereof. Moreover, each of the bonding metal pads 108 can also include, on either one or each of the side facing the driver circuit wafer 102 and the side facing the functional device epi-layer 105, an adhesion layer and/or a bonding diffusion barrier layer. The adhesion layer facilitates the adhesion between the bonding metal pad 108 and the driver circuit wafer 102 or the corresponding functional device die 106, and the bonding diffusion barrier layer helps to prevent or reduce diffusion of the bonding material(s).

In the present disclosure, the functional device dies 106 refer to semiconductor dies that can perform certain functions. The functional device dies 106 may be the same as or different from each other. According to the present disclosure, the functional device dies 106 are configured such that no part of a growth substrate, which is used for growing epitaxial layers that are used to form the functional device dies 106, remains in the functional device dies 106.

In some embodiments, the functional device dies 106 may be opto-electronic device dies, such as light-emitting device dies or light-absorbing device dies. The light-emitting device dies may be light-emitting diode (LED) dies. The light-emitting device dies may also be laser diode (LD) dies, such as edge emitting lasers (e.g., Fabry-Perot (FP) lasers, distributed feedback (DFB) lasers, or distributed Bragg reflector (DBR) lasers) or vertical cavity surface emitting lasers (VCSELs). Examples of the light-absorbing device dies include semiconductor photodetector dies and solar cells. If the functional device dies 106 are opto-electronic device dies, each of the functional device dies 106 includes an active region associated with a certain wavelength or a certain wavelength range, i.e., the active region is configured to emit or absorb light of a certain wavelength or a certain wavelength range. As noted above, the functional device dies 106 can be the same as or different from each other. Correspondingly, the active regions of different functional device dies 106 can be associated with the same or different wavelengths or wavelength ranges.

In some embodiments, if the functional device dies 106 include LED dies, each of the functional device dies 106 can include a roughened uppermost epitaxial layer. The upper surface of the uppermost epitaxial layer is roughened to improve light extraction from the LED die.

The functional device dies 106 are not limited to opto-electronic devices, but can be other types of electrical devices. For example, the functional device dies 106 can be micro-electro-mechanical system (MEMS) dies, such as MEMS sensors. The functional device dies 106 can also be power electronic device dies, such as insulated-gate bipolar transistor (IGBT) dies, Schottky barrier diode (SBD) dies, or junction barrier Schottky (JBS) rectifier dies.

Depending on the type of the functional device dies 106, the functional device epi-layer 105 may be made of different types of materials. For example, the functional device epi-layer 105 may include elemental semiconductors (e.g., silicon (Si) or germanium (Ge)). The functional device epi-layer 105 may also include compound semiconductors, such as II-VI compound semiconductors (e.g., zinc oxide (ZnO), zinc telluride (ZnTe), and zinc sulphide (ZnS)), III-V compound semiconductors (e.g., indium-phosphide (InP) based semiconductors such as InP, indium-gallium arsenide (InGaAs), and indium-gallium arsenide phosphide (InGaAsP), gallium-arsenide (GaAs) based semiconductors such as GaAs, aluminum-gallium arsenide (AlGaAs), and gallium arsenide antimonide (GaAsSb), or gallium-nitride (GaN) based semiconductors such as GaN, indium-gallium nitride (InGaN), and aluminum-gallium nitride (AlGaN)), or IV-IV compound semiconductors (e.g., silicon carbide (SiC) or Si—Ge alloy).

In the present disclosure, the driver circuit wafer 102 is also referred to as a "driver circuit substrate" or a "carrier wafer." The driver circuit wafer 102 may include a semiconductor substrate, such as an amorphous semiconductor substrate, a polycrystalline semiconductor substrate, or a single crystalline semiconductor substrate. For example, the driver circuit wafer 102 can include a single crystalline silicon (Si) substrate or a single crystalline III-V compound semiconductor substrate. In some embodiments, the driver circuit wafer 102 may include one or more dielectric layers (not shown), such as silicon dioxide ($SiO_2$) layers, formed over the semiconductor substrate. Wirings and/or contacts of the driver circuits 104 may be formed in or over the one or more dielectric layers.

Depending on the type of the functional device dies 106, the driver circuits 104 may include different types of devices. For example, each of the driver circuits 104 may include a single semiconductor device such as a metal-oxide-semiconductor field-effect transistor (MOSFET), a thin-film-transistor (TFT), a high-electron-mobility transistor (HEMT), a heterojunction bipolar transistor (HBT), a metal-semiconductor FET (MESFET), or a metal-insulator-semiconductor FET (MISFET), or an integrated circuit including two or more of any type of the above-listed devices.

FIG. 1 is a high-level schematic view of the semiconductor apparatus 100. Each of the driver circuits 104 or the functional device dies 106 is illustrated as a single block in FIG. 1, but can include multiple components such as contacts and different material layers. Moreover, the semiconductor apparatus 100 consistent with the present disclosure also includes other components, such as wirings, isolation layers, and/or passivation layers, which may be part of the driver circuit wafer 102 and/or part of the functional device epi-layer 105, or may be components in addition to the driver circuit wafer 102, the functional device epi-layer 105, and the bonding metal layer 107. These other components are not explicitly illustrated in FIG. 1, and may also not be explicitly illustrated in other drawings of the present disclosure. According to the present disclosure, since the functional device dies 106 in the semiconductor apparatus 100 do not have any part of the growth substrate remaining on top of them, the other components related to the functional device dies 106, such as the wirings and passivation layers for the functional device dies 106, can be formed directly on the uppermost epitaxial layer in each of the functional device dies 106.

Figure 2A:
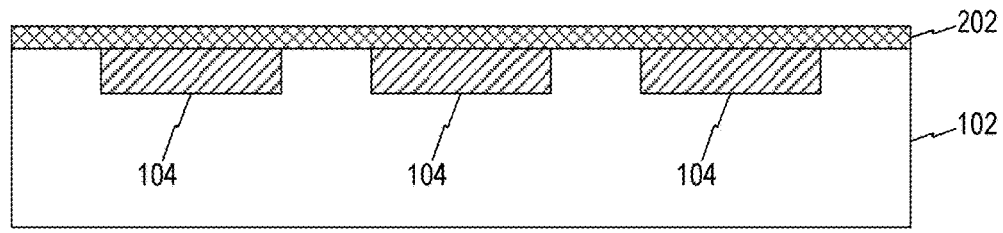
FIGS. 2A-2E schematically show a process for manufacturing the semiconductor apparatus of FIG. 1 according to an exemplary embodiment.

FIGS. 2A-2E schematically show an exemplary process for manufacturing the semiconductor apparatus 100 consistent with embodiments of the present disclosure. As shown in FIG. 2A, a first pre-bonding metal layer 202 is formed over the driver circuit wafer 102, in which the driver circuits 104 were previously formed. The first pre-bonding metal layer 202 includes a bonding material sublayer containing, for example, Sn, Au, Ni, Pd, or Cu, or an alloy thereof. The bonding material sublayer may also include a multi-layer structure having a plurality of layers of one or more bonding materials. In some embodiments, the first pre-bonding metal layer 202 can also include an adhesion sublayer and/or a bonding diffusion barrier sublayer formed between the bonding material sublayer and the driver circuit wafer 102. The adhesion sublayer is configured to enhance the adhesion between the bonding material sublayer and the driver circuit wafer 102, while the bonding diffusion barrier sublayer is configured to prevent or reduce diffusion of the bonding material(s).

Figure 2B:
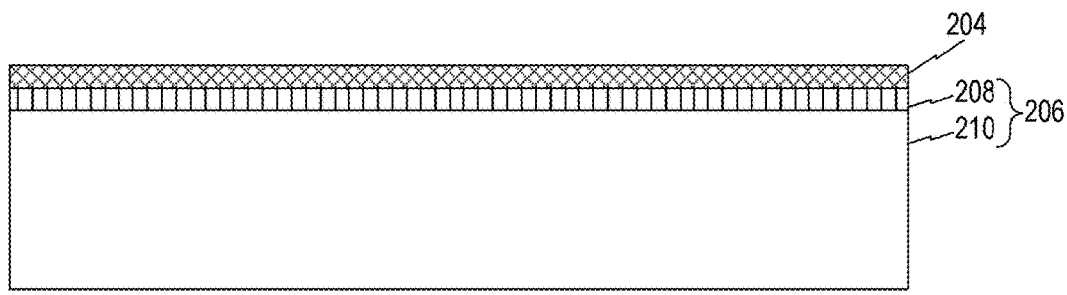

Referring to FIG. 2B, separate from the driver circuit wafer 102, a second pre-bonding metal layer 204 is formed over a functional device wafer 206. The second pre-bonding metal layer 204 includes a bonding material sublayer containing, for example, Sn, Au, Ni, Pd, or Cu, or an alloy thereof. The bonding material sublayer may also include a multi-layer structure having a plurality of layers of one or more bonding materials. In some embodiments, the second pre-bonding metal layer 204 can also include an adhesion sublayer and/or a bonding diffusion barrier sublayer formed between the bonding material sublayer and the functional device wafer 206. The adhesion sublayer is configured to enhance the adhesion between the bonding material sublayer and the functional device wafer 206, while the bonding diffusion barrier sublayer is configured to prevent or reduce diffusion of the bonding material(s). In the present disclosure, the functional device wafer 206 is also referred to as an "epi wafer." The functional device wafer 206 includes a functional device epi-structure layer 208, which is also referred to as an "epi-structure layer," epitaxially grown on a growth substrate 210. Depending on the type of the functional device dies 106 to be formed as discussed above, the epi-structure layer 208 can include different epitaxial structures that are suitable for forming the final functional device dies 106. For example, the epi-structure layer 208 can include an opto-electronic device epi-structure layer, such as an LED epi-structure layer, a VCSEL epi-structure layer, or a photodetector epi-structure layer. As another example, the epi-structure layer 208 can include a MEMS epi-structure layer, such as a MEMS sensor epi-structure layer.

The growth substrate 210 can be any substrate that is suitable for the epitaxial growth of the epi-structure layer 208, and is separately provided. For example, if the epi-structure layer 208 includes a GaN-based material, the growth substrate 210 can be a sapphire substrate, such as a patterned sapphire substrate, or can be a SiC substrate. As another example, if the epi-structure layer 208 includes an InP-based material, the growth substrate 210 can be an InP substrate. As a further example, if the epi-structure layer 208 includes a GaAs-based material, the growth substrate 210 can be a GaAs substrate.

Figure 2C:
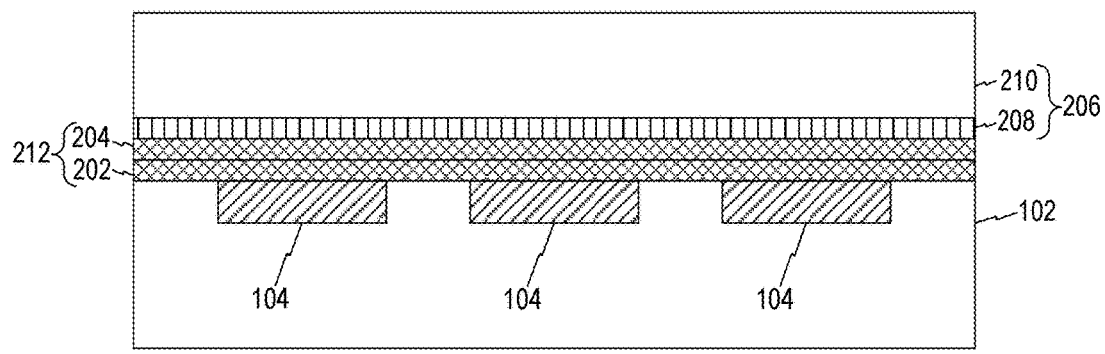

Referring to FIG. 2C, the functional device wafer 206 having the second pre-bonding metal layer 204 formed thereon is transferred over and aligned with the driver circuit wafer 102 having the first pre-bonding metal layer 202 formed thereon (shown in FIG. 2A), with the second pre-bonding metal layer 204 facing the first pre-bonding metal layer 202. The functional device wafer 206 is brought into contact with the driver circuit wafer 102, such that the second pre-bonding metal layer 204 contacts and is pressed against the first pre-bonding metal layer 202. A bonding process is conducted to bond the first and second pre-bonding metal layers 202 and 204 to each other to form an unpatterned bonding metal layer 212. In some embodiments, the bonding process includes heating at an elevated temperature such that at least a portion of the first pre-bonding metal layer 202 and at least a portion of the second pre-bonding metal layer 204 melt and the first and second pre-bonding metal layers 202 and 204 are welded to each other. The temperature at which the bonding process is conducted depends on the bonding material(s) used, and can, for example, range from about 230° C. to higher than 350° C. when Au—Sn alloy is used as the bonding material. Other bonding techniques can also be applied as long as they can bond the first and second pre-bonding metal layers 202 and 204 together.

Figure 2D:
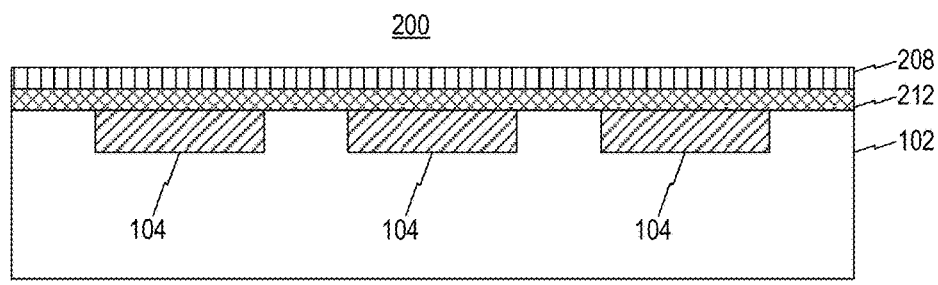

After the first and second pre-bonding metal layers 202 and 204 are bonded together to form the unpatterned bonding metal layer 212, the growth substrate 210 is removed to expose the epi-structure layer 208, as shown in FIG. 2D. The growth substrate 210 can be removed using any suitable physical or chemical substrate removing technique, such as laser lift-off, chemical-mechanical polishing (CMP), or wet etching.

After the growth substrate 210 is removed, the remaining parts constitute another exemplary semiconductor apparatus 200 consistent with embodiments of the present disclosure. That is, the semiconductor apparatus 200 is an intermediate product formed during the process of forming the semiconductor apparatus 100. The semiconductor apparatus 200 includes the driver circuit wafer 102 having the plurality of driver circuits 104 arranged in an array, the unpatterned bonding metal layer 212 formed over the driver circuit wafer 102, and the epi-structure layer 208 formed over the unpatterned bonding metal layer 212. In particular, like the semiconductor apparatus 100, the semiconductor apparatus 200 does not include the growth substrate 210, and therefore the epi-structure layer 208 is exposed to the environment. Different from the semiconductor apparatus 100, the semiconductor apparatus 200 has a horizontally continuous unpatterned bonding metal layer 212 and a horizontally continuous epi-structure layer 208.

Figure 2E:
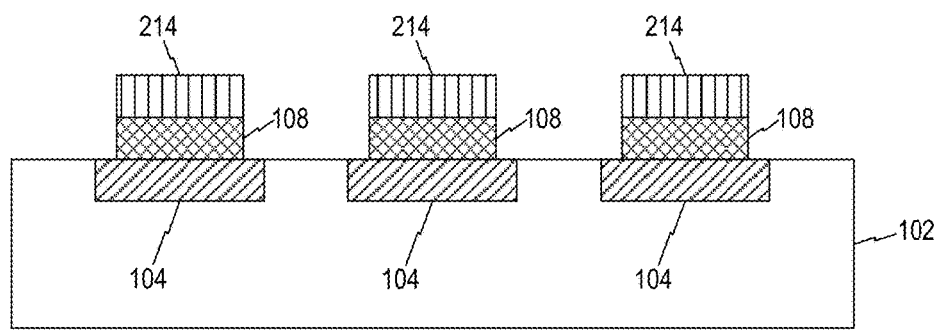

Consistent with the present disclosure, after the growth substrate 210 is removed, the epi-structure layer 208 and the unpatterned bonding metal layer 212 can be patterned, for example, using a photo-lithography method, to form functional device mesas 214 and the bonding metal pads 108, respectively, as shown in FIG. 2E. Details of this patterning process are omitted here. In some embodiments, the functional device mesas 214 may be the functional device dies 106, so that the semiconductor apparatus shown in FIG. 2E, which results from the exemplary process described above, is equivalent to the semiconductor apparatus 100 shown in FIG. 1. In some embodiments, further processing may be performed to form the functional device dies 106 from the functional device mesas 214, so as to form the semiconductor apparatus 100 shown in FIG. 1. Moreover, following the patterning process, other processes can be conducted to, for example, form wirings, insulation layers, and/or passivation layers, or to roughen upper surfaces of the functional device dies 106 to improve light extraction in the case of, e.g., LED dies. Descriptions of such processes are also omitted here.

FIGS. 3A-3D schematically show another exemplary process for manufacturing the semiconductor apparatus 100 consistent with embodiments of the present disclosure. In this exemplary process, the steps of forming the first and second pre-bonding metal layers 202 and 204 over the driver circuit wafer 102 and the functional device wafer 206, respectively, are similar to those described above in connection with FIGS. 2A and 2B. Therefore, these two steps are not illustrated again in FIGS. 3A-3D, and the descriptions thereof are omitted.

Figure 3A:
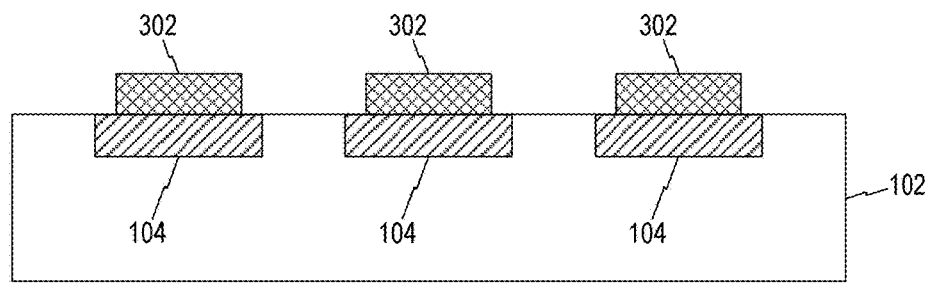
FIGS. 3A-3D schematically show a process for manufacturing the semiconductor apparatus of FIG. 1 according to another exemplary embodiment.

Referring to FIG. 3A, the first pre-bonding metal layer 202 is patterned to form first pre-bonding metal pads 302.

The first pre-bonding metal pads 302 are arranged in an array. Each of the first pre-bonding metal pads 302 corresponds to and is electrically coupled to one of the driver circuits 104. In some embodiments, one first pre-bonding metal pad 302 corresponds to only one driver circuit 104.

According to the present disclosure, the first pre-bonding metal layer 202 can be patterned using any suitable patterning method. For example, the first pre-bonding metal layer 202 can be patterned using a photo-lithography method, during which the first pre-bonding metal layer 202 is etched to remove portions thereof, so as to form the first pre-bonding metal pads 302. Alternatively, the first pre-bonding metal layer 202 can be patterned using a lift-off method. To pattern the first pre-bonding metal layer 202 by the lift-off method, a layer of a material suitable for lift-off (not shown in the drawings), such as a photoresist layer, can be formed over the driver circuit wafer 102 and be patterned before the first pre-bonding metal layer 202 is formed. In this scenario, the first pre-bonding metal layer 202 is formed over the patterned lift-off material layer. The patterned lift-off material layer is then removed along with the portions of the first pre-bonding metal layer 202 that are formed directly on the lift-off material layer. The remaining portions of the first pre-bonding metal layer 202 form the first pre-bonding metal pads 302.

Figure 3B:
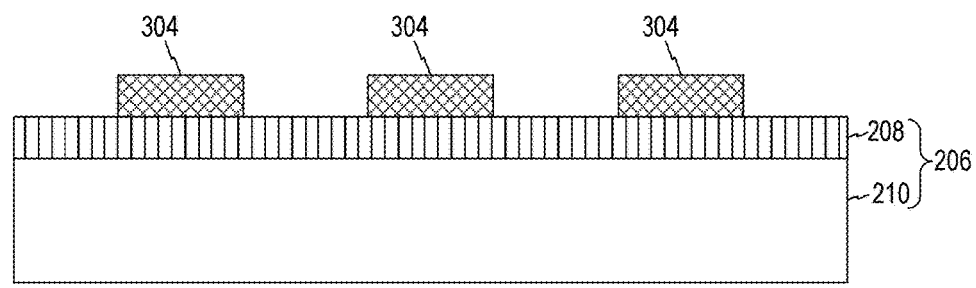

Referring to FIG. 3B, the second pre-bonding metal layer 204 is patterned to form second pre-bonding metal pads 304 that are arranged in an array. Each of the second pre-bonding metal pads 304 corresponds to one of the first pre-bonding metal pads 302, and also corresponds to one of the functional device dies 106 to be formed. Consistent with the present disclosure, the second pre-bonding metal layer 204 can be patterned using a method similar to that used to pattern the first pre-bonding metal layer 202, e.g., the second pre-bonding metal layer 204 can be patterned by etching or lift-off.

Figure 3C:
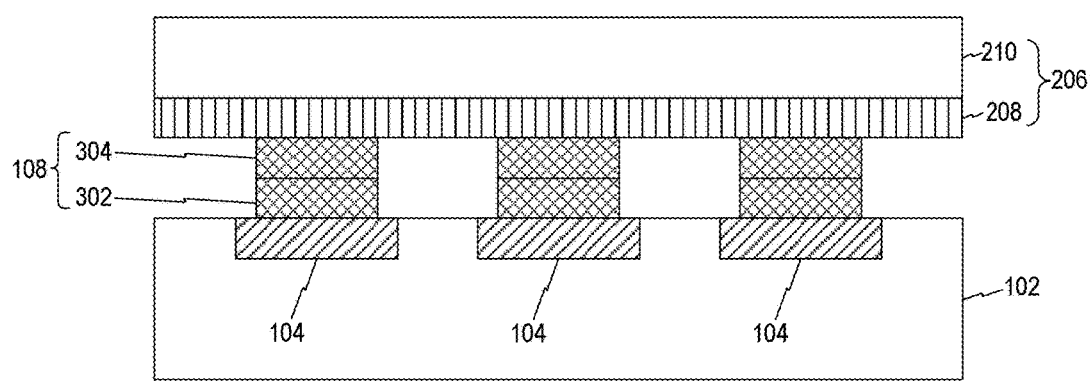

After the first and second pre-bonding metal layers 202 and 204 are patterned, the functional device wafer 206 is transferred over and aligned with the driver circuit wafer 102, with the second pre-bonding metal pads 304 facing corresponding ones of the first pre-bonding metal pads 302, as shown in FIG. 3C. Each of the second pre-bonding metal pads 304 is aligned with one of the first pre-bonding metal pads 302. The functional device wafer 206 is brought into contact with the driver circuit wafer 102, such that the second pre-bonding metal pads 304 contact and are pressed against their corresponding first pre-bonding metal pads 302. A bonding process similar to that described with respect to FIG. 2C is conducted to bond the second pre-bonding metal pads 304 with the first pre-bonding metal pads 302 to form the bonding metal pads 108.

Figure 3D:
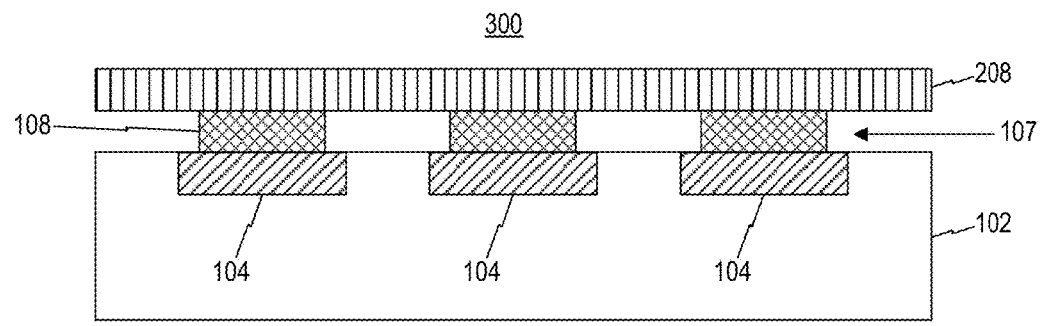

After the first and second pre-bonding metal pads 302 and 304 are bonded together to form the bonding metal layer 107 having the bonding metal pads 108, the growth substrate 210 is removed to expose the epi-structure layer 208, as shown in FIG. 3D.

After the growth substrate 210 is removed, the remaining parts constitute another exemplary semiconductor apparatus 300 consistent with embodiments of the present disclosure. That is, the semiconductor apparatus 300 is another intermediate product formed during the process of forming the semiconductor apparatus 100. The semiconductor apparatus 300 includes the driver circuit wafer 102 having the plurality of driver circuits 104 arranged in an array, the bonding metal layer 107 formed over the driver circuit wafer 102 and having the bonding metal pads 108 arranged in an array, and the epi-structure layer 208 formed over the bonding metal layer 107. In particular, like the semiconductor apparatus 100, the semiconductor apparatus 300 does not include the growth substrate 210, and therefore the epi-structure layer 208 is exposed to the environment. Different from the semiconductor apparatus 100, the semiconductor apparatus 300 has a horizontally continuous epi-structure layer 208.

Consistent with the present disclosure, after the growth substrate 210 is removed, the epi-structure layer 208 can be patterned, for example, using a photo-lithography method, to form the functional device mesas 214, resulting in a semiconductor apparatus similar to that shown in FIG. 2E, which is thus not shown again. Details of patterning the epi-structure layer 208 are omitted here.

Figure 4A:
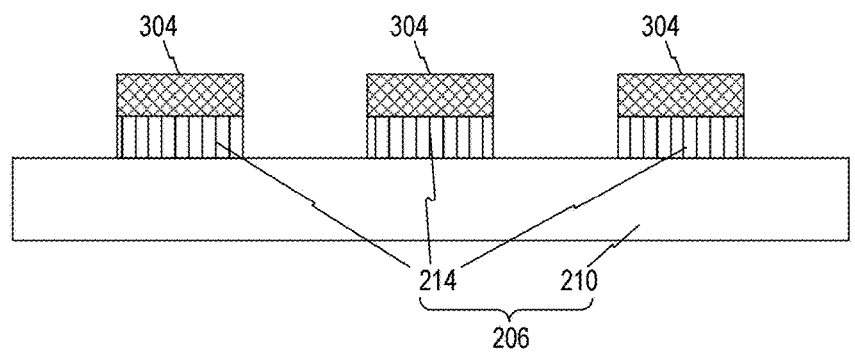
FIGS. 4A and 4B schematically show a process for manufacturing the semiconductor apparatus of FIG. 1 according to another exemplary embodiment.
Figure 4B:
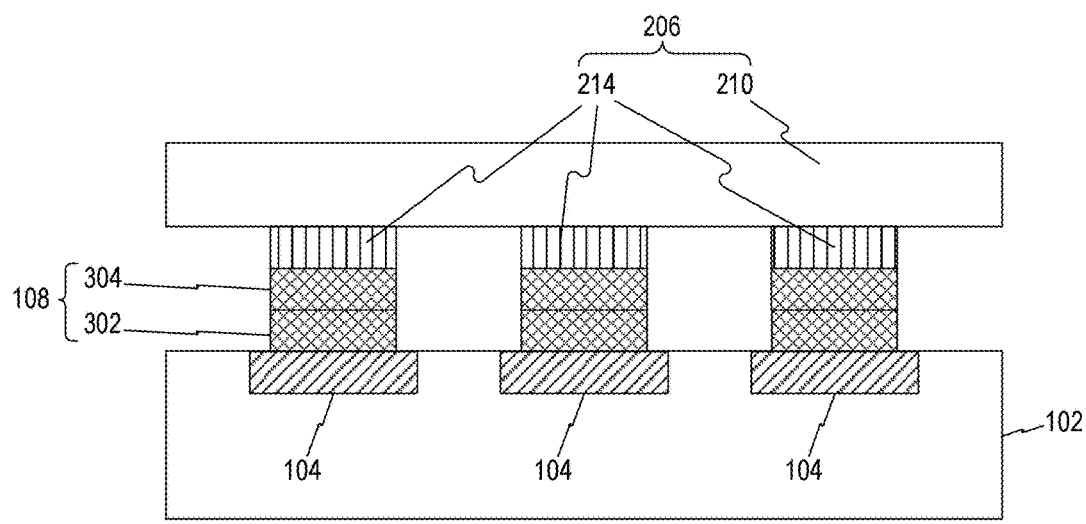

FIGS. 4A and 4B schematically show another exemplary process for manufacturing the semiconductor apparatus 100 consistent with embodiments of the present disclosure. In this exemplary process, the steps of forming the first and second pre-bonding metal layers 202 and 204, and the steps of patterning the first and second pre-bonding metal layers 202 and 204 to form the first and second pre-bonding metal pads 302 and 304 are similar to those described above in connection with FIGS. 2A, 2B, 3A, and 3B. Therefore, these steps are not illustrated again in FIGS. 4A and 4B, and the descriptions thereof are omitted.

Referring to FIG. 4A, the epi-structure layer 208 is patterned to form the functional device mesas 214. For example, the epi-structure layer 208 can be patterned by etching using the second pre-bonding metal pads 304 as masks. As another example, the epi-structure layer 208 can be patterned by a separate photolithography process, which includes, e.g., forming a photoresist layer over the epi-structure layer 208 and the second pre-bonding metal pads 304, patterning the photoresist layer to remove portions of the photoresist layer with remaining portions over the second pre-bonding metal pads 304, and then etching the epi-structure layer 208 using the remaining portions of the photoresist layer as masks. Each of the remaining portions of the photoresist layer may have a larger area than the corresponding second pre-bonding metal pad 304, and thus each of the functional device mesas 214 formed by the above second exemplary process may have a larger area than the corresponding second pre-bonding metal pad 304, although the larger area is not explicitly illustrated in FIG. 4A.

Then, as shown in FIG. 4B, the functional device wafer 206 is bonded with the driver circuit wafer 102. A bonding process similar to that described above in connection with FIG. 3C is conducted to bond the functional device wafer 206 and the driver circuit wafer 102.

After the functional device wafer 206 and the driver circuit wafer 102 are bonded together, the growth substrate 210 is removed to expose the functional device mesas 214, resulting in a semiconductor apparatus similar to that shown in FIG. 2E, which is thus not shown again.

In the exemplary process described above in connection with FIGS. 4A and 4B, the second pre-bonding metal layer 204 is first formed and patterned to form the second pre-bonding metal pads, and the epi-structure layer 208 is patterned thereafter. In some embodiments, the epi-structure layer 208 can be patterned before the second pre-bonding metal layer 204 is formed over the functional device wafer 206. This exemplary process is described below in connection with FIGS. 5A and 5B.

In this exemplary process, the steps of forming and patterning the first pre-bonding metal layer 202 are similar to those described above in connection with FIGS. 2A and 3A. Therefore, these steps are not illustrated again in FIGS. 5A and 5B, and the descriptions thereof are omitted.

Figure 5A:
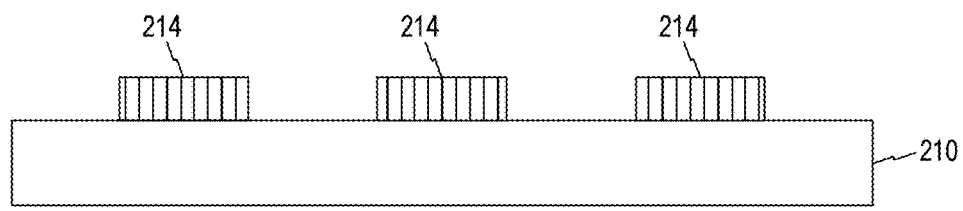
FIGS. 5A-5B schematically show a process for manufacturing the semiconductor apparatus of FIG. 1 according to another exemplary embodiment.
Figure 5B:
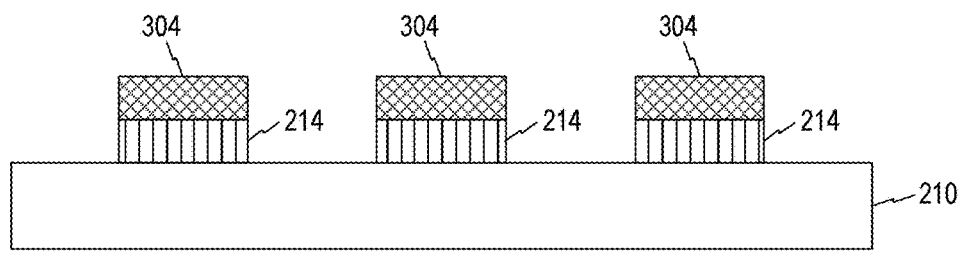

Referring to FIG. 5A, the epi-structure layer 208 is patterned, for example, using a photolithography method, to form the functional device mesas 214. Then, as shown in FIG. 5B, the second pre-bonding metal pads 304 are formed over the functional device mesas 214. For example, forming the second pre-bonding metal pads 304 can include first depositing the pre-bonding metal layer 204 (not shown in FIG. 5B) and then patterning the pre-bonding metal layer 204 to form the second pre-bonding metal pads 304. The subsequent processing steps of this exemplary process are similar to those described above in connection with FIGS. 4B and 4C, and thus are not illustrated and descriptions thereof are omitted.

In the exemplary process described above in connection with FIGS. 2A-2E, both the first and second pre-bonding metal layers 202 and 204 are patterned after the driver circuit wafer 102 and the functional device wafer 206 are bonded together, while in the exemplary processes described above in connection with FIGS. 3A-5B, both the first and second pre-bonding metal layers 202 and 204 are patterned before the driver circuit wafer 102 and the functional device wafer 206 are bonded together. In other embodiments, either one of the first pre-bonding metal layer 202 or the second pre-bonding metal layer 204 can be patterned before the bonding process and the other one can be patterned after the bonding process.

Figure 6A:
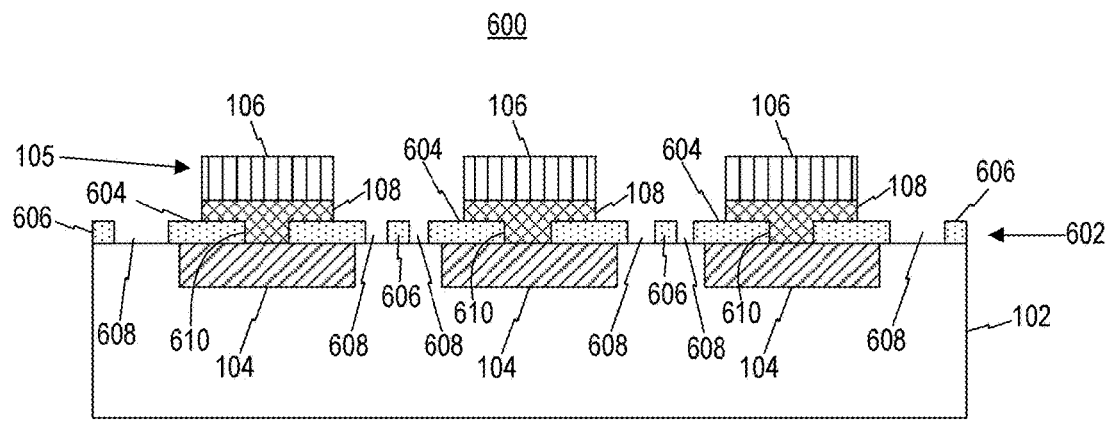
FIGS. 6A and 6B schematically show a semiconductor apparatus according to another exemplary embodiment.
Figure 6B:
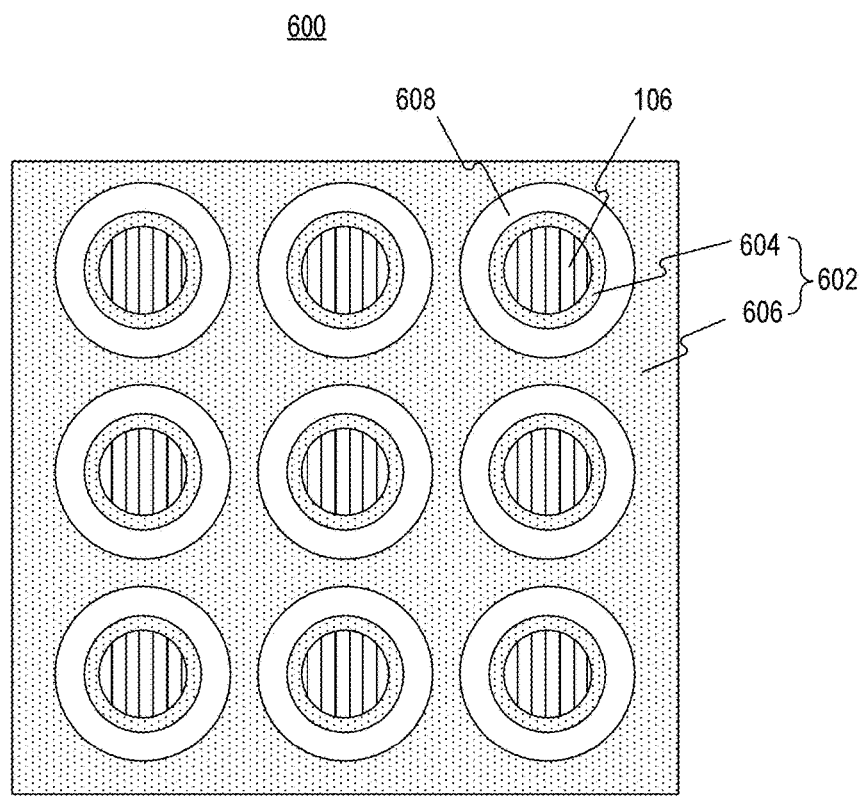

In the exemplary processes described above in connection with FIGS. 3A-5B, the first and second pre-bonding metal pads 302 and 304 are formed before the bonding process. The first pre-bonding metal pads 302 are physically and electrically separated from each other. Similarly, the second pre-bonding metal pads 304 are physically and electrically separated from each other. However, during the bonding process, portions of the first and second pre-bonding metal pads 302 and 304 may melt and, under the pressure exerted during the bonding process, the melt metal from the first and/or second pre-bonding metal pads 302, 304 may flow along the surface of the driver circuit wafer 102 and reach neighboring first and/or second pre-bonding metal pads 302, 304, causing a short circuit in the resulting semiconductor apparatus. To avoid this issue, structures preventing the melt metal from reaching neighboring first and/or second pre-bonding metal pads 302, 304 can be formed in the semiconductor apparatus. FIGS. 6A and 6B schematically show an exemplary semiconductor apparatus 600 having such structures consistent with embodiments of the present disclosure.

FIG. 6A is a cross-sectional view schematically showing the semiconductor apparatus 600, which is similar to the semiconductor apparatus 100, except that the semiconductor apparatus 600 further includes a dielectric isolation layer 602 arranged between the driver circuit wafer 102 and the functional device epi-layer 105. The dielectric isolation layer 602 includes first protrusion structures 604 and second protrusion structures 606 surrounding the first protrusion structures 604. As shown in FIG. 6A, each of the first protrusion structures 604 is formed over one of the driver circuits 104, and each of the bonding metal pads 108 is formed over one of the first protrusion structures 604. That is, each of the first protrusion structures 604 "holds" one bonding metal pad 108, and thus the first protrusion structures 604 are also referred to in this disclosure as "bonding metal pad plateaus" or "solder pad plateaus."

FIG. 6B is a plan view of the semiconductor apparatus 600, showing the second protrusion structures 606 surrounding each of the first protrusion structures 604 and separating neighboring first protrusion structures 604 from each other.

As shown in FIGS. 6A and 6B, each of the first protrusion structures 604 and the corresponding neighboring second protrusion structures 606 define a recess 608 surrounding the first protrusion structure 604. During the bonding process, if melt bonding metal outflows from the first protrusion structures 604, it is contained in the recesses 608 and confined by the second protrusion structures 606, and does not reach neighboring bonding metal pads 108. Thus, the recesses 608 are also referred to in this disclosure as "bonding metal reservoirs" or "solder reservoirs," and the second protrusion structures 606 are also referred to as "bonding metal confinement dams" or "solder confinement dams."

Referring again to FIG. 6A, each of the first protrusion structures 604 includes a through hole 610 formed between the upper surface and the lower surface of that first protrusion structure 604. At least a portion of the corresponding bonding metal pad 108 is formed in the through hole 610, forming an electrical path to the corresponding driver circuit 104 located beneath the first protrusion structure 604.

Consistent with the present disclosure, the dielectric isolation layer 602 can also be included in the semiconductor apparatus 300, in a manner similar to that shown in FIGS. 6A and 6B and described above.

Figure 7A:
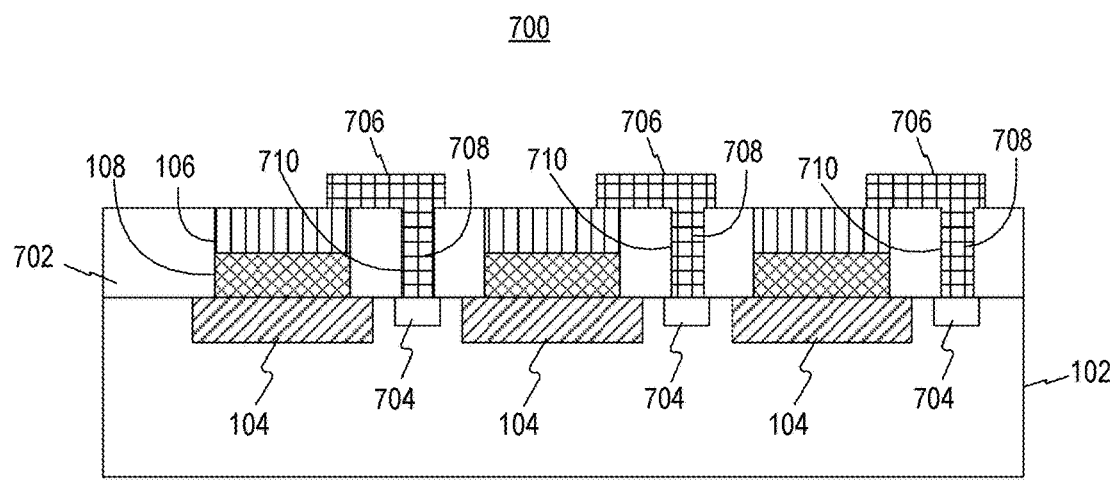
FIGS. 7A and 7B schematically show a semiconductor apparatus according to another exemplary embodiment.
Figure 7B:
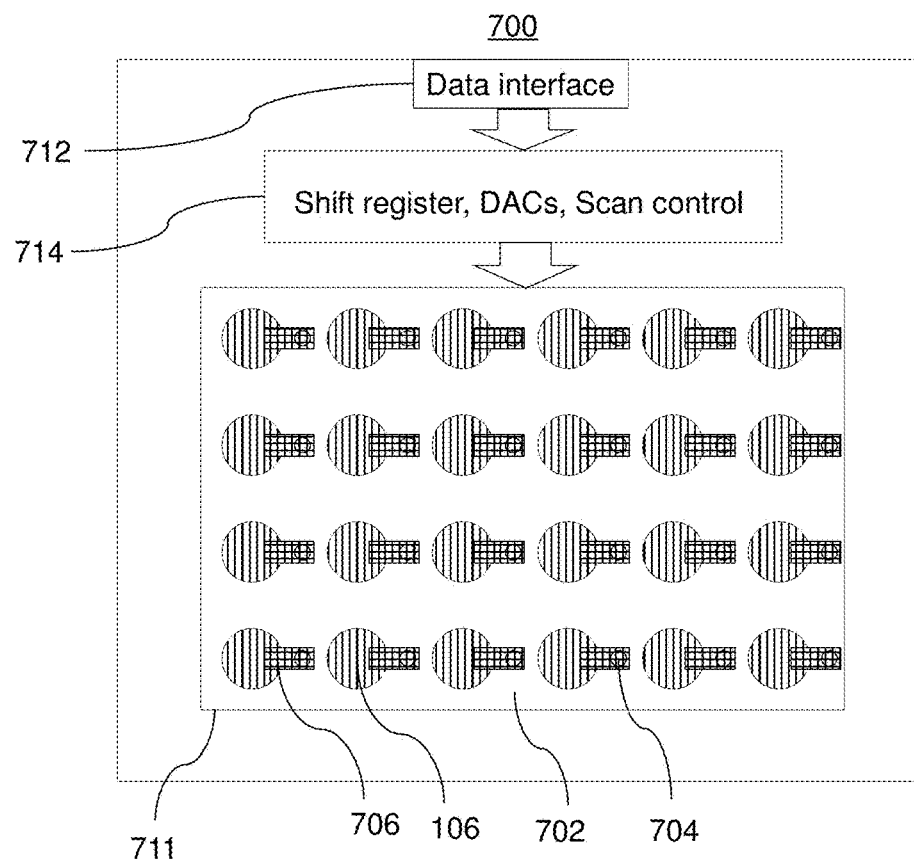

As described above, the functional device dies 106 are spatially separated from each other. In some embodiments, an isolation layer may be formed between the functional device dies 106. FIGS. 7A and 7B schematically show another exemplary semiconductor apparatus 700 consistent with embodiments of the present disclosure. The semiconductor apparatus 700 is similar to the semiconductor apparatus 100, except that the semiconductor apparatus 700 further includes an isolation layer 702 formed between the functional device dies 106. FIG. 7A is a cross-sectional view schematically showing the semiconductor apparatus 700. In the example shown in FIG. 7A, the top surface of the isolation layer 702 is flat or approximately flat, and is flush or approximately flush with top surfaces of the functional device dies 106. However, the isolation layer 702 can be higher or lower than the functional device dies 106. Consistent with the present disclosure, the isolation layer 702 can be formed of, for example, a dielectric material to improve the electrical isolation between neighboring functional device dies 106.

As noted above, the functional device dies 106 can be opto-electronic device dies that can emit or absorb light of a certain wavelength. The spatial separation among the opto-electronic device dies can ensure good optical isolation between neighboring opto-electronic device dies. Such an optical isolation can, for example, reduce cross-talk between the neighboring opto-electronic device dies. The optical isolation can be further improved by choosing a suitable material for the isolation layer 702 in the semiconductor apparatus 700. That is, the isolation layer 702 can be formed of a material that further reduces light transmission between neighboring opto-electronic device dies. For example, the material can be a light absorptive material that can absorb light having a wavelength associated with an opto-electronic device die, such as an LED die. In the present disclosure, a wavelength or a wavelength range associated with a die or a layer refers to a wavelength or a wavelength range of light emitted or absorbed by the die or the layer. The absorptive material can be a material having a lower transparency than air. In some embodiments, the isolation layer 702 is formed of a material that is non-transparent to light having a wavelength associated with the opto-electronic device dies. For example, if the opto-electronic device dies include LED dies that emit blue light, a material non-transparent to blue light can be chosen to form the isolation layer 702. Alternatively, the isolation layer 702 can include a reflective material that can reflect light having a wavelength associated with an opto-electronic device die, such as an LED die. For example, the reflective material may reflect the light emitted by an LED die back to that LED die. The reduced-transparency (absorptive) material or the reflective material increases the optical confinement of individual opto-electronic device dies and enhances the optical isolation.

In some embodiments, in the scenario that the functional device dies 106 include opto-electronic device dies, the isolation layer 702 does not need to completely fill in the space between neighboring opto-electronic device dies, but can be formed as conformal layers on the sidewalls of the opto-electronic device dies, especially if the isolation layer 702 is formed of a reflective material.

In some embodiments, as shown in FIG. 7A, the semiconductor apparatus 700 further includes a plurality of ground pads 704, also referred to as "ground electrodes," formed in a dielectric layer (not shown) in the driver circuit wafer 102. Each of the ground pads 704 is associated with one of the driver circuits 104 and provides a ground level to the associated driver circuit 104. The ground pads 704 are electrically coupled to each other and to a common ground (not shown) of the semiconductor apparatus 700.

As shown in FIG. 7A, the semiconductor apparatus 700 further includes a plurality of metal wirings 706 formed over the isolation layer 702. Each of the metal wirings 706 contacts a portion of the top surface of a corresponding functional device die 106, and is electrically coupled to the corresponding functional device die 106. For example, each of the metal wirings 706 can be in direct contact with the uppermost epitaxial layer in the corresponding functional device die 106. Moreover, each of the metal wirings 706 includes a plug portion 708 formed in a wiring through hole 710 formed in the isolation layer 702. Each of the metal wirings 706 contacts and is electrically coupled to a corresponding ground pad 704 via the plug portion 708 of the metal wiring 706. Thus, the metal wirings 706 form a cross-connected metal layer.

FIG. 7B is a plan view of the semiconductor apparatus 700, schematically showing the wiring of the semiconductor apparatus 700 in a functional device area 711 containing the functional device dies 106. Moreover, as shown in FIG. 7B, the semiconductor apparatus 700 further includes a data interface 712 for receiving and/or outputting data, e.g., input data used to control the operations of the functional device dies 106 or output data generated by the functional device dies 106. The semiconductor apparatus 700 also includes a control portion 714 coupled between the data interface 712 and the functional device area 711. The control portion 712 may include, for example, one or more shift registers, one or more digital-analog converters (DACs), and/or one or more scan controllers.

Figure 8A:
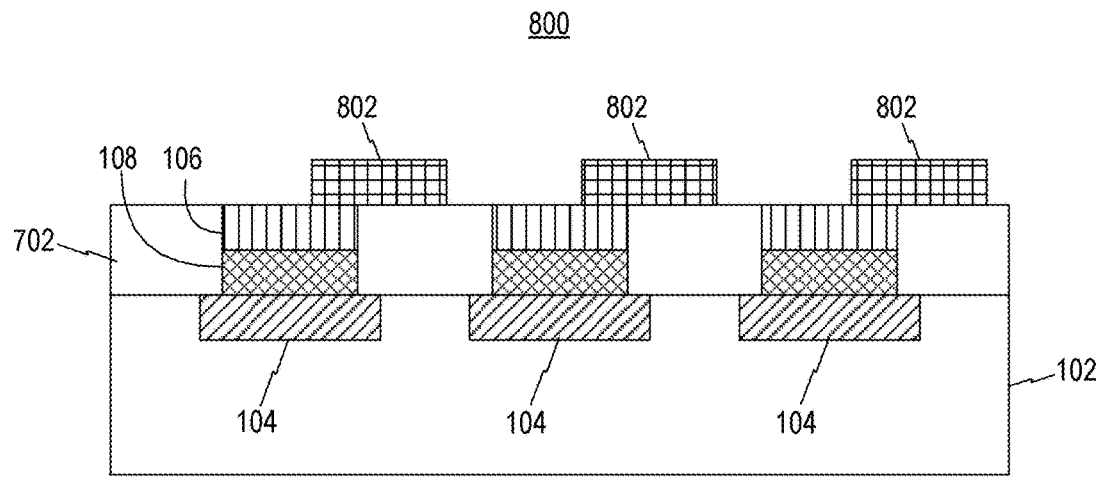
FIGS. 8A and 8B schematically show a semiconductor apparatus according to another exemplary embodiment.
Figure 8B:
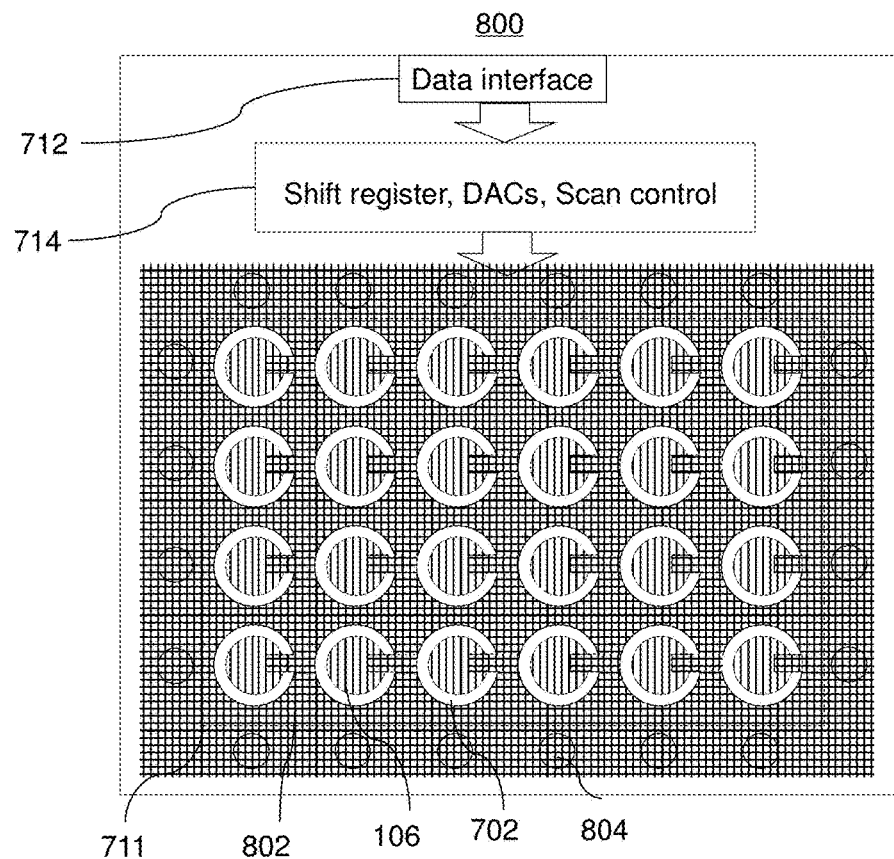

In the semiconductor apparatus 700, the metal wirings 706 contact and are electrically coupled to the ground pads 704, each of which is associated with one of the driver circuits 104. FIGS. 8A and 8B are cross-sectional and plan views, respectively, of another exemplary semiconductor apparatus 800 consistent with embodiments of the present disclosure. As shown in FIGS. 8A and 8B, the semiconductor apparatus 800 includes a continuous wiring layer 802 formed over the isolation layer 702. The wiring layer 802 contacts and is electrically coupled to each of the functional device dies 106. For example, the wiring layer 802 can be in direct contact with the uppermost epitaxial layer in each of the functional device dies 106. The wiring layer 802 is further electrically coupled to ground pads 804 formed in a peripheral region surrounding the functional device area 711, as shown in FIG. 8B.

Figure 9:
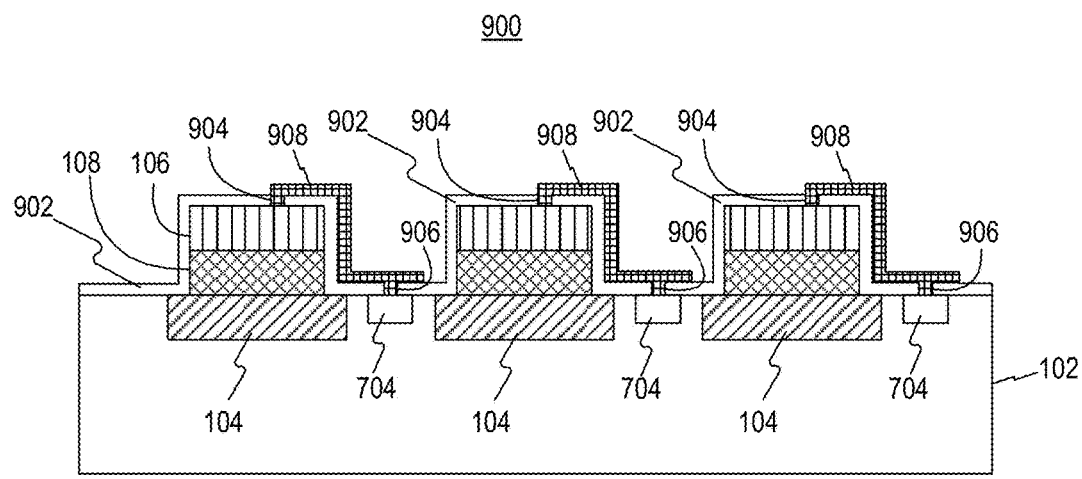
FIG. 9 schematically shows a semiconductor apparatus according to another exemplary embodiment.

In some embodiments, a semiconductor apparatus consistent with the present disclosure does not include the above-described isolation layer 702, but instead has a conformal passivation layer formed all over the semiconductor apparatus. FIG. 9 is a cross-sectional view schematically showing such an exemplary semiconductor apparatus 900. The semiconductor apparatus 900 is similar to the semiconductor apparatus 100, except that the semiconductor apparatus 900 further includes a passivation layer 902. As shown in FIG. 9, the passivation layer 902 is conformally formed over the functional device dies 106, the bonding metal pads 108, and the exposed area of the driver circuit wafer 102. For example, the passivation layer 902 can be in direct contact with the uppermost epitaxial layer in each of the functional device dies 106.

In some embodiments, as shown in FIG. 9, the semiconductor apparatus 900, like the semiconductor apparatus 700, also includes the ground pads 704 formed in a dielectric layer (not shown) in the driver circuit wafer 102. Functional device contact openings 904 and ground contact openings 906 are formed through the passivation layer 902 in areas over the functional device dies 106 and the ground pads 704, respectively. Metal wirings 908 are formed over the passivation layer 902, each of which is electrically coupled to the upper surface of one of the functional device dies 106 and the corresponding ground pad 704.

In the above-described drawings, the functional device epi-layer 105, the bonding metal layer 107, and the driver circuit wafer 102 are shown one over another. In some embodiments, the semiconductor apparatus consistent with the present disclosure may further include one or more electrode layers. For example, the semiconductor apparatus may include a device side electrode layer formed between the functional device epi-layer 105 and the bonding metal layer 107. The device side electrode layer can be formed of one or more conducting materials, and include a plurality of device side electrodes. Each of the device side electrodes corresponds to one of the functional device dies 106 and one of the bonding metal pads 108, and provides an electrical path between the corresponding functional device die 106 and bonding metal pad 108.

The material(s) forming the device side electrode layer may be different for different types of functional device dies 106. For example, if the functional device dies 106 include LED dies, the device side electrode layer can include a reflecting layer formed over the bonding metal layer 107 and a transparent conducting material layer formed over the reflecting layer. The reflecting layer reflects the light generated by the LED dies, increasing the efficiency of the LED dies, and may include a reflecting material, such as Sn, aluminum (Al), silver (Ag), rhodium (Rd), copper (Cu), or Au, or a reflecting structure, such as DBR.

In some embodiments, the semiconductor apparatus may additionally or alternatively include a driver side electrode layer formed between the bonding metal layer 107 and the driver circuit wafer 102. The driver side electrode layer can be formed of one or more conducting materials, and include a plurality of driver side electrodes. Each of the driver side electrodes corresponds to one of the bonding metal pads 108 and one of the driver circuits 104, and provides an electrical path between the corresponding bonding metal pad 108 and driver circuit 104. Consistent with the present disclosure, the driver side electrode layer can be formed on the driver circuit wafer 102, or at least partially in a dielectric layer formed over or in the driver circuit wafer 102.

As discussed above, the semiconductor apparatus consistent with the present disclosure can include opto-electronic device dies and thus be an opto-electronic apparatus. The opto-electronic device dies in the same opto-electronic apparatus can have a similar structure and are associated with light having a similar wavelength or a similar wavelength range. In some embodiments, additional optical elements having different associated wavelengths or wavelength ranges may be formed in the opto-electronic apparatus for different opto-electronic device dies.

Figure 10:
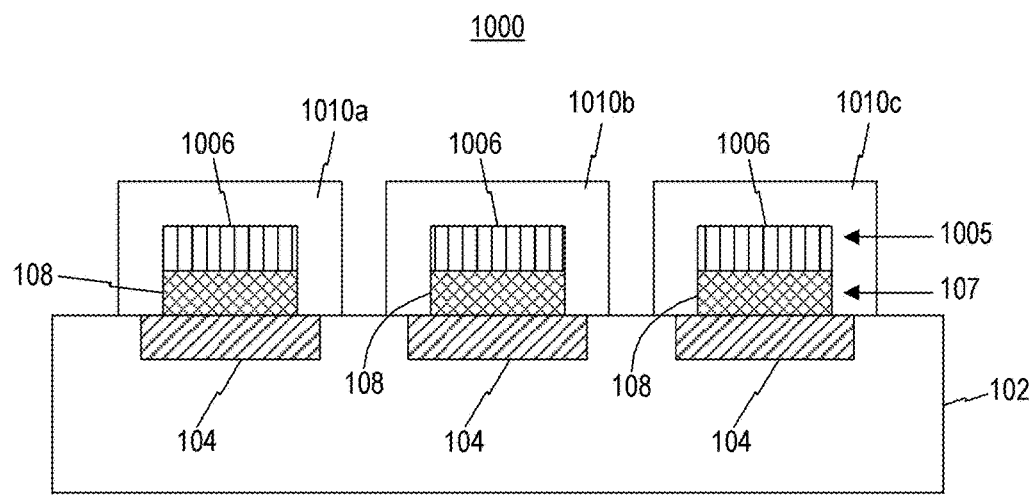
FIG. 10 schematically shows an opto-electronic apparatus according to an exemplary embodiment.

FIG. 10 is a cross-sectional view schematically showing an exemplary opto-electronic apparatus 1000 consistent with embodiments of the present disclosure. The opto-electronic apparatus 1000 includes the driver circuit wafer 102 having the driver circuits 104, the bonding metal layer 107 formed over the driver circuit wafer 102 and having the bonding metal pads 108, and an opto-electronic epi-layer 1005 formed over the bonding metal layer 107 and having a plurality of opto-electronic device dies 1006. The opto-electronic apparatus 1000 further includes a first optical element 1010a, a second optical element 1010b, and a third optical element 1010c. As shown in FIG. 10, each of the first, second, and third optical elements 1010a, 1010b, and 1010c is formed over one of the opto-electronic device dies 1006. In other embodiments, each of the first, second, and third optical elements 1010a, 1010b, and 1010c may be formed over one or more of the opto-electronic device dies 1006. The first, second, and third optical elements 1010a, 1010b, and 1010c are associated with a first wavelength or a first wavelength range, a second wavelength or a second wavelength range, and a third wavelength or a third wavelength range, respectively, which may be different from each other. In the example shown in FIG. 10, the first, second, and third optical elements 1010a, 1010b, and 1010c are formed to cover all exposed surfaces of the corresponding opto-electronic device dies 1006. In other embodiments, the first, second, and third optical elements 1010a, 1010b, and 1010c can be formed, for example, to only over the upper surfaces of the corresponding opto-electronic device dies 1006.

Depending on the type of the opto-electronic device dies 1006, the first, second, and third optical elements 1010a, 1010b, and 1010c can be different types of optical elements. For example, the opto-electronic device dies 1006 are LED dies, such as GaN-based ultra-violet (UV) LED dies. In this scenario, the first, second, and third optical elements 1010a, 1010b, and 1010c can be phosphor layers containing different types of phosphors. For example, the first optical element 1010a can contain blue phosphors, the second optical element 1010b can contain green phosphors, and the third optical element 1010c can contain red phosphors. As such, UV light emitted by the LED dies can be converted into different colors. Such an opto-electronic apparatus can be used, for example, as a full-color display panel or as a white-light illumination panel.

As another example, the opto-electronic device dies 1006 are photodetector dies, such as Si-based photodetector dies or III-V material-based photodetector dies. In this scenario, the first, second, and third optical elements 1010a, 1010b, and 1010c can be filter layers that allow light of different wavelengths or different wavelength ranges to pass through. For example, the first optical element 1010a can be a filter layer that allows blue light to pass through, the second optical element 1010b can be a filter layer that allows green light to pass through, and the third optical element 1010c can be a filter layer that allows red light to pass through. Such an opto-electronic apparatus can be used, for example, as a full-color sensor used in a digital camera.

Figure 11:
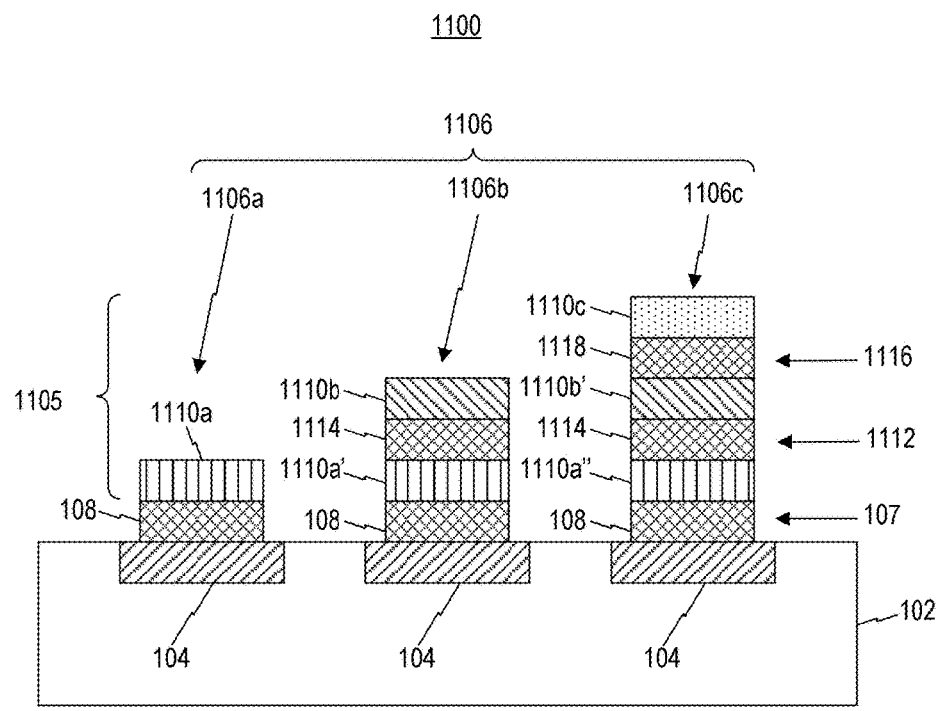
FIG. 11 schematically shows an opto-electronic apparatus according to another exemplary embodiment.

As an alternative to the examples described above, the opto-electronic device dies themselves can be configured in such a manner that they are associated with different wavelengths or different wavelength ranges. FIG. 11 is a cross-sectional view schematically showing another exemplary opto-electronic apparatus 1100 consistent with embodiments of the present disclosure. The opto-electronic apparatus 1100 includes the driver circuit wafer 102 having the driver circuits 104, the bonding metal layer 107 formed over the driver circuit wafer 102 and having the bonding metal pads 108, and an opto-electronic epi-layer 1105 formed over the bonding metal layer 107 and having a plurality of opto-electronic device dies 1106. The opto-electronic device dies 1106 include a first opto-electronic device die 1106a associated with a first wavelength or a first wavelength range, a second opto-electronic device die 1106b associated with a second wavelength or a second wavelength range, and a third opto-electronic device die 1106c associated with a third wavelength or a third wavelength range. The first, second, and third wavelengths, or the first, second, and third wavelength ranges, can be different from each other.

FIG. 11 only shows one first opto-electronic device die 1106a, one second opto-electronic device die 1106b, and one third opto-electronic device die 1106c. However, consistent with the present disclosure, the opto-electronic apparatus 1100 can have more than one first opto-electronic device die 1106a, more than one second opto-electronic device die 1106b, and/or more than one third opto-electronic device die 1106c.

In some embodiments, the opto-electronic device dies 1106a, 1106b, and 1106c are light-emitting dies such as LED dies that emit light of different wavelengths or different wavelength ranges. For example, the first, second, and third opto-electronic device dies 1106a, 1106b, and 1106c can be red, green, and blue LED dies, respectively, or be red, blue, and green LED dies, respectively, or be green, red, and blue LED dies, respectively, or be green, blue, and red LED dies, respectively, or be blue, red, and green LED dies, respectively, or be blue, green, and red LED dies, respectively. Such an opto-electronic apparatus can also be used, for example, as a full-color display panel or as a white-light illumination panel.

In some embodiments, the opto-electronic device dies 1106a, 1106b, and 1106c are light-absorbing dies such as photodetector dies that absorb light of different wavelengths or different wavelength ranges. For example, the first opto-electronic device die 1106a can be a photodetector die detecting blue light, the second opto-electronic device die 1106b can be a photodetector dies detecting green light, and the third opto-electronic device die 1106c can be a photodetector die detecting red light. Such an opto-electronic apparatus can also be used, for example, as a full-color sensor used in a digital camera.

As shown in FIG. 11, the first opto-electronic device die 1106a includes a first active layer 1110a associated with the first wavelength or the first wavelength range. The second opto-electronic device die 1106b includes a second active layer 1110b associated with the second wavelength or the second wavelength range, and formed over a first dummy layer 1110a'. The third opto-electronic device die 1106c includes a third active layer 1110c associated with the third wavelength or the third wavelength range, and formed over a second dummy layer 1110b'. The second dummy layer 1110b' is in turn formed over a third dummy layer 1110a". Consistent with the present disclosure, the first active layer 1110a, the first dummy layer 1110a', and the third dummy layer 1110a" have a similar material structure. Similarly, the second active layer 1110b and the second dummy layer 1110b' have a similar material structure.

As shown in FIG. 11, the first, second, and third opto-electronic device dies 1106a, 1106b, and 1106c are bonded to the driver circuit wafer 102 through the bonding metal pads 108 of the bonding metal layer 107. In the embodiments described here in connection with FIG. 11 and below in connection with FIGS. 12A-12K, the bonding metal layer 107 is also referred to as "first bonding metal layer 107" and the bonding metal pads 108 are also referred to as "first bonding metal pads 108." The opto-electronic apparatus 1100 further includes a second bonding metal layer 1112 having a plurality of second bonding metal pads 1114 and a third bonding metal layer 1116 having a plurality of third bonding metal pads 1118 (one of which is shown in FIG. 11). The second active layer 1110b is bonded to the first dummy layer 1110a' through one of the second bonding metal pads 1114. The second dummy layer 1110b' is bonded to the third dummy layer 1110a" through another one of the second bonding metal pads 1114. Further the third active layer 1110c is bonded to the second dummy layer 1110b' through one of the third bonding metal pads 1118.

FIGS. 12A-12K schematically show an exemplary process for manufacturing the opto-electronic apparatus 1100 consistent with embodiments of the present disclosure. In this exemplary process, the step for forming the first pre-bonding metal layer 202 over the driver circuit wafer 102 is similar to that described above in connection with FIG. 2A. Therefore, this step is not illustrated again in FIGS. 12A-12K, and the description thereof is omitted.

Figure 12A:
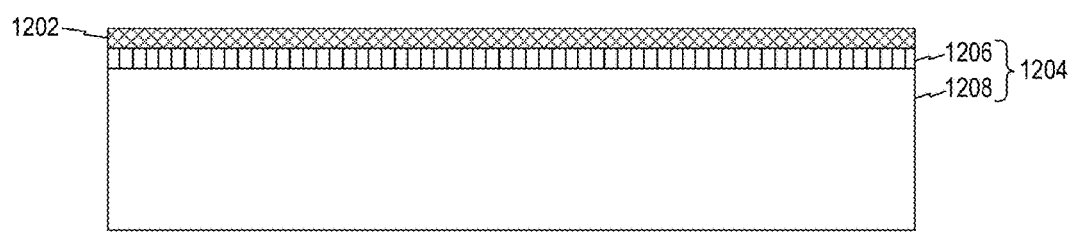
FIGS. 12A-12K schematically show a process for manufacturing the opto-electronic apparatus of FIG. 11 according to an exemplary embodiment.
Figure 12B:
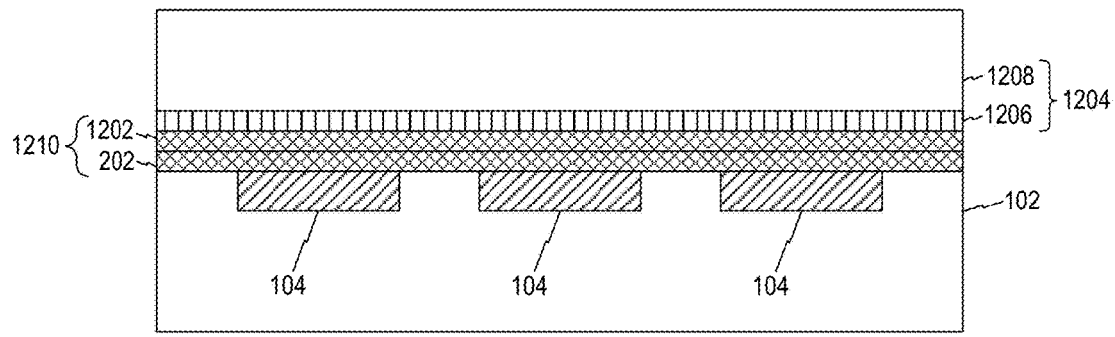
Figure 12C:
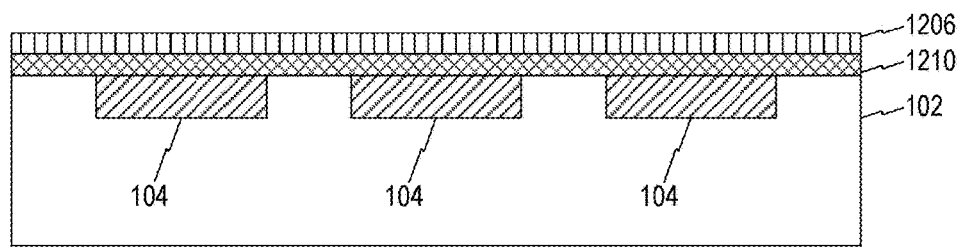

Referring to FIG. 12A, a second pre-bonding metal layer 1202 is formed over a first opto-electronic device wafer 1204. The first opto-electronic device wafer 1204 includes a first opto-electronic device epi-structure layer 1206 epitaxially grown on a first growth substrate 1208. Next, as shown in FIG. 12B, the first opto-electronic device wafer 1204 is bonded to the driver circuit wafer 102, with the second pre-bonding metal layer 1202 and the first pre-bonding metal layer 202 being bonded together to form a first unpatterned bonding metal layer 1210. Thereafter, as shown in FIG. 12C, the first growth substrate 1208 is removed to expose the first opto-electronic device epi-structure layer 1206.

Figure 12D:
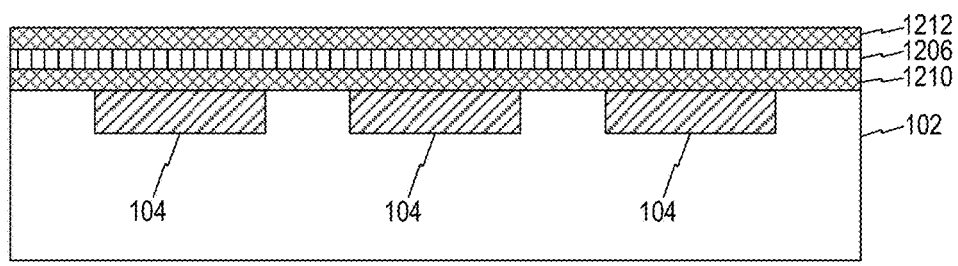
Figure 12E:
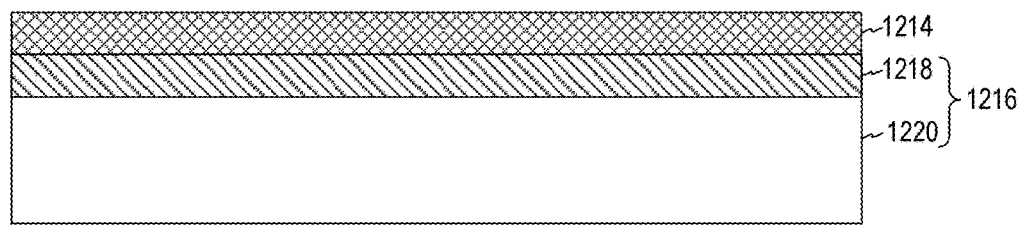
Figure 12F:
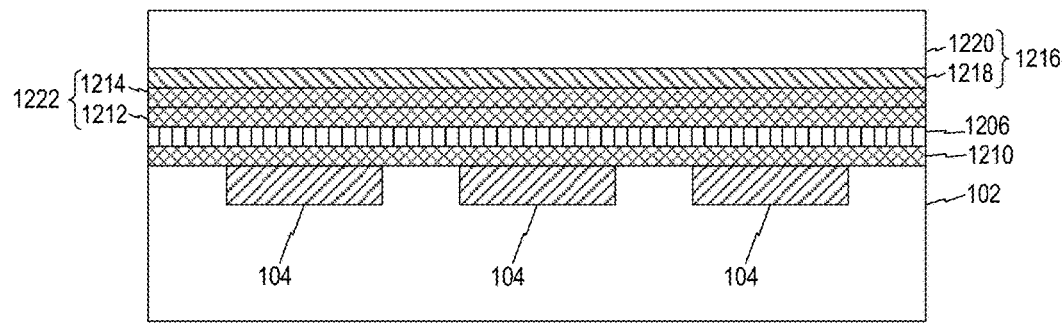
Figure 12G:
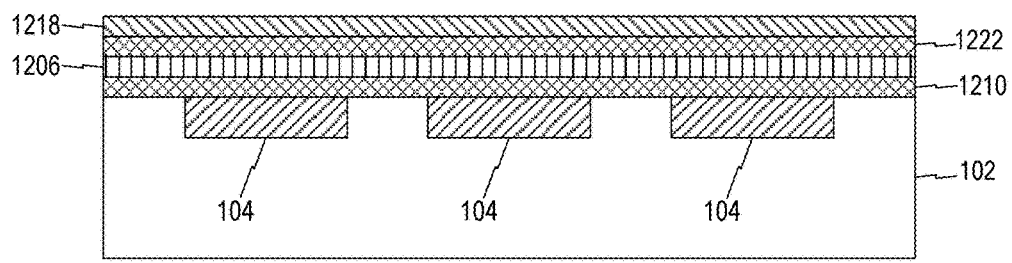

Referring to FIG. 12D, a third pre-bonding metal layer 1212 is formed over the first opto-electronic device epi-structure layer 1206. Also, as shown in FIG. 12E, a fourth pre-bonding metal layer 1214 is formed over a second opto-electronic device wafer 1216, which includes a second opto-electronic device epi-structure layer 1218 epitaxially grown on a second growth substrate 1220. Next, as shown in FIG. 12F, the second opto-electronic device wafer 1216 is bonded to the first opto-electronic device epi-structure layer 1206, with the fourth pre-bonding metal layer 1214 and the third pre-bonding metal layer 1212 being bonded together to form a second unpatterned bonding metal layer 1222. Thereafter, as shown in FIG. 12G, the second growth substrate 1220 is removed to expose the second opto-electronic device epi-structure layer 1218.

Figure 12H:
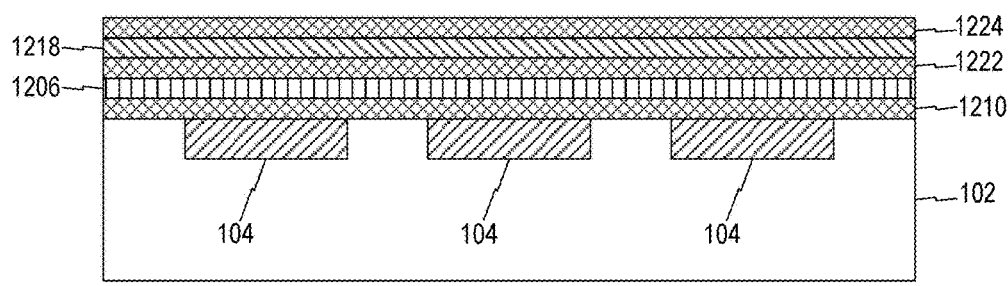
Figure 12I:
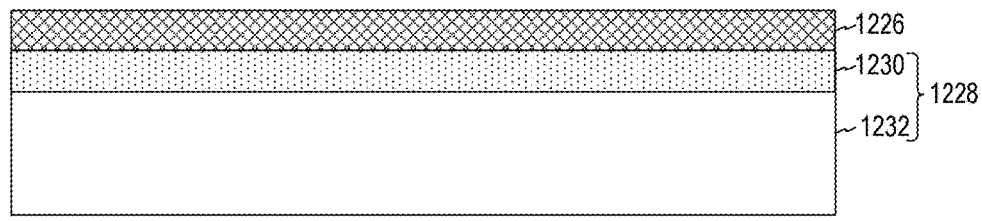
Figure 12J:
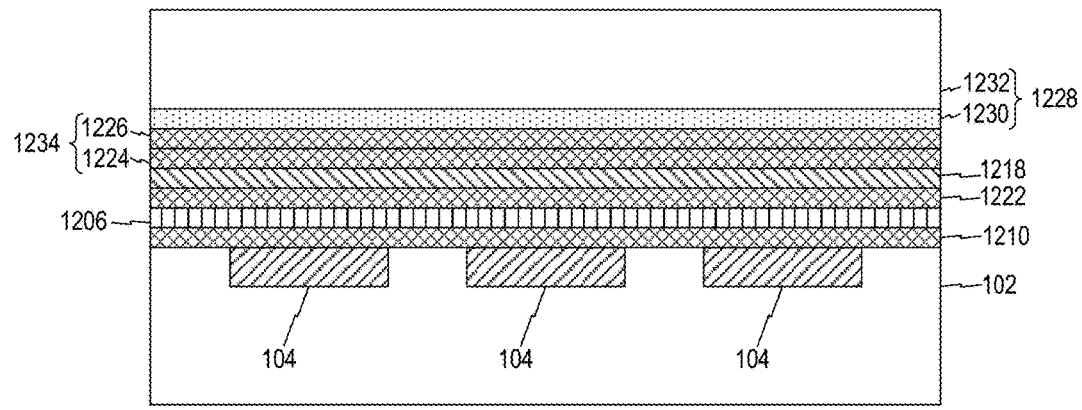
Figure 12K:
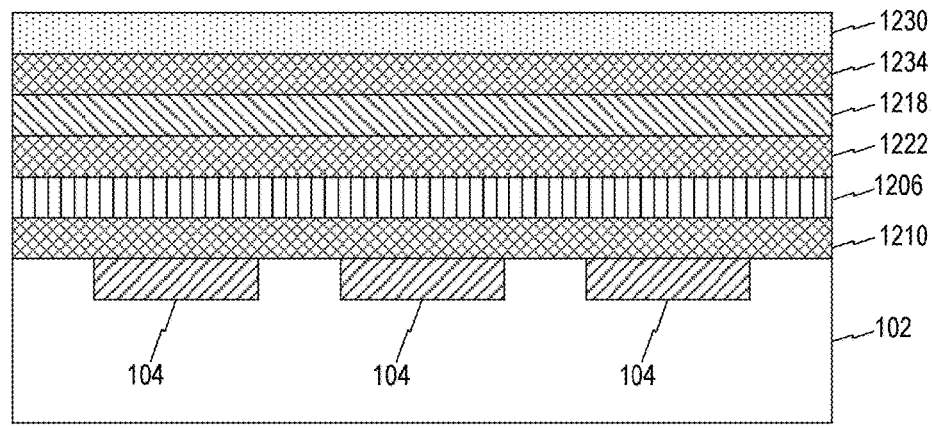

Referring to FIG. 12H, a fifth pre-bonding metal layer 1224 is formed over the second opto-electronic device epi-structure layer 1218. Also, as shown in FIG. 12I, a sixth pre-bonding metal layer 1226 is formed over a third opto-electronic device wafer 1228, which includes a third opto-electronic device epi-structure layer 1230 epitaxially grown on a third growth substrate 1232. Next, as shown in FIG. 12J, the third opto-electronic device wafer 1228 is bonded to the second opto-electronic device epi-structure layer 1218, with the sixth pre-bonding metal layer 1226 and the fifth pre-bonding metal layer 1224 being bonded together to form a third unpatterned bonding metal layer 1234. Thereafter, as shown in FIG. 12K, the third growth substrate 1232 is removed to expose the third opto-electronic device epi-structure layer 1230.

After the third growth substrate 1232 is removed, the remaining parts constitute another exemplary semiconductor apparatus 1200 consistent with embodiments of the present disclosure. That is, the semiconductor apparatus 1200 is an intermediate product formed during the process of forming the semiconductor apparatus 1100. As shown in FIG. 12, the semiconductor apparatus 1200 includes the driver circuit wafer 102 having the plurality of driver circuits 104 arranged in an array, the first unpatterned bonding metal layer 1210 formed over the driver circuit wafer 102, the first opto-electronic device epi-structure layer 1206 formed over the first unpatterned bonding metal layer 1210, the second unpatterned bonding metal layer 1222 formed over the first opto-electronic device epi-structure layer 1206, the second opto-electronic device epi-structure layer 1218 formed over the second unpatterned bonding metal layer 1222, the third unpatterned bonding metal layer 1234 formed over the second opto-electronic device epi-structure layer 1218, and the third opto-electronic device epi-structure layer 1230 formed over the third unpatterned bonding metal layer 1234. In particular, like the semiconductor apparatus 1100, the semiconductor apparatus 1200 does not include any growth substrate, and therefore the third opto-electronic device epi-structure layer 1230 is exposed to the environment. Different from the semiconductor apparatus 1100, the semiconductor apparatus 1200 has horizontally continuous first, second, and third unpatterned bonding metal layers 1210, 1222, and 1234, and horizontally continuous first, second, and third opto-electronic device epi-structure layers 1206, 1218, and 1230.

According to the present disclosure, after the first, second, and third opto-electronic device epi-structure layers 1206, 1218, and 1230 are bonded onto the driver circuit wafer 102, subsequent processes including patterning the opto-electronic device epi-structure layers 1206, 1218, and 1230, and the first, second, and third unpatterned bonding metal layers 1210, 1222, and 1234, are performed to form the opto-electronic apparatus 1110 shown in FIG. 11.

In the exemplary process described above in connection with FIGS. 12A-12K, the first, second, and third opto-electronic device epi-structure layers 1206, 1218, and 1230 are bonded to the driver circuit wafer 102 sequentially in that order. However, the process for bonding the first, second, and third opto-electronic device epi-structure layers 1206, 1218, and 1230 according to the present disclosure is not limited to that exemplary process. Two or more of the opto-electronic device epi-structure layers 1206, 1218, and 1230 can be first bonded to each other and then bonded to the driver circuit wafer 102. For example, in one exemplary process, the first opto-electronic device epi-structure layer 1206 is bonded to the driver circuit wafer 102. The second and third opto-electronic device epi-structure layers 1218 and 1230 are first bonded to each other, and then the bonded structure of the second and third opto-electronic device epi-structure layers 1218 and 1230 is bonded to the first opto-electronic device epi-structure layer 1206. In another exemplary process, the first and second opto-electronic device epi-structure layers 1206 and 1218 are first bonded to each other, and then the bonded structure of the first and second opto-electronic device epi-structure layers 1206 and 1218 is bonded to the driver circuit wafer 102. The third opto-electronic device epi-structure layer 1230 is then bonded to the second opto-electronic device epi-structure layer 1218. In a further exemplary process, the first, second, and third opto-electronic device epi-structure layers 1206, 1218, and 1230 are first bonded together, and then the bonded structure of the first, second, and third opto-electronic device epi-structure layers 1206, 1218, and 1230 is bonded to the driver circuit wafer 102.

In the exemplary process described above in connection with FIGS. 12A-12K and the exemplary semiconductor apparatus 1200 shown in FIG. 12K, the first, second, and third opto-electronic device epi-structure layers 1206, 1218, and 1230 are bonded to each other or to the driver circuit wafer 102 through an unpatterned bonding metal layer. However, similar to the exemplary process described in connection with FIGS. 3A-3D and the exemplary semiconductor apparatus 300 shown in FIG. 3D, and the exemplary process described in connection with FIGS. 4A-5B and the exemplary semiconductor apparatus 400 shown in FIG. 4B, one or more of the unpatterned bonding metal layers 1210, 1222, and 1234 can be patterned during the process of forming the semiconductor apparatus 1200. Correspondingly, in the semiconductor apparatus 1200, one or more of the unpatterned bonding metal layers 1210, 1222, and 1234 can be replaced with patterned bonding metal layers including a plurality of bonding metal pads.

FIG. 11 schematically shows an exemplary semiconductor apparatus including three different types of opto-electronic device dies associated with three different wavelengths or wavelength ranges. In some embodiments, a semiconductor apparatus according to the present disclosure can include two different types of opto-electronic device dies associated with two different wavelengths or wavelength ranges, or can include four or more different types of opto-electronic device dies associated with four or more different wavelengths or wavelength ranges. Each of the opto-electronic device dies is bonded to the driver circuit wafer 102, and includes one or more active layers. For an opto-electronic device die having multiple active layers, neighboring active layers are also bonded to each other through a bonding metal pad.

Similarly, FIG. 12K schematically shows an exemplary semiconductor apparatus including three opto-electronic device epi-structure layers associated with three different wavelengths or wavelength ranges. In some embodiments, a semiconductor apparatus according to the present disclosure can include two opto-electronic device epi-structure layers associated with two different wavelengths or wavelength ranges, or can include four or more opto-electronic device epi-structure layers associated with four or more different wavelengths or wavelength ranges. Each of the opto-electronic device epi-structure layers is either bonded to the driver circuit wafer 102 through a bonding metal layer or bonded to another opto-electronic device epi-structure layer through a bonding metal layer.

It is noted that the drawings of the present disclosure merely illustrate the schematic structures of exemplary semiconductor apparatus consistent with the present disclosure, but may not illustrate the actual shape and/or dimensions of the components of the semiconductor apparatus. For example, in the drawings described above, side walls of the functional device dies, such as the functional device dies 106 shown in FIG. 1, are shown perpendicular to the surfaces of the functional device dies 106 and the driver circuit wafer 102. However, depending on the method for patterning the functional device epi-structure layer, such as the functional device epi-structure layer 208 shown in FIG. 2B, and whether the functional device epi-structure layer is patterned before or after being bonded to the driver circuit wafer 102, the side walls of the resulting functional device dies can be tapered. The tapering can be in different directions and have different tapering angles. Also, to simplify and generalize the description, some details and components of the semiconductor apparatus are not shown in the drawings described above, such as the detailed structure of the driver circuits 104 and other auxiliary components.

Figure 13A:
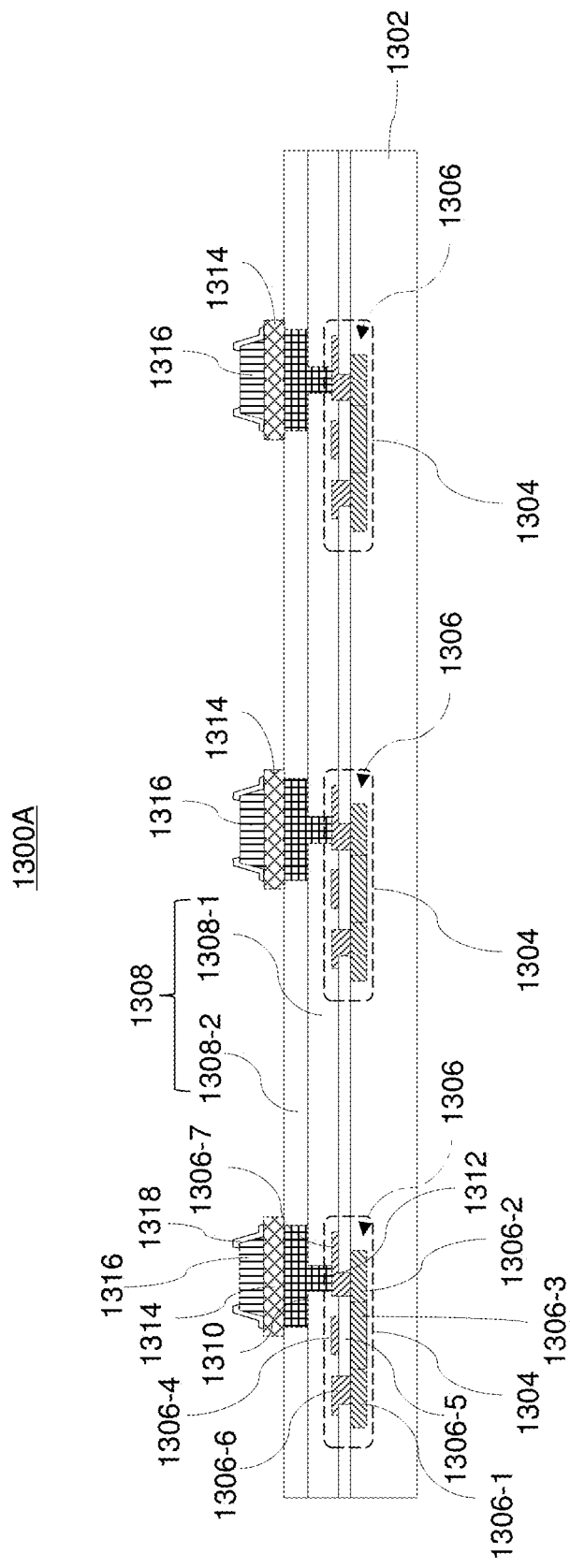
FIG. 13A schematically shows a light-emitting diode (LED) panel according to an exemplary embodiment.
Figure 13B:
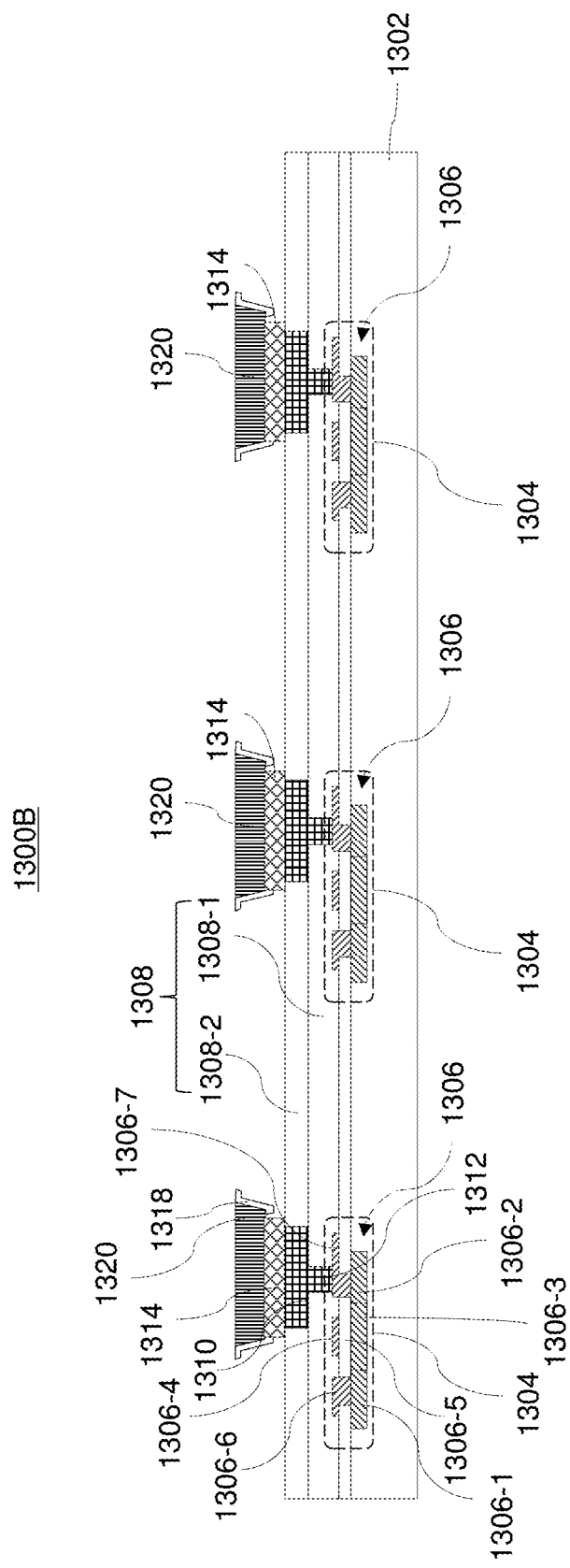
FIG. 13B schematically shows an LED panel according to another exemplary embodiment.

FIGS. 13A and 13B are cross-sectional views schematically showing exemplary LED panels 1300A and 1300B, respectively. As shown in FIG. 13A, the LED panel 1300A includes a single crystalline Si substrate 1302 and a plurality of driver circuits 1304 fabricated at least partially in the substrate 1302. Each of the driver circuits 1304 includes an MOS-based integrated circuit. Although one MOS structure 1306 for each driver circuit 1304 is shown in FIG. 13A, it is to be understood that the driver circuit 1304 can have more than one MOS structure. The MOS structure 1306 includes a first source/drain region 1306-1, a second source/drain region 1306-2, and a channel region 1306-3 formed between the first and second source/drain regions 1306-1 and 1306-2. The MOS structure 1306 further includes a gate 1306-4 and a gate dielectric layer 1306-5 formed between the gate 1306-4 and the channel region 1306-3. First and second source/drain contacts 1306-6 and 1306-7 are formed to be electrically coupled to the first and second source/drain regions 1306-1 and 1306-2, respectively, for electrically coupling the first and second source/drain regions 1306-1 and 1306-2 to other portions of the LED panel 1300A.

As shown in FIG. 13A, the LED panel 1300A further includes an interlayer insulation layer 1308 formed over the substrate 1302. In some embodiments, as shown in FIG. 13A, the interlayer insulation layer 1308 includes a first sub-layer 1308-1 and a second sub-layer 1308-2. A driver output electrode 1310 is formed in the second sub-layer 1308-2, and is electrically coupled to the second source/drain contact 1306-7 through a plug portion 1312 formed in and through the first sub-layer 1308-1.

The LED panel 1300A further includes a plurality of bonding metal pads 1314, each of which is formed over one of the driver circuits 1304. An LED die 1316 is formed over each of the bonding metal pads 1314.

As shown in FIG. 13A, side walls of the LED die 1316 are tapered in a manner such that the upper surface of the LED die 1316 is smaller than the lower surface of the LED die 1316. A sidewall passivation layer 1318 is formed on the side walls of the LED die 1316. Consistent with the present disclosure, the LED panel 1300A can be formed, for example, by the exemplary process described above in connection with FIGS. 3A-3E.

Referring to FIG. 13B, the LED panel 1300B is similar to the LED panel 1300A, except that the LED panel 1300B includes LED dies 1320 having side walls tapered in a different manner such that the upper surface of each of the LED dies 1320 is larger than the lower surface of that LED die 1320. Consistent with the present disclosure, the LED panel 1300B can be formed, for example, by the exemplary process described above in connection with FIGS. 4A-4C or the exemplary process described above in connection with FIGS. 5A and 5B.

It is noted that in the exemplary processes described above in connection with the drawings of the present disclosure, the steps are not necessarily performed in the sequence as they are arranged in the drawings, but can be in a different order. For example, the step of forming the first pre-bonding metal layer 202 shown in FIG. 2A can be performed before or after the step of forming the second pre-bonding metal layer 204 shown in FIG. 2B. As another example, the step of patterning the first pre-bonding metal layer 202 to form the first pre-bonding metal pads 302 shown in FIG. 3A can be performed before or after the step of forming the second pre-bonding metal layer 204 shown in FIG. 2B, and can also be performed before or after the step of patterning the second pre-bonding metal layer 204 to form the second pre-bonding metal pads 304 shown in FIG. 3B.

Figure 14:
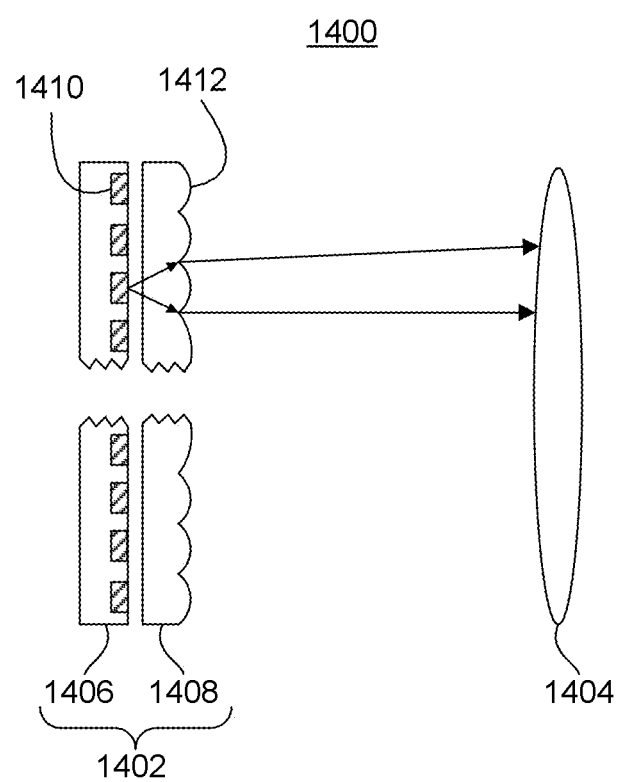
FIG. 14 schematically shows a mono-color LED projector according to an exemplary embodiment.

As discussed above, an LED panel consistent with the present disclosure can be used as an imager device in an LED projector. As an example, FIG. 14 schematically shows an exemplary mono-color LED projector 1400 consistent with the present disclosure. The LED projector 1400 includes an LED display panel 1402 and a projection lens or lens set 1404. Light emitted by the LED display panel 1402 is collected by the projection lens or lens set 1404 and projected onto, for example, a screen (not shown).

As shown in FIG. 14, the LED display panel 1402 includes an LED panel 1406 and a micro lens array 1408. The LED panel 1406 can be any LED panel consistent with the present disclosure, such as the above-described LED panel 1300A or 1300B, and includes a plurality of LED dies 1410. The micro lens array 1408 includes a plurality of micro lenses 1412. Each of the micro lenses 1412 corresponds to one LED die 1410, and is formed over the corresponding LED die 1410. Light emitted by an LED die 1410 is first converged by a corresponding micro lens 1412 and then projected onto the projection lens 1404. As a result, the divergence angle of the light emitted by the LED die 1410 is reduced by the corresponding micro lens 1412.

Figure 15:
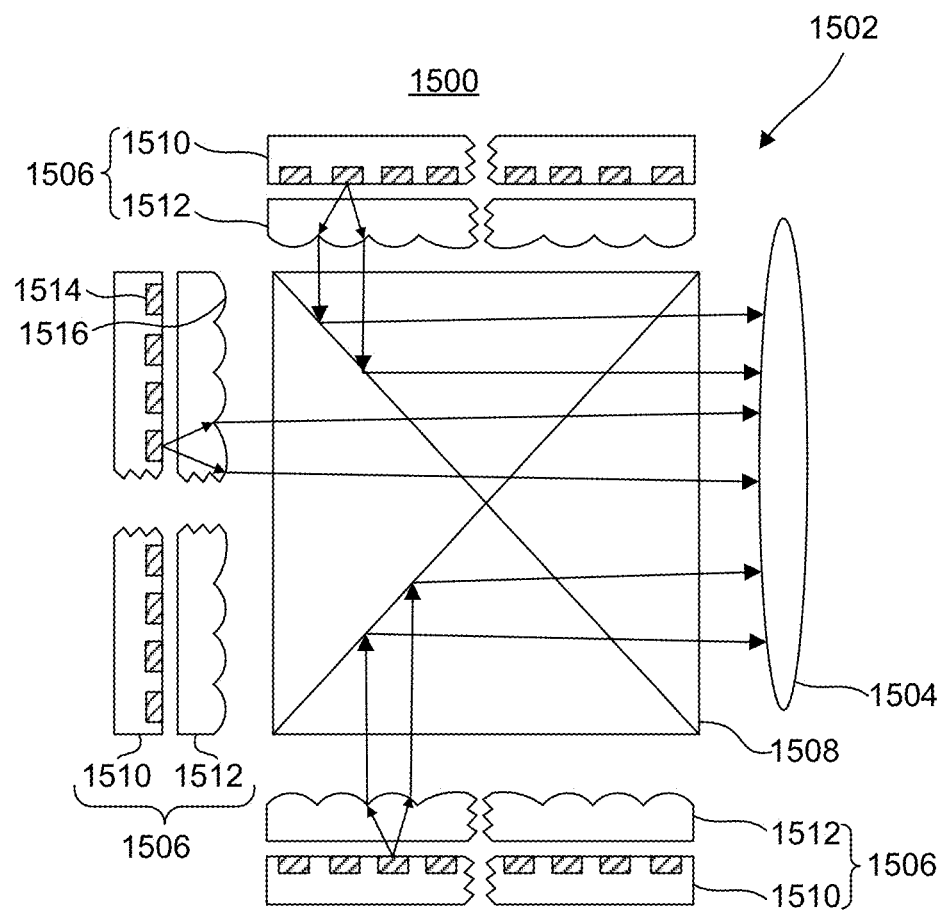
FIG. 15 schematically shows a multi-color LED projector according to an exemplary embodiment.

Similarly, FIG. 15 schematically shows an exemplary full-color LED projector 1500 consistent with the present disclosure. The LED projector 1500 includes an imaging unit 1502 and a projection lens or lens set 1504. Similar to the LED projector 1400, in the LED projector 1500, light emitted by the imaging unit 1502 is collected by the projection lens or lens set 1504 and projected onto, for example, a screen (not shown).

As shown in FIG. 15, the imaging unit 1502 includes LED display panels 1506 and a beam combiner 1508. The LED display panels 1506 emit light of different colors, which are combined in the beam combiner 1508 and then projected to the projection lens 1504. Each of the LED display panels 1506 includes an LED panel 1510 and a micro lens array 1512. Similar to the LED panel 1406, the LED panel 1510 can be any LED panel consistent with the present disclosure, such as the above-described LED panel 1300A or 1300B, and includes a plurality of LED dies 1514. Further, similar to the micro lens array 1408, the micro lens array 1512 includes a plurality of micro lenses 1516. Each of the micro lenses 1516 corresponds to one LED die 1514, and is formed over the corresponding LED die 1514. Light emitted by an LED die 1514 is first converged by a corresponding micro lens 1516 and then projected into the beam combiner 1508. As a result, the divergence angle of the light emitted by the LED die 1514 is reduced by the corresponding micro lens 1516.

Figure 16:
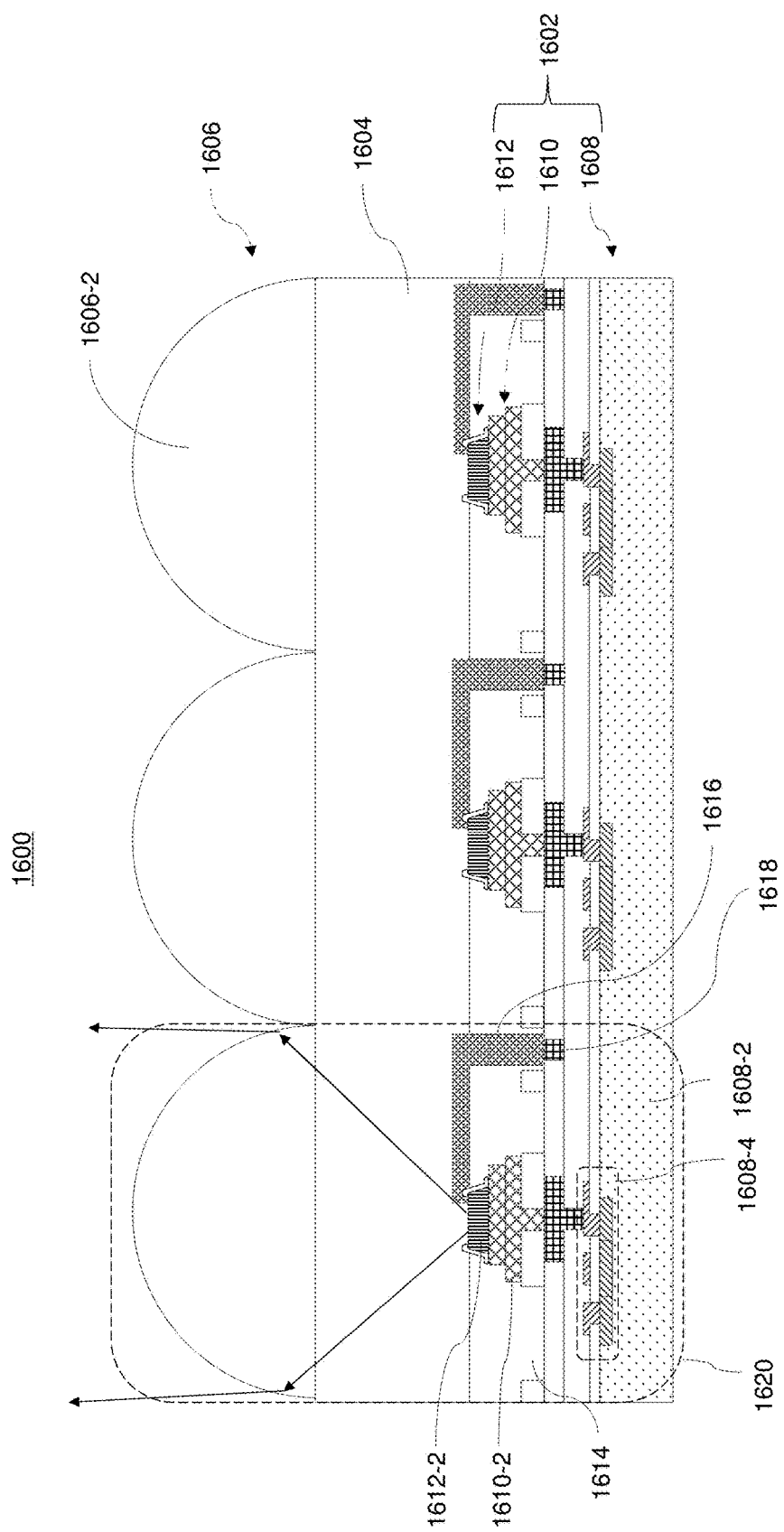
FIG. 16 schematically shows an LED display panel according to an exemplary embodiment.

FIG. 16 is a cross-sectional view schematically showing an exemplary LED display panel 1600 consistent with the present disclosure. The LED display panel 1600 includes an LED panel 1602, an optical spacer 1604 formed over the LED panel 1602, and a micro lens array 1606 formed over the optical spacer 1604.

The LED panel 1602 includes a driver circuit wafer 1608, a bonding metal layer 1610 formed over the driver circuit wafer 1608, and an LED array 1612 formed over the bonding metal layer 1610. The driver circuit wafer 1608 includes a substrate 1608-2 and a plurality of driver circuits 1608-4, also referred to as "pixel driver circuits" or "pixel circuits," at least partially formed in the substrate 1608-2. The driver circuits 1608-4 form a driver circuit array. The driver circuit wafer 1608 is similar to the exemplary driver circuit wafers described above, such as the driver circuit wafer 102 described above with reference to FIG. 1, and thus its detailed description is omitted here. Further, the substrate 1608-2 and the driver circuits 1608-4 are similar to the exemplary substrates and driver circuits described above, such as the substrate 1302 and the driver circuits 1304 described above, respectively, with reference to FIGS. 13A and 13B, and thus their detailed description is omitted here.

The bonding metal layer 1610 includes a plurality of bonding metal pads 1610-2. The bonding metal pads 1610-2 are similar to the exemplary bonding metal pads described above, such as the bonding metal pads 108 described above with reference to FIG. 1, or the bonding metal pads 1314 described above with reference to FIGS. 13A and 13B, and thus their detailed description is omitted here.

The LED array 1612 includes a plurality of LED dies 1612-2 arranged in a matrix, such as a triangular matrix, a square matrix, a rectangular matrix, or a hexagonal matrix. The LED dies 1612-2 are similar to the exemplary LED dies described above, such as the LED dies 1006 described above with reference to FIG. 10, the LED dies 1106 described above with reference to FIG. 11, the LED dies 1316 described above with reference to FIG. 13A, or the LED dies 1320 described above with reference to FIG. 13B, and thus their detailed description is omitted here. Similar to the LED dies described above, each of the LED dies 1612-2 is bonded with a corresponding driver circuit 1608-4 by one corresponding bonding metal pad 1610-2. In some embodiments, the LED dies 1612-2 are identical or similar to each other and emit light of the same or similar color. In some embodiments, the LED array 1612 includes different types of LED dies, which can emit light of different colors.

In some embodiments, as shown in FIG. 16, the LED panel 1602 further includes an insulation layer 1614 formed over the driver circuit wafer 1608, the bonding metal layer 1610, and the LED array 1612. The insulation layer 1614 is also formed between the bonding metal pads 1610-2 and between the LED dies 1612-2, to provide electrical isolation between neighboring bonding metal pads 1610-2 and between neighboring LED dies 1612-2. The insulation layer 1614 is configured not to block light emitted by the LED dies 1612-2. In some embodiments, the isolation layer 1614 also provides optical isolation between neighboring LED dies 1612-2.

The LED panel 1602 also includes a plurality of metal electrodes 1616 and a common ground 1618. Each of the metal electrodes 1616 couples a corresponding LED die 1612-2 to the common ground 1618.

As shown in FIG. 16, the micro lens array 1606 includes a plurality of micro lenses 1606-2. Each of the micro lenses 1606-2 corresponds to and is formed over one of the LED dies 1612-2. Therefore, similar to the LED dies 1612-2, the micro lenses 1606-2 can also be arranged in a triangular matrix or a square matrix. The optical spacer 1604 separates the micro lens array 1606 from the LED panel 1602, and provides an optical path between each of the LED dies 1612-2 and a corresponding micro lens 1606-2.

As shown in FIG. 16, a driver circuit 1608-4, a bonding metal pad 1610-2 over the driver circuit 1608-4, an LED die 1612-2 over the bonding metal pad 1610-2, and a micro lens 1602-2 over the LED die 1612-2 form a pixel 1620 of the LED display panel 1600. Consistent with the present disclosure, one pixel 1620 only includes one driver circuit 1608-4, one bonding metal pad 1610-2, one LED die 1612-2, and one micro lens 1606-2. That is, the driver circuits 1608-4, the bonding metal pads 1610-2, the LED dies 1612-2, and the micro lens 1606-2 have a one-to-one corresponding relationship with respect to each other.

As shown in FIG. 16, the light emitted by the LED die 1612-2 (light from one LED die 1612-2 is illustrated in FIG. 16) is more converged after passing through the corresponding micro lens 1606-2. That is, the divergence angle of the light emitted by the LED die 1612-2 is reduced. For example, the divergence angle of the light exiting the micro lenses 1606-2 can be reduced to about 40° from a divergence angle of about 110° when emitted by the LED dies 1612-2.

In some embodiments, the thickness of the optical spacer 1604, and hence the distance between the LED dies 1612-2 and the micro lenses 1606-2, can be varied to achieve different divergence angle reduction results. Further, the distance between the LED dies 1612-2 and the micro lenses 1606-2 also affects how much light can be collected by each micro lens 1606-2 and how much the divergence angle can be reduced. With a smaller distance between the LED dies 1612-2 and the micro lenses 1606-2, more light from the LED dies 1612-2 may be collected by corresponding micro lenses 1606-2, but the light is less converged. On the other hand, when the distance between the LED dies 1612-2 and the micro lenses 1606-2 is larger, less light may be collected by corresponding micro lenses 1606-2 but the collected light is more converged, i.e., the light exiting the micro lenses 1606-2 has a smaller divergence angle. In some embodiments, the optical thickness of the optical spacer 1604, i.e., the product of the actual geometrical thickness of the optical spacer 1604 and the refractive index of the optical spacer 1604, can be chosen to be about 0 times to about twice the focal length of the micro lenses 1606-2.

In FIG. 16, for illustrative purposes, the optical spacer 1604 and the micro lens array 1606 are assumed to be made of the same material, or be made of materials having the same or similar refractive index, and thus no refraction occurs at the boundary between the optical spacer 1604 and the micro lens array 1606. In some embodiments, the optical spacer 1604 and the micro lens array 1606 can be made of different materials having different refractive indices. In such embodiments, refraction can occur at the boundary between the optical spacer 1604 and the micro lens array 1606. For example, the micro lens array 1606 can be made of a material having a refractive index larger than that of the material of the optical spacer 1604. In this scenario, the light emitted by the LED dies 1612-2 can be further converged.

Consistent with the present disclosure, the optical spacer 1604 can be made of, for example, glass, semiconductor, or air. The micro lens array 1606 can be made of, for example, glass or semiconductor. In some embodiments, the optical spacer 1604 and the micro lens array 1606 are made from a same piece of material. That is, an original piece of material is processed such that a portion of the piece of material forms the optical spacer 1604 and another portion of the piece of material forms the micro lens array 1606. In FIG. 16 and other figures to be described below, a line is drawn between the optical spacer 1604 and the micro lens array 1606. This line is merely for illustrative purposes to show the boundary between the optical spacer 1604 and the micro lens array 1606, but does not necessarily indicate an actual physical interface between the optical spacer 1604 and the micro lens array 1606. Depending on the materials and manufacturing processes for the optical spacer 1604 and the micro lens array 1606, there may or may not be an actual physical interface between the optical spacer 1604 and the micro lens array 1606. The optical spacer 1604 and the micro lens array 1606 can be made of materials that are optically transparent or semi-transparent to the light emitted by the LED dies 1612-2, such as polymers, dielectrics, and semiconductors. In some embodiments, the optical spacer 1604 can include an air gap. Consistent with the present disclosure, the materials for the optical spacer 1604 and the micro lens array 1606 can also be varied to achieve different divergence angle reduction results.

The shape of the micro lenses 1606-2 can be chosen to achieve different divergence angle reduction results. For example, the micro lenses 1606-2 can be spherical lenses, aspherical lenses, or Fresnel lenses. The bottom of each micro lens 1606-2 can have, for example, a circular shape, a square shape, a rectangular shape, a triangular shape, or a hexagonal shape.

Further, the size of a micro lens 1606-2 as relative to the size of the corresponding LED die 1612-2 can be adjusted to achieve different divergence angle reduction results. Consistent with the present disclosure, the lateral size, such as the diameter, of the micro lens 1606-2 is larger than the lateral size of the corresponding LED die 1612-2. Here, "lateral" refers to the horizontal direction as seen in the drawings and the lateral size of the bottom of the micro lens 1606-2 is used as the lateral size of the micro lens 1606-2. In some embodiments, the lateral size of the micro lens 1606-2 equals or is larger than about twice of the lateral size of the corresponding LED die 1606-2.

Moreover, the material and the shape of the micro lenses 1606-2 can also affect the numerical aperture of the micro lenses 1606-2, and thus affect the capability of the micro lenses 1606-2 to reduce the divergence angle. A micro lens 1606-2 having a larger curvature and/or a higher refractive index can better reduce the divergence angle.

Figure 17A:
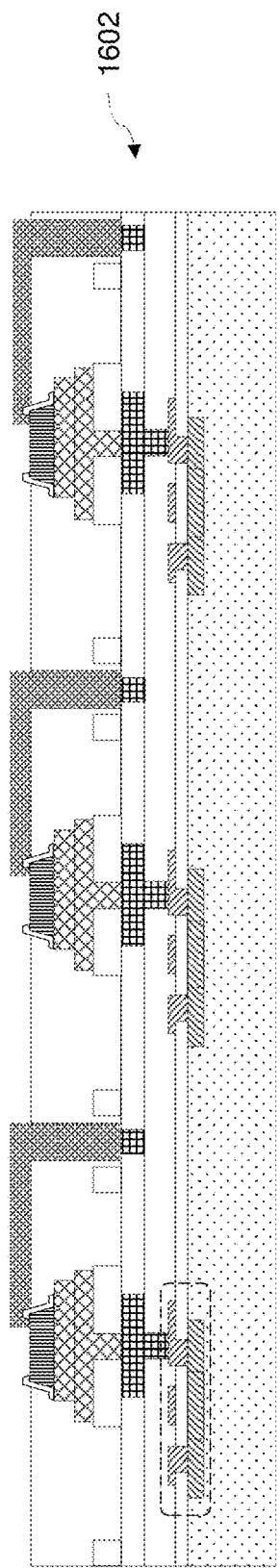
FIGS. 17A-17D schematically show a process for manufacturing the LED display panel shown in FIG. 16 according to an exemplary embodiment.

FIGS. 17A-17D show an exemplary process for manufacturing the LED display panel 1600 consistent with the present disclosure. As shown in FIG. 17A, the LED panel 1602 is provided. The LED panel 1602 can be manufactured using a suitable method consistent with the present disclosure, such as one of the exemplary methods described above. For example, the LED panel 1602 can be manufactured using the process described above with reference to FIGS. 2A-2E.

Figure 17B:
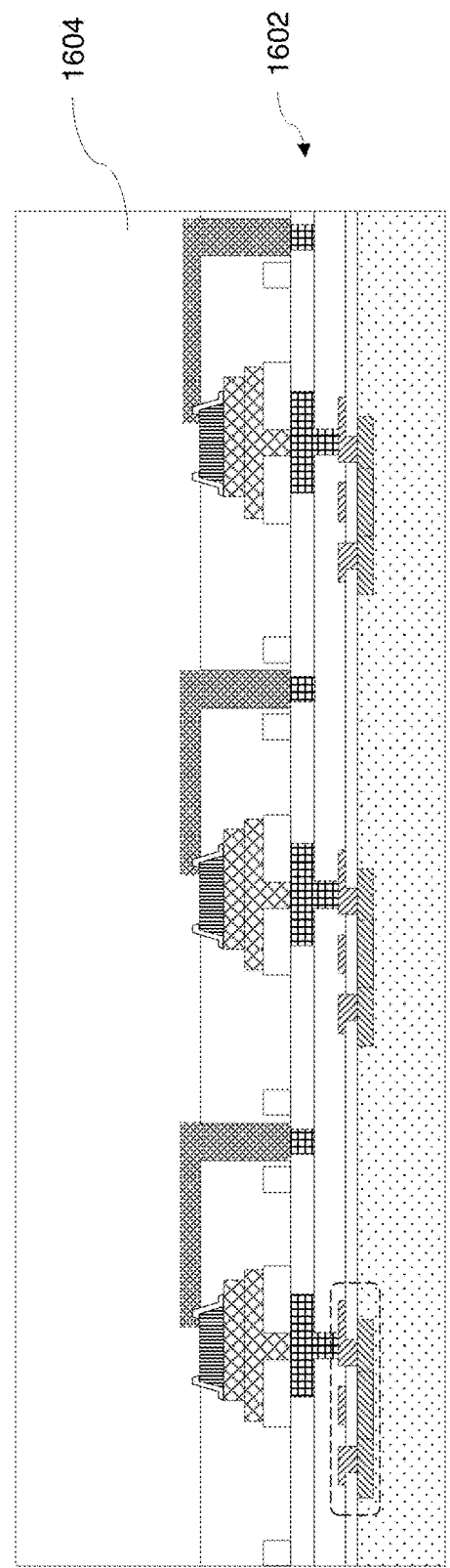

As shown in FIG. 17B, the optical spacer 1604 is formed over the LED panel 1602. In some embodiments, the optical spacer 1604 can be formed by applying a transparent material over the LED panel 1602. The transparent material can be, for example, a polymer material, a dielectric material, such as silicon oxide, or a semiconductor material, such as gallium nitride. The transparent material can be applied by, for example, a chemical-vapor deposition process, a physical-vapor deposition process, or a spin-on process. In some embodiments, the as-deposited transparent material can be flattened by, for example, polishing. In some embodiments, instead of applying a transparent material over the LED panel 1602, which is then processed to form the optical spacer 1604, the optical spacer 1604 can be pre-formed separately and then bonded onto the LED panel 1602.

Figure 17C:
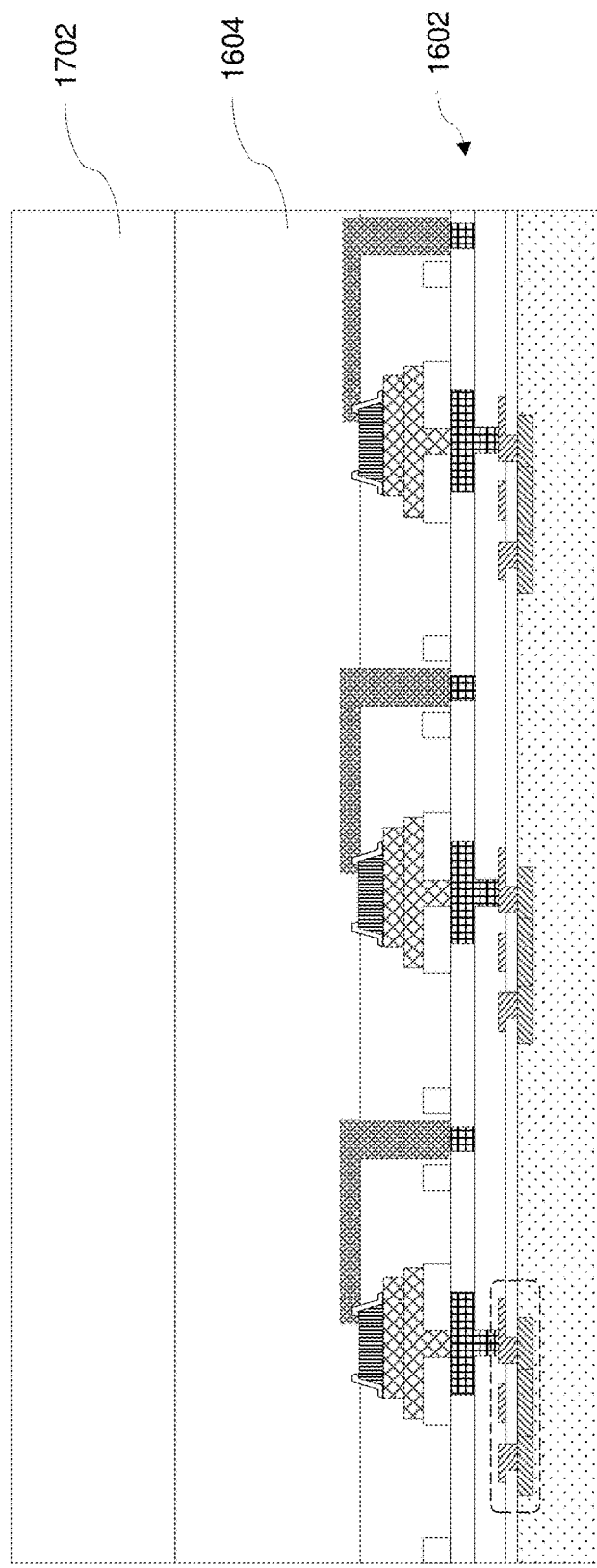
Figure 17D:
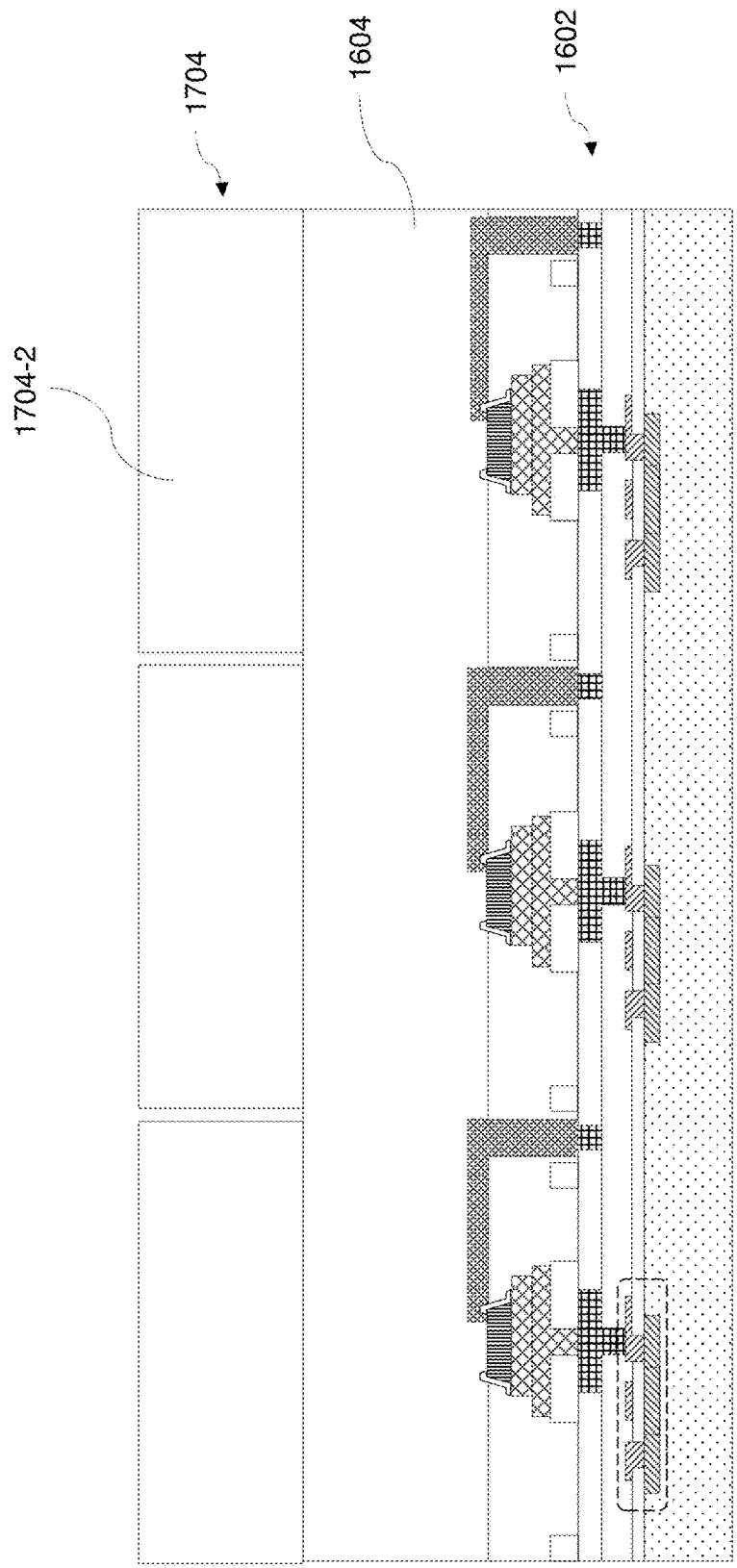

Referring to FIG. 17C, after the optical spacer 1604 is formed, a polymer layer 1702 is formed over the optical spacer 1604 by, for example, a spin-on process. Then, as shown in FIG. 17D, the polymer layer 1702 is patterned using, for example, a photolithography process, to form a patterned polymer layer 1704. The patterned polymer layer 1704 includes a plurality of polymer units 1704-2 arranged in an array, each of which corresponds to and is formed over one of the LED dies 1612-2. In some embodiments, the lateral size of the polymer units 1704-2 can be controlled to control the lateral size of the micro lenses 1606-2. In some embodiments, the thickness of the patterned polymer layer 1704 can be controlled to control the shape, for example, the curvature of the micro lenses 1606-2.

In some embodiments, the polymer layer 1702 can be made of photo-sensitive polymer, such that the polymer layer 1702 can be patterned by directly performing a photolithography process on the polymer layer 1702. In some embodiments, the polymer layer 1702 is made of non-photo-sensitive polymer. In such embodiments, a photoresist layer (not shown) can be formed over the polymer layer 1702, which is patterned to a desired shape with a desired size. The polymer layer 1702 is then etched using the patterned photoresist layer as a mask to form the patterned polymer layer 1704.

After the polymer layer 1702 is patterned, a high-temperature reflow process is performed to convert the polymer units 1704-2 into the micro lens 1606-2, forming the LED display panel 1600 shown in FIG. 16. The reflow process can be performed at a temperature above the melting point or the glass transition point of the polymer. The temperature and time period of the reflow process can be controlled to control the size and/or shape of the micro lenses 1606-2. For example, the reflow process can be performed at a temperature of about 180° C. for a period of about 10 minutes.

Figure 18:
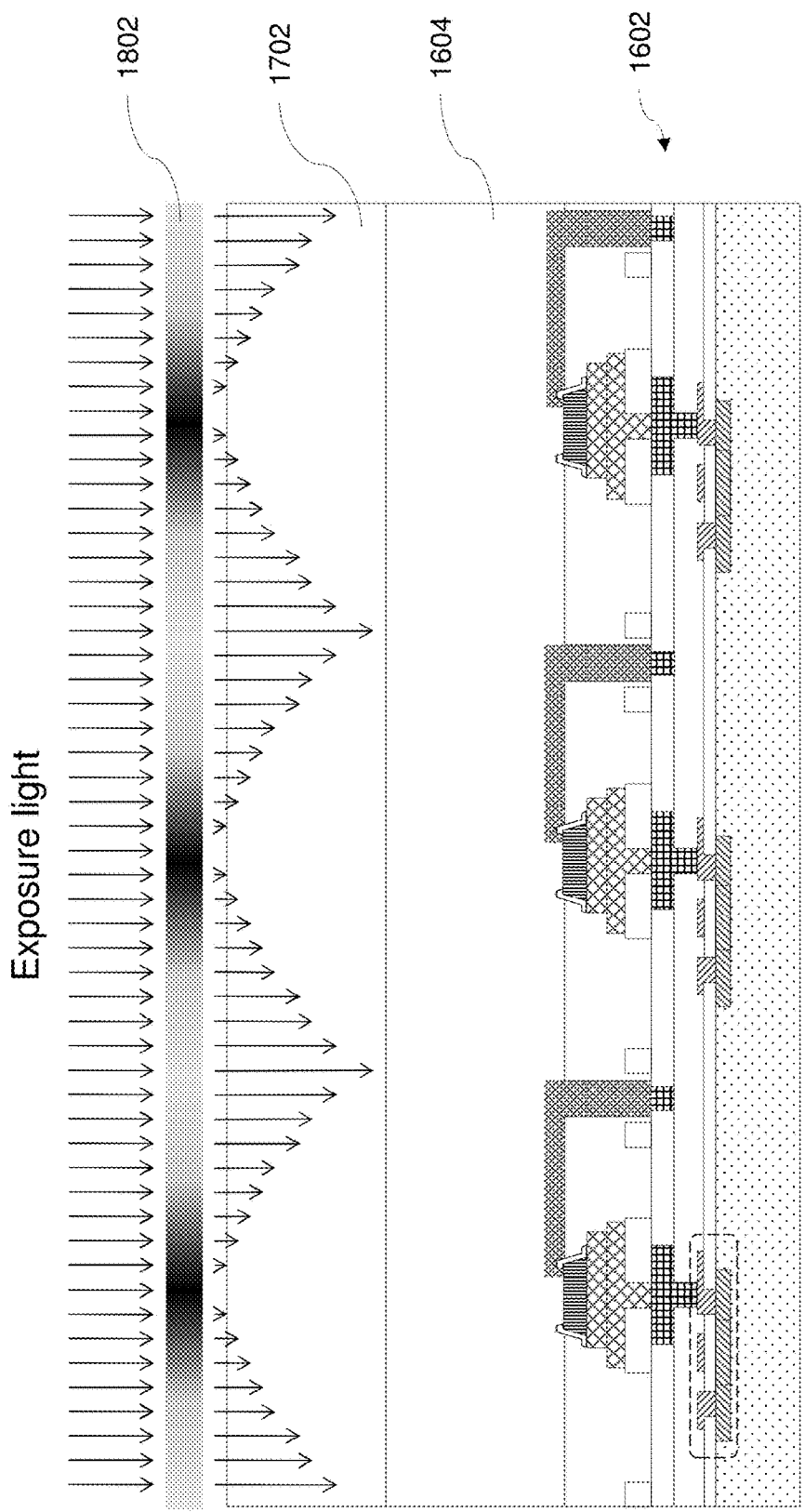
FIG. 18 schematically shows a process for manufacturing the LED display panel of FIG. 16 according to another exemplary embodiment.
Figure 19:
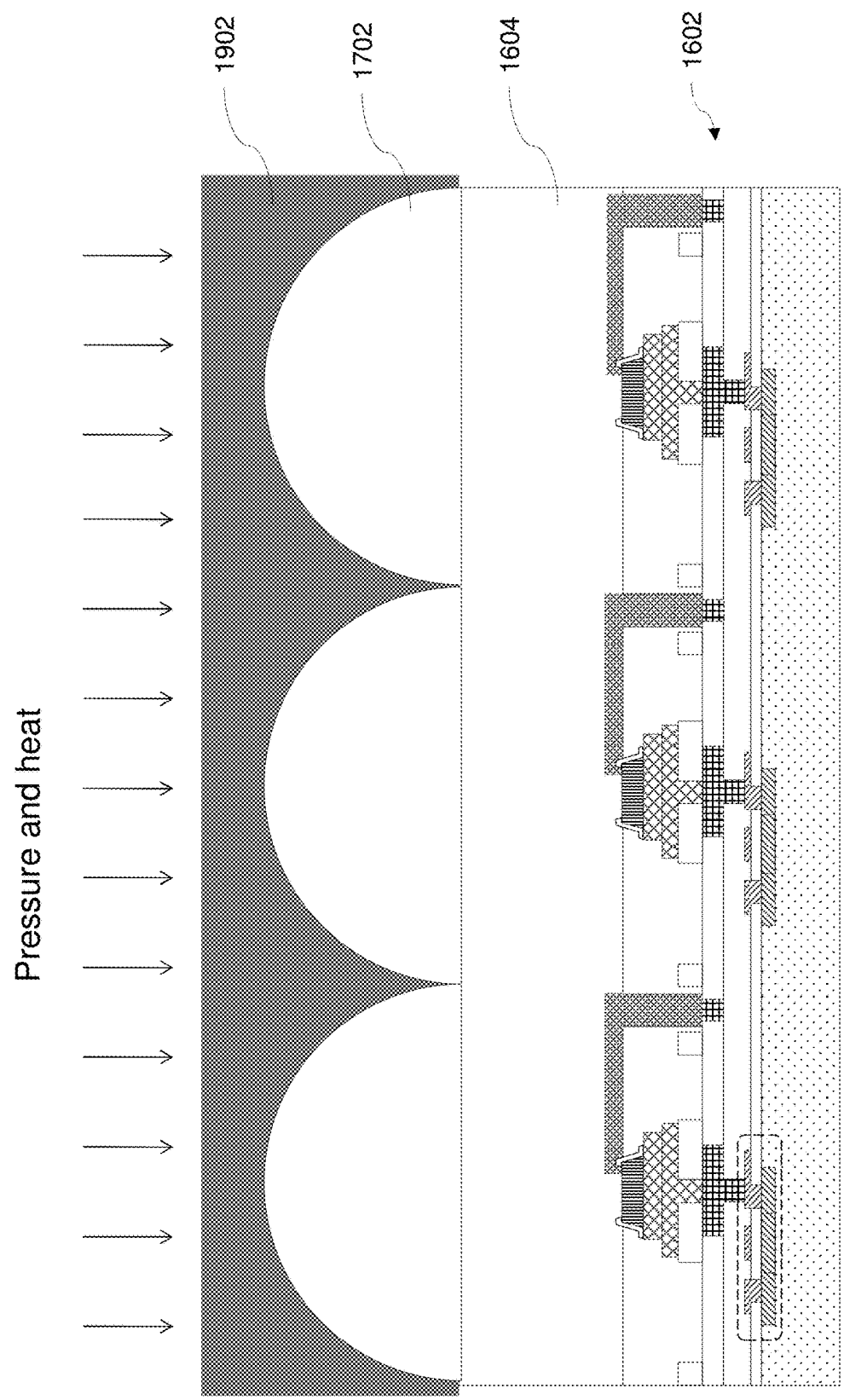
FIG. 19 schematically shows a process for manufacturing the LED display panel of FIG. 16 according to another exemplary embodiment.
Figure 20:
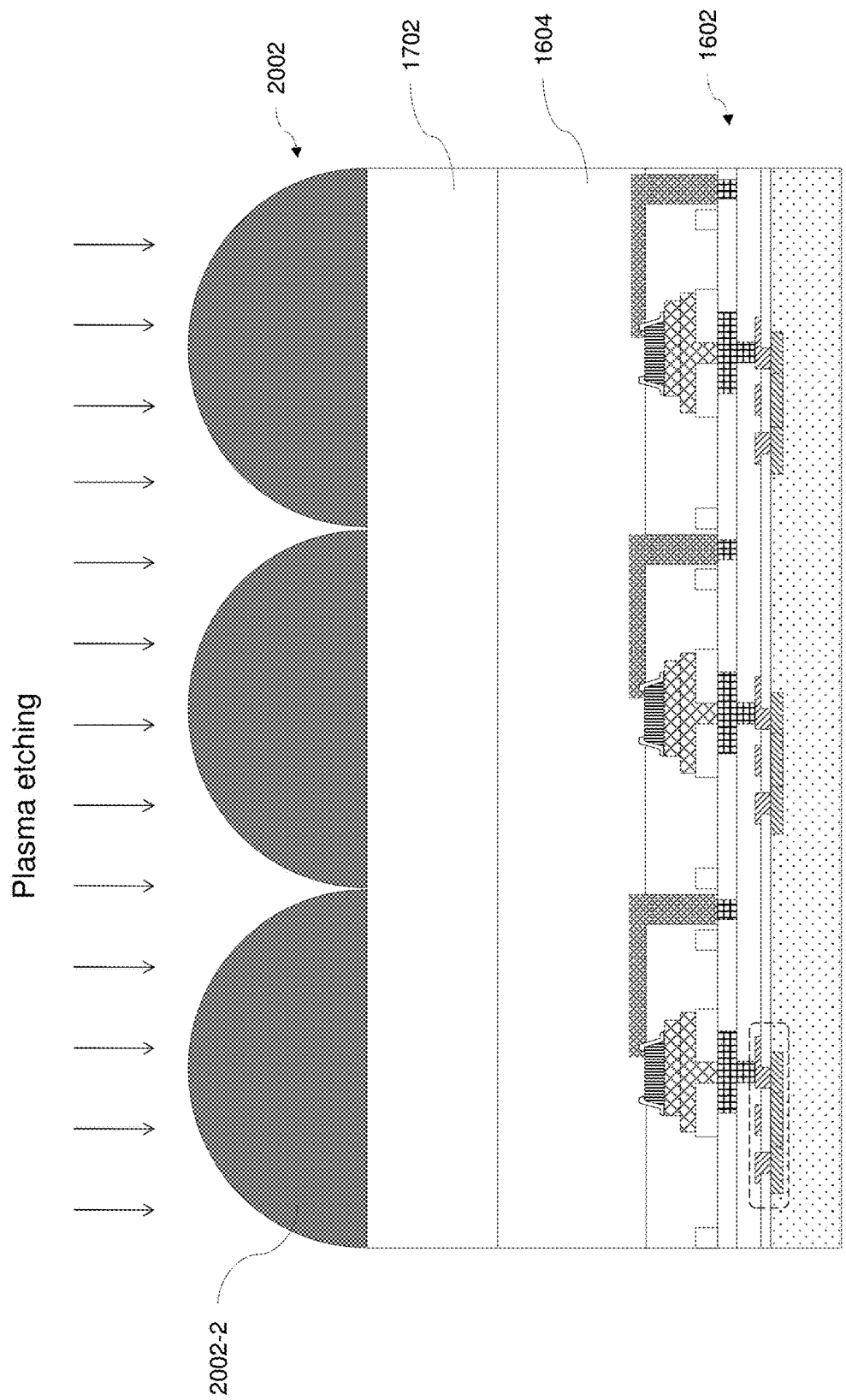
FIG. 20 schematically shows a process for manufacturing the LED display panel of FIG. 16 according to another exemplary embodiment.

Other processes can also be used to form the micro lenses 1606-2 out of the polymer layer 1702. FIGS. 18, 19, and 20 show other exemplary processes for manufacturing the LED display panel 1600 consistent with the present disclosure. In these exemplary processes, the steps of forming the LED panel 1602, the optical spacer 1604, and the polymer layer 1702 are similar to those described above with reference to FIGS. 17A-17C. Therefore, these steps are not illustrated again and their description is omitted here.

In the exemplary process shown in FIG. 18, the polymer layer 1702 is made of photo-sensitive polymer and is directly exposed using a grayscale mask 1802. The grayscale mask 1802 has a grayscale pattern corresponding to the micro lenses 1606-2 to be formed. As shown in FIG. 18, due to the grayscale pattern, different regions of the polymer layer 1702 receives different amounts of exposure. Therefore, during the subsequent developing process, different amounts of polymer material are removed from different regions of the polymer layer 1702, forming the micro lenses 1606-2 having curved surfaces, as shown in FIG. 16. In the process shown in FIG. 18, the exposure dose and time period, as well as the pattern in the grayscale mask 1802, can be controlled to control the size and shape of the micro lenses 1606-2.

In the exemplary process shown in FIG. 19, the polymer layer 1702 can be made of non-photo-sensitive polymer. In this process, a pre-fabricated mold/imprinting stamp 1902 is pressed into the polymer layer 1702 to convert at least a portion of the polymer layer 1702 into the micro lenses 1606-2. In some embodiments, during the imprinting process shown in FIG. 19, the polymer layer 1702 can be heated to soften or melt the polymer layer 1702. The pre-fabricated mold/imprinting stamp 1902 can be designed as desired so that the as-formed micro lenses 1606-2 can have the desired shape and size.

In the exemplary process shown in FIG. 20, the polymer layer 1702 can be made of non-photo-sensitive polymer. As shown in FIG. 20, a patterned photoresist layer 2002 is formed over the polymer layer 1702. The patterned photoresist layer 2002 includes a plurality of dummy units 2002-2 each having a size and a shape mimicking those of the corresponding micro lens 1606-2 to be formed. In some embodiments, the patterned photoresist layer 2002 is formed by applying a photoresist layer over the polymer layer 1702, patterning the photoresist layer to form photoresist units, and conducting a high-temperature reflow process to transform the photoresist units to the dummy units 2002-2. In some embodiments, the photoresist layer can be directly subject to a photolithography process using a grayscale mask, such as the grayscale mask 1802 shown in FIG. 18, to form the patterned photoresist layer 2002.

As shown in FIG. 20, a plasma or ion etching is performed on the patterned photoresist layer 2002 and the polymer layer 1702. Since different regions in the patterned photoresist layer 2002 have different thicknesses, different amounts of polymer material are etched from corresponding regions of the polymer layer 1702. As a result, the shape and size of the dummy units 2002-2 is "transferred" to the polymer layer 1702, forming the micro lenses 1606-2.

When the process of FIG. 20 is employed, the layer being etched to form the micro lenses 1606-2 does not need to be made of polymer. Thus, instead of the polymer layer 1702, another processing layer made of, for example, a dielectric material or a semiconductor material, can be formed over the optical layer 1604 and be processed to form the micro lenses 1606-2.

In the exemplary processes described above with reference to FIGS. 19 and 20, the optical layer 1604 and the polymer layer 1702 are formed separately. Alternatively, in some embodiments, a processing layer can be formed over the LED panel 1602 instead of separate optical layer 1604 and polymer layer 1702. An upper portion of the processing layer can be processed using a process similar to one of the exemplary processes described above with reference to FIGS. 19 and 20, to form the micro lens array 1606. The remaining lower portion of the processing layer functions as the optical layer 1604. When the process of FIG. 19 is employed, the processing layer can be entirely made of polymer. When the process of FIG. 20 is employed, the processing layer can be entirely made of polymer, dielectric, or semiconductor.

Figure 21:
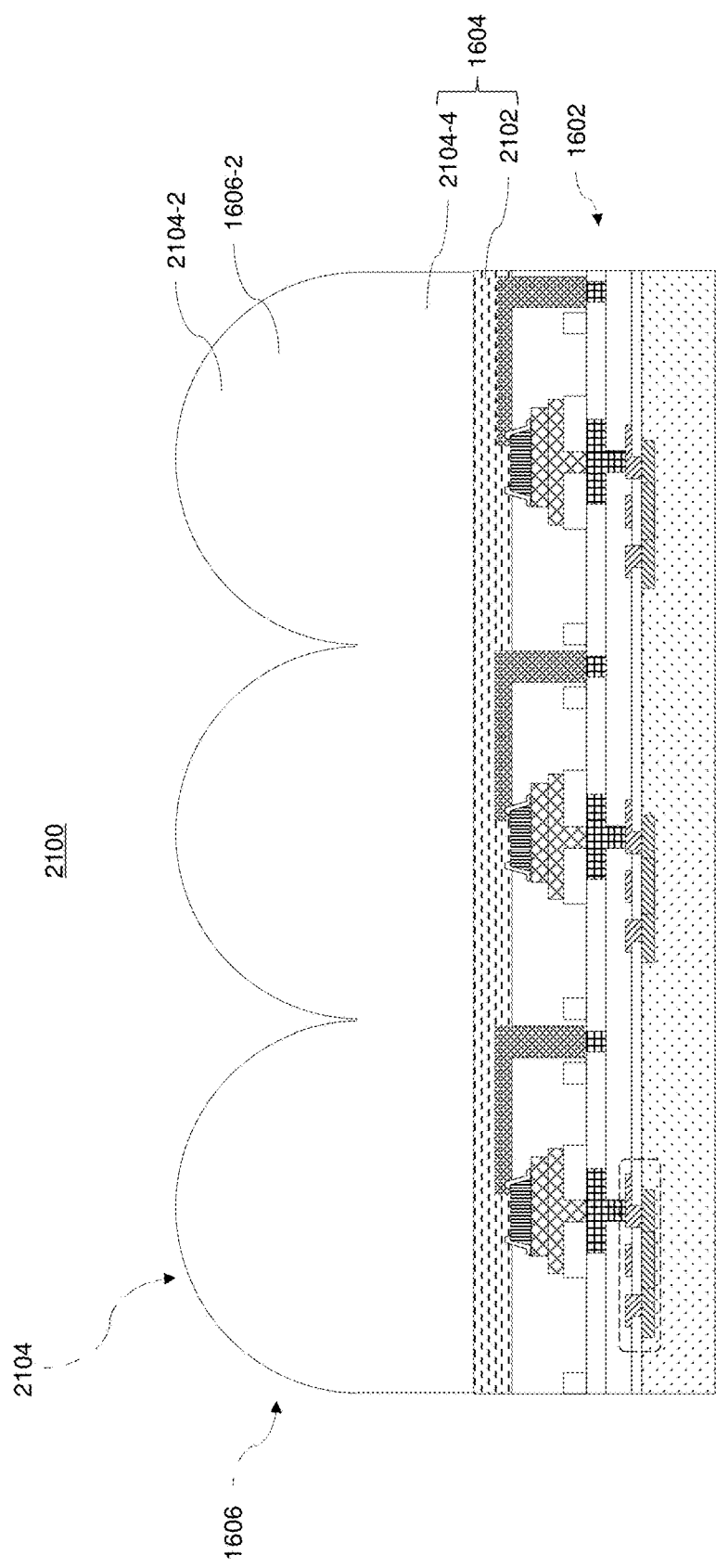
FIG. 21 schematically shows an LED display panel according to another exemplary embodiment.

FIG. 21 is a cross-sectional view schematically showing another exemplary LED display panel 2100 consistent with the present disclosure. The LED display panel 2100 includes the LED panel 1602, a bonding polymer layer 2102 formed over the LED panel 1602, and a pre-fabricated micro lens assembly 2104 bonded to the LED panel 1602 through the bonding polymer layer 2102. As shown in FIG. 21, a portion of the micro lens assembly 2104 is pre-fabricated to a plurality of curved protrusions 2104-2. The plurality of curved protrusions 2104-2 constitute the micro lenses 1606-2 and form the micro lens array 1606. The remaining part of the micro lens assembly 2104, also referred to herein as a "base portion 2104-4," and the bonding polymer layer 2102 together constitute the optical spacer 1604. The micro lens assembly 2104 can be fabricated using, for example, one of the above-described processes for forming micro lenses.

Figure 22A:
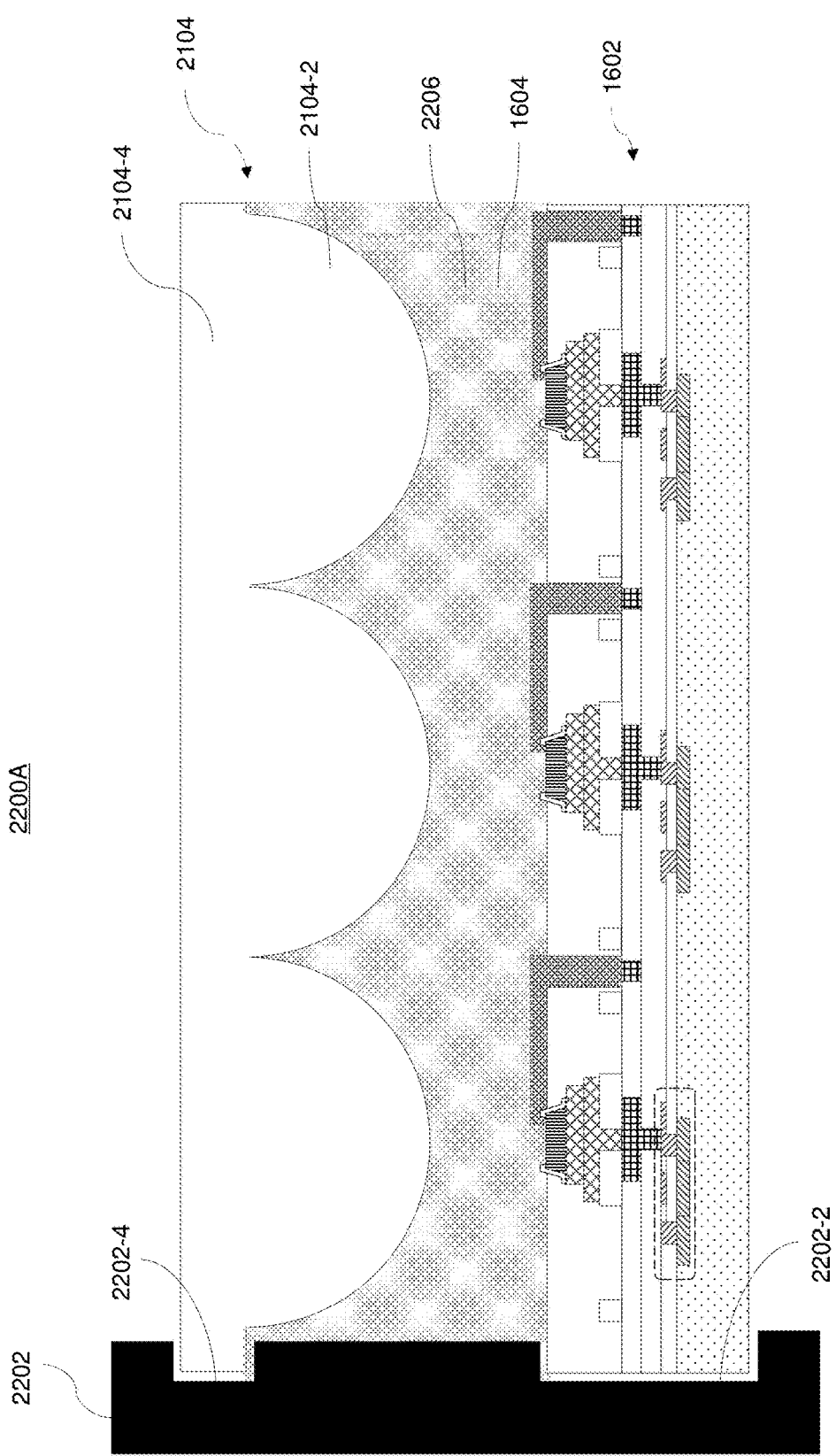
FIGS. 22A and 22B schematically show LED display panels according to other exemplary embodiments.
Figure 22B:
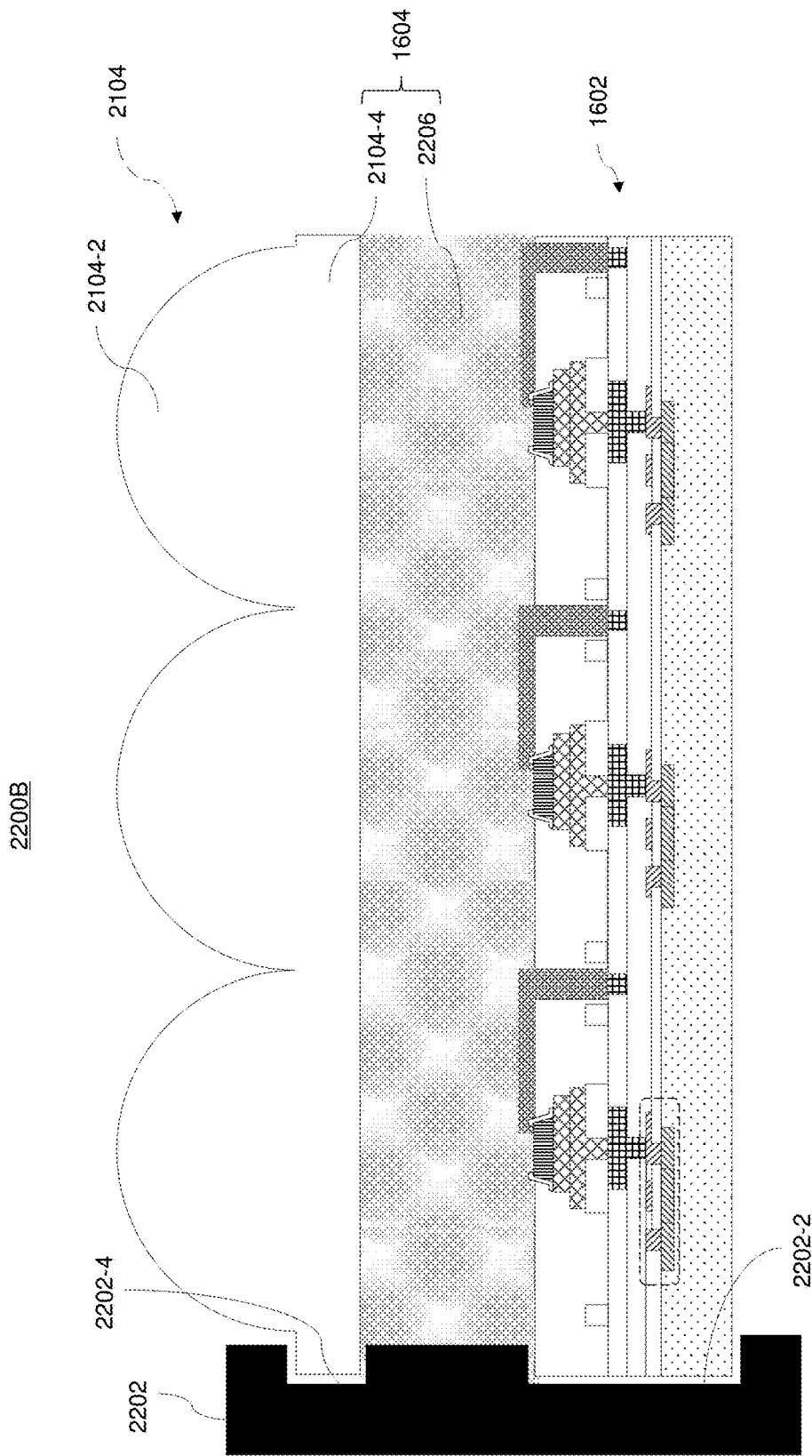

In the LED display panel 2100, the micro lens assembly 2104 is bonded to the LED panel 1602 through the bonding polymer layer 2102. In some embodiments, the micro lens assembly 2104 and the LED panel 1602 can be assembled together by other means. FIGS. 22A and 22B are cross-sectional views schematically showing other exemplary LED display panels 2200A and 2200B consistent with the present disclosure. The LED display panels 2200A and 2200B include the LED panel 1602, the micro lens assembly 2104, and a mechanical fixture 2202 holding the LED panel 1602 and the micro lens assembly 2104. In particular, the mechanical fixture 2202 includes a first clamping mechanism 2202-2 and a second clamping mechanism 2202-4. The first clamping mechanism is configured to receive a portion of the LED panel 1602 so as to hold the LED panel 1602. The second clamping mechanism 2202-4 is configured to receive a portion of the micro lens assembly 2104, such as a portion of the base portion 2104-4, so as to hold the micro lens assembly 2104. The first and second clamping mechanisms 2202-2 and 2202-4 can be, for example, recesses in the mechanical fixture 2202.

In the LED display panel 2200A, the protrusions 2104-2 of the micro lens assembly 2104 face the LED panel 1602. An air gap 2206 between the micro lens assembly 2104 and the LED panel 1602 constitutes the optical spacer 1604. In this case, since the flat base portion 2104-4 faces outwards, the protrusions 2104-2, i.e., the micro lenses 1606-2, can be protected from damage by external forces. On the other hand, in the LED display panel 2200B, the protrusions 2104-2 of the micro lens assembly 2104 face towards an opposite direction, i.e., the direction facing away from the LED panel 1602. In this case, the air gap 2206 and the base portion 2104-2 together constitute the optical spacer 1604.

In the exemplary LED display panels described above, the optical spacer and the micro lens array are made separately from the LED panel 1602. Sometimes, LED dies in an LED panel can also be manufactured using flip-chip technology. That is, semiconductor epitaxial layers are first epitaxially grown on a growth substrate and fabricated to form LED dies. The resulting epitaxial wafer including the growth substrate and the LED dies is flipped over and bonded to a driver circuit wafer through bonding pads. Usually, the growth substrate is then thinned by, for example, a polishing process. Consistent with the present disclosure, a portion of the growth substrate can be fabricated into micro lenses, such that no extra layers need to be formed.

Figure 23:
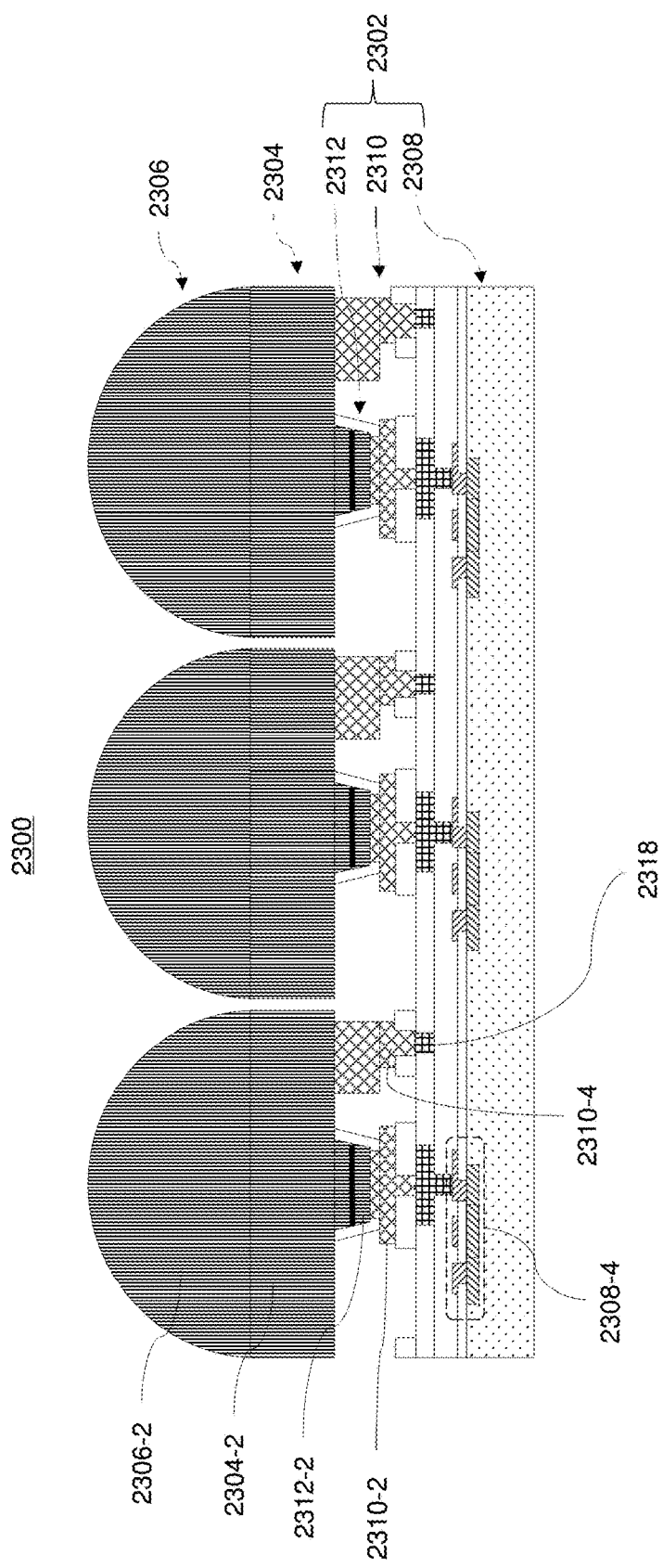
FIG. 23 schematically shows an LED display panel according to another exemplary embodiment.

FIG. 23 is a cross-sectional view schematically showing another exemplary LED display panel 2300 consistent with the present disclosure. In the LED display panel 2300, the LED dies, the optical spacer, and the micro lenses are formed from the same semiconductor epitaxial wafer.

As shown in FIG. 23, the LED display panel 2300 includes an LED panel 2302, an optical spacer 2304 over the LED panel 2302, and a micro lens array 2306 over the optical spacer 2304. The LED panel 2302 includes a driver circuit wafer 2308, a bonding metal layer 2310 formed over the driver circuit wafer 2308, and an LED array 2312 formed over the bonding metal layer 2310. The driver circuit wafer 2308 includes a plurality of driver circuits 2308-4. The driver circuit wafer 2308 and the driver circuits 2308-4 are similar to the driver circuit wafer 1608 and the driver circuits 1608-4 described above with reference to FIG. 16, and thus their detailed description is omitted here.

The LED array 2312 includes a plurality of flip-chip LED dies 2312-2. The bonding metal layer 2310 includes first bonding metal pads 2310-2 and second bonding metal pads 2310-4. Each of the first bonding metal pads 2310-2 is electrically coupled to one electrode, such as the p-electrode, of the corresponding LED die 2312-2, and is also electrically coupled to the corresponding driver circuit 2308-4. Similarly, each of the second bonding metal pads 2310-4 is electrically coupled to another electrode, such as the n-electrode, of the corresponding LED die 2312-2, and is coupled to a common ground 2318.

As shown in FIG. 23, the optical spacer 2304 includes a plurality of spacer units 2304-2 separated and electrically isolated from each other. Each of the spacer units 2304-2 corresponds to one of the LED dies 2312-2. Since the LED dies 2312-2 and the optical spacer 2304 are formed of the same semiconductor growth substrate, electrically isolating the spacer units 2304-2 ensures electrical isolation between the LED dies 2312-2.

Further, the micro lens array 2306 includes a plurality of micro lenses 2306-2. The micro lenses 2306-2 are similar to the micro lenses 1606-2 in terms of size, shape, and configuration, but are made from the same semiconductor epitaxial layer as the optical spacer units 2304-2 and the LED dies 2312-2. As shown in FIG. 23, the micro lenses 2306-2 are also separated and electrically isolated from each other.

Specifically, to form the LED display panel 2300 having the micro lenses 2306-2, an exemplary process described below can be used. First, a semiconductor epitaxial layer is grown on a semiconductor growth substrate. The semiconductor epitaxial layer can include a plurality of epitaxial sub-layers according to the LED array 2312 to be formed. The semiconductor epitaxial layer is then processed to form the LED array 2312, resulting in a semiconductor epitaxial wafer having the plurality of LED dies 2312-2 formed on one side of the semiconductor epitaxial layer, which in turn is formed on the semiconductor growth substrate. The semiconductor epitaxial wafer is then aligned and bonded onto the driver circuit wafer 2308 such that each of the LED dies 2312-2 is bonded to one of the driver circuits 2308-4 of the driver circuit wafer 2308. After bonding, the semiconductor growth substrate is removed, leaving the semiconductor epitaxial layer bonded to the driver circuit wafer 2308. The semiconductor growth substrate can be removed by, for example, a laser lift-off process or an etching process, such as a wet etching process or a dry etching process. The back side of the semiconductor epitaxial layer, i.e., the side opposite to the side on which the LED dies 2312-2 are formed, is processed using, for example, one of the above-described processes for forming micro lenses. In some embodiments, the semiconductor epitaxial layer is processed such that the micro lenses 2306-2 are separated and electrically isolated from each other. Further, a portion of the semiconductor epitaxial layer between the micro lens array 2306 and the LED array 2312 is processed to form the spacer units 2304-2 that are separated and electrically isolated from each other by, for example, an etching process. In some embodiments, before the process for forming the micro lenses 2306-2 is conducted, the semiconductor epitaxial layer is thinned from the back side, for example, by a polishing process or an etching process.

In the exemplary LED display panel described above, one pixel of the LED display panel includes one LED die, i.e., each driver circuit controls one LED die. In some embodiments, the LED display panel can have pixels each including two or more LED dies, in which each driver circuit controls two or more LED dies.

Figure 24A:
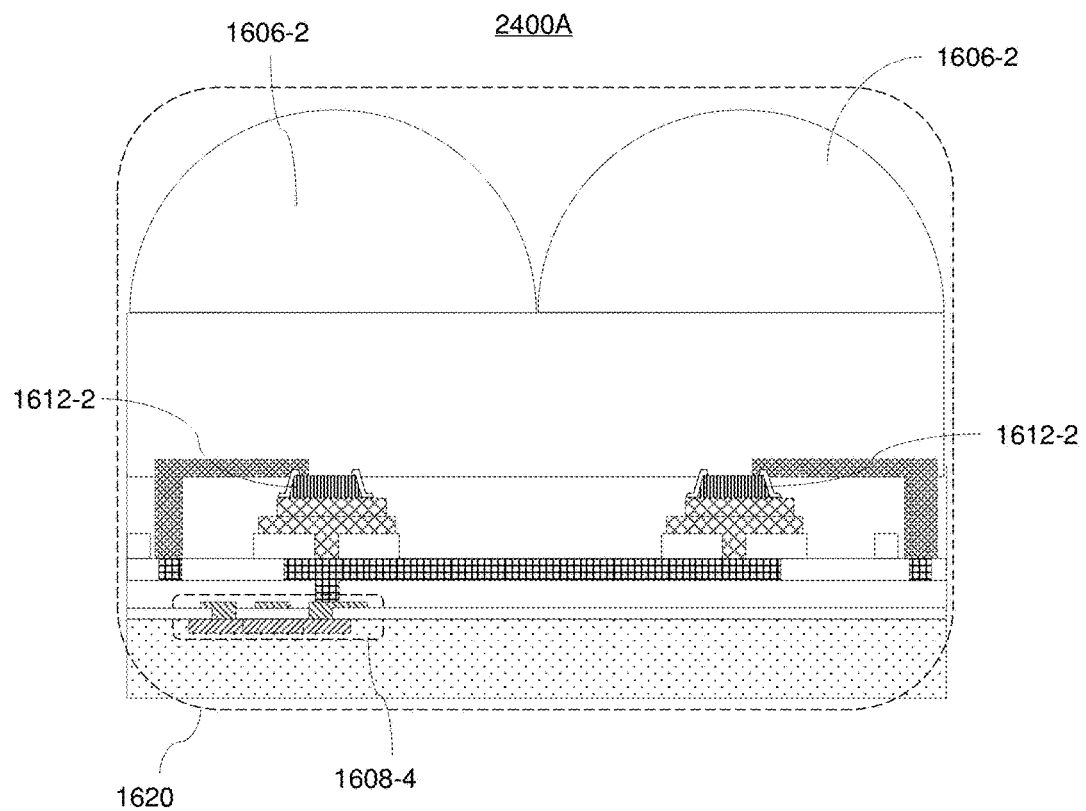
FIGS. 24A and 24B schematically show LED display panels according to other exemplary embodiments.

FIG. 24A is a cross-sectional view of another exemplary LED display panel 2400A consistent with the present disclosure. The LED display panel 2400A is similar to the LED display panel 1600, except that in the LED display panel 2400A, each pixel 1620 includes two LED dies 1612-2 (only one pixel is shown in FIG. 24A). The two LED dies 1612-2 in the same pixel 1620 are coupled in parallel to each other and are coupled to the same driver circuit 1608-4. In the LED display panel 2400A, the two LED dies 1612-2 in the same pixel 1620 correspond to different micro lenses 1606-2.

Figure 24B:
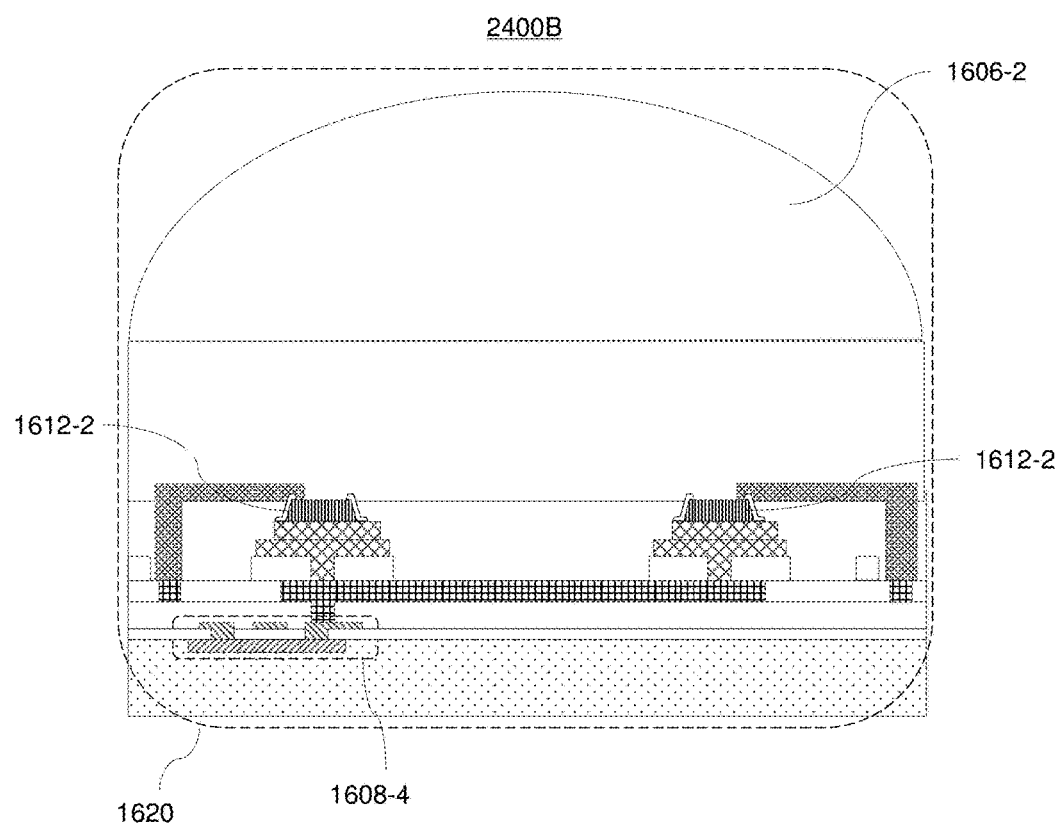

FIG. 24B is a cross-sectional view of another exemplary LED display panel 2400B consistent with the present disclosure. The LED display panel 2400B is similar to the LED display panel 2400A, except that in the LED display panel 2400B, the two LED dies 1612-2 in the same pixel 1620 share the same micro lens 1606-2. Although FIG. 24B shows two LED dies 1612-2 sharing the same micro lens 1606-2, the disclosed device can also be practiced with more than two LED dies sharing the same micro lens. That is, according to the present disclosure, each micro lens can correspond to and be arranged over two or more LED dies.

In some embodiments, for example, as shown in FIGS. 16, 21, 22A, 22B, 23, and 24A, each micro lens is aligned with one corresponding LED die, e.g., the center of the micro lens is approximately aligned with the center of the corresponding LED die. In some embodiments, for example, as shown in FIG. 24B, the micro lens does not align with individual LED dies.

As discussed above, an LED panel consistent with the present disclosure can be used as an imager device in an LED projector. FIGS. 14 and 15 described above schematically show an exemplary mono-color LED projector and a full-color LED projector, respectively. In the full-color LED projector 1500, the beam combiner 1508 is arranged in the optical path between the LED display panels 1506 and the projection lens 1504. That is, the light from the LED display panels 1506 is first combined by the beam combiner 1508 and then projected by the projection lens 1504 onto, for example, a screen (not shown). In FIG. 15, three LED display panels 1506 are shown, which can be, for example, a red LED display panel including a red LED panel having an array of red LEDs, a green LED display panel including a green LED panel having an array of green LEDs, and a blue LED display panel including a blue LED panel having an array of blue LEDs.

In a projector, the distance between an imager device and a projection lens is usually in the range between the focal length of the projection lens and twice the focal length. Sometimes, to project an image onto a surface that is relatively far away from the projector, the imager device needs to be arranged close to the focal point of the projection lens. Therefore, arranging the beam combiner 1508 at a location in the optical path between the LED display panels 1506 and the projection lens 1504 may limit the design of the beam combiner 1508, especially the size of the beam combiner 1508. To increase design flexibility, different configurations can be employed.

Figure 25:
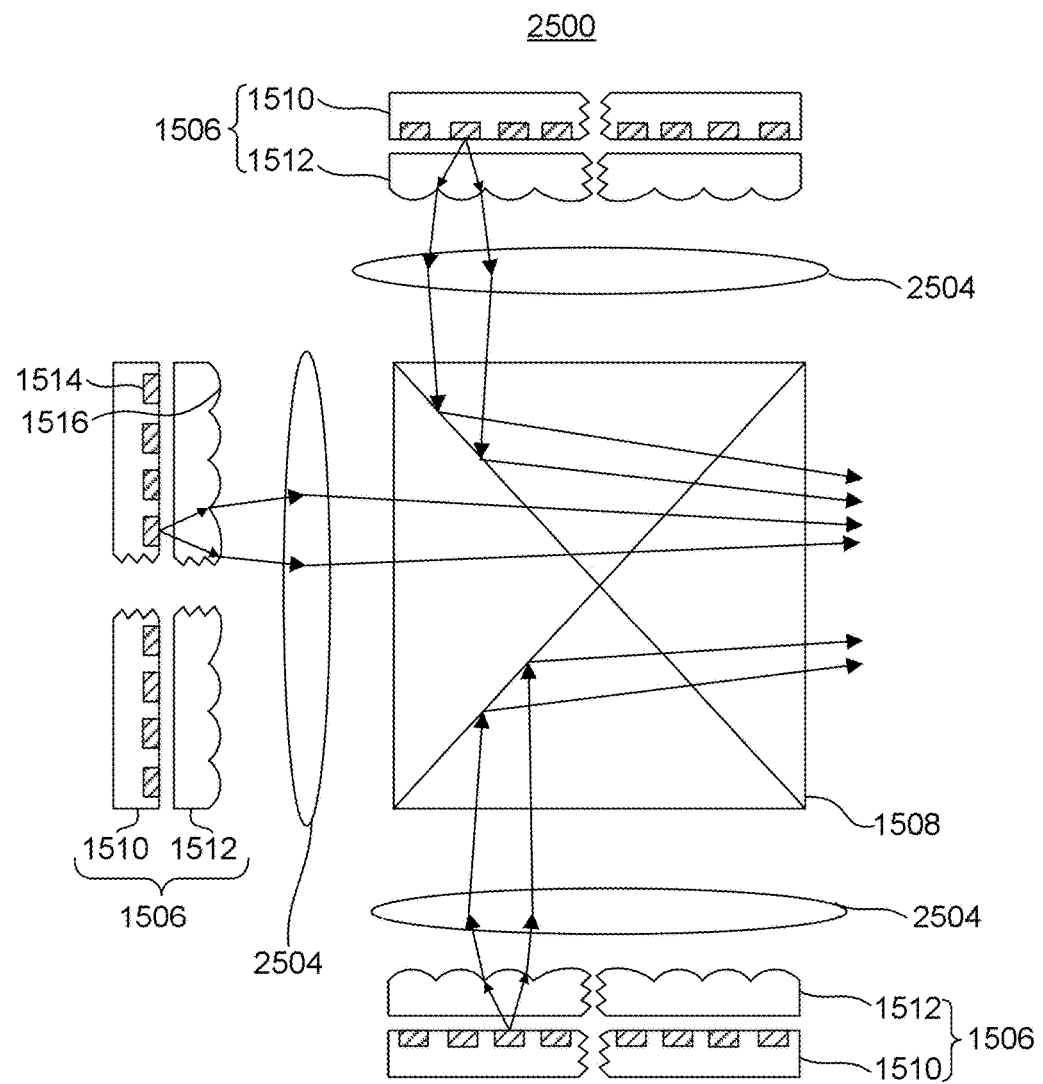
FIG. 25 schematically shows a multi-color LED projector according to another exemplary embodiment.

For example, FIG. 25 schematically shows another exemplary full-color LED projector 2500 consistent with the present disclosure. The LED projector 2500 is similar to the LED projector 1500, except that, instead of the projection lens 1504, the LED projector 2500 includes a set of projection lenses 2504. Each projection lens 2504 corresponds to one of the LED display panels 1506 and is arranged in the optical path between the corresponding LED display panel 1506 and the beam combiner 1508. That is, the light from the LED display panels 1506 is projected by the corresponding projection lenses 2504 to the beam combiner 1508 and then combined by the beam combiner 1508 to form a full-color image. Compared to the LED projector 1500, the LED projector 2500 may allow a more flexible design of the projector. For example, because the beam combiner 1508 in the LED projector 2500 is not arranged between the LED panels 1506 and a projection lens, the size of the beam combiner 1508 is not limited by the distance between the LED panels 1506 and the projection length, and thus a more flexible design can be implemented for the beam combiner 1508.

The beam combiner 1508 can include one or more dichroic mirrors and one or more prisms, configured and arranged so that light beams of certain wavelengths (hence of certain colors) are reflected and light beams of certain other wavelengths (hence of certain other colors) are allowed to transmit with minimal reflection. As a result, light beams of different colors entering the beam combiner 1508 from different directions are output by the beam combiner 1508 along a same direction. Thus, images of different colors generated by different LED display panels are combined by the beam combiner 1508 to form a full-color image.

Figure 26:
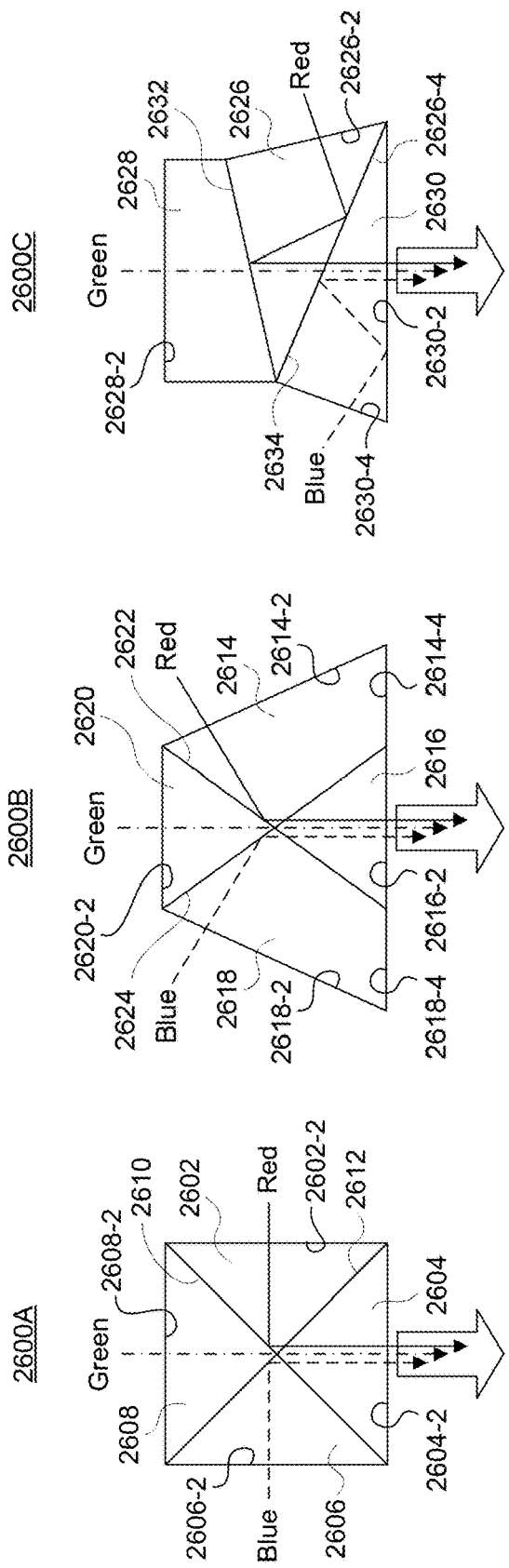
FIGS. 26A-C schematically show beam combiners according to exemplary embodiments.

FIGS. 26A-26C schematically show exemplary beam combiners 2600A, 2600B, and 2600C consistent with the present disclosure, which are configured to combine images of three primary colors, e.g., red, blue, and green, respectively, output by red, blue, and green LED display panels, to form a full-color image. As shown in FIG. 26A, the beam combiner 2600A includes prisms 2602, 2604, 2606, and 2608, each having an isosceles right triangular cross-section. A first dichroic mirror 2610 is arranged between the prisms 2602 and 2608, and also between the prisms 2604 and 2606. The first dichroic mirror 2610 is configured to reflect red light and allow light of other colors to pass through, and is thus also referred to as a red-reflecting mirror. A second dichroic mirror 2612 is arranged between the prisms 2602 and 2604, and also between the prisms 2606 and 2608. The second dichroic mirror 2612 is configured to reflect blue light and allow light of other colors to pass through, and is thus also referred to as a blue-reflecting mirror.

As shown in FIG. 26A, red light (solid-line arrow in the figure) enters the beam combiner 2600A through a surface 2602-2, also referred to as a "red input surface," of the prism 2602, is reflected by the red-reflecting mirror 2610, and exits from the beam combiner 2600A through a surface 2604-2, also referred to as an "output surface," of the prism 2604. Similarly, blue light (dashed-line arrow in the figure) enters the beam combiner 2600A through a surface 2606-2, also referred to as a "blue input surface," of the prism 2606, is reflected by the blue-reflecting mirror 2612, and exits from the beam combiner 2600A through the output surface 2604-2. On the other hand, green light (dash-dotted-line arrow in the figure) enters the beam combiner 2600A through a surface 2608-2, also referred to as a "green input surface," of the prism 2608, and exits from the beam combiner 2600A through the output surface 2604-2. As a result, the red, blue, and green light from different LED display panels is combined to form output light to be projected onto a screen.

The beam combiner 2600B shown in FIG. 26B includes prisms 2614, 2616, 2618, and 2620. The prisms 2614 and 2618 each have a trapezoidal cross-section, and the prisms 2616 and 2620 each have an isosceles triangular cross-section. A red-reflecting mirror 2622 is arranged between the prisms 2614 and 2620, and also between the prisms 2616 and 2618. A blue-reflecting mirror 2624 is arranged between the prisms 2614 and 2616, and also between the prisms 2618 and 2620. Similar to the beam combiner 2600A, in the beam combiner 2600B, red light enters the beam combiner 2600B through a red input surface 2614-2 of the prism 2614, is reflected by the red-reflecting mirror 2622, and exits from the beam combiner 2600B through an output surface 2614-4 of the prism 2614 or an output surface 2616-2 of the prism 2616. Blue light enters the beam combiner 2600B through a blue input surface 2618-2 of the prism 2618, is reflected by the blue-reflecting mirror 2624, and exits from the beam combiner 2600B through an output surface 2618-4 of the prism 2618 or the output surface 2616-2 of the prism 2616. Different from the red and blue light, green light enters the beam combiner 2600B through a green input surface 2620-2 of the prism 2620, and exits from the beam combiner 2600B through the output surfaces 2614-4, 2616-2, and 2618-4. As a result, the red, blue, and green light from different LED display panels is combined to form output light to be projected onto a screen.

The exemplary beam combiners 2600A and 2600B both have a symmetric structure, with the two dichroic mirrors intersecting with each other. In these examples, one or both of the two dichroic mirrors can be provided as multiple pieces. In some embodiments, each of the two dichroic mirrors can be provided as one piece with an insertion slot formed therein, and the two dichroic mirrors can intersect with each other through the insertion slots.

In some embodiments, beam combiners consistent with the present disclosure can also have an asymmetric structure, such as the beam combiner 2600C shown in FIG. 26C. The beam combiner 2600C includes prisms 2626, 2628, and 2630. The prisms 2626 and 2630 each have a right triangular cross-section, and the prism 2628 has a right trapezoidal cross-section. A red-reflecting mirror 2632 is arranged between the prisms 2626 and 2628, and a blue-reflecting mirror 2634 is arranged between the prisms 2626 and 2630. An air gap (not shown) is formed between the prism 2626 and the blue-reflecting mirror 2634 to allow the total reflection at a surface 2626-4 to occur.

As shown in FIG. 26C, red light enters the beam combiner 2600C through a red input surface 2626-2 of the prism 2626, undergoes total internal reflection at the surface 2626-4 of the prism 2626, is further reflected by the red-reflecting mirror 2632, and exits from the beam combiner 2600C through an output surface 2630-2 of the prism 2630. Consistent with the disclosure, the material and angles of the prism 2626 are chosen and designed so that the red light impinges on the surface 2626-4 at an incidence angle larger than a total-reflection angle at the surface 2626-4 after entering the prism 2626, but impinges again on the surface 2626-4 at an incidence angle smaller than the total-reflection angle at the surface 2626-4 after being reflected by the red-reflecting mirror 2632. As a result, the red light can be reflected at the surface 2626-4 after entering the prism 2626 but can pass through the surface 2626-4 after being reflected by the red-reflecting mirror 2632.

Blue light enters the beam combiner 2600C through a blue input surface 2630-4 of the prism 2630, undergoes total internal reflection at the output surface 2630-2, is further reflected by the blue-reflecting mirror 2634, and exits from the beam combiner 2600C through the output surface 2630-2. Similar to the prism 2626, the material and angles of the prism 2630 are chosen and designed so that the blue light impinges on the output surface 2630-2 at an incidence angle larger than a total-reflection angle at the output surface 2630-2 after entering the prism 2630, but impinges again on the output surface 2630-2 at an incidence angle smaller than the total-reflection angle at the output surface 2630-2 after being reflected by the blue-reflecting mirror 2634. As a result, the blue light can be reflected at the output surface 2630-2 after entering the prism 2630 but can pass through the output surface 2630-2 after being reflected by the blue-reflecting mirror 2634.

Similar to the examples shown in FIGS. 26A and 26B, in the example shown in FIG. 26C, green light enters the beam combiner 2600C through a green input surface 2628-2 of the prism 2628, and exits from the beam combiner 2600C through the output surface 2630-2. In some embodiments, prisms 2626, 2628, and 2630 are designed and arranged in such a way that the green input surface 2628-2 and the output surface 2630-2 are parallel to each other.

As a result of the process and configuration described above, the red, blue, and green light from different LED display panels is combined to form full color output light to be projected onto a screen.

In the examples described above in connection with FIGS. 15, 25, and 26A-C, a beam combiner including one or more prisms and one or more dichroic mirrors is used to combine light from different LED display panels and project the combined light onto a screen. That is, images generated by the different LED display panels are combined to form a full-color image. Consistent with the present disclosure, the prisms and dichroic mirrors are configured and arranged in such a way that images generated by the different LED display panels overlap on the screen.

Figure 27:
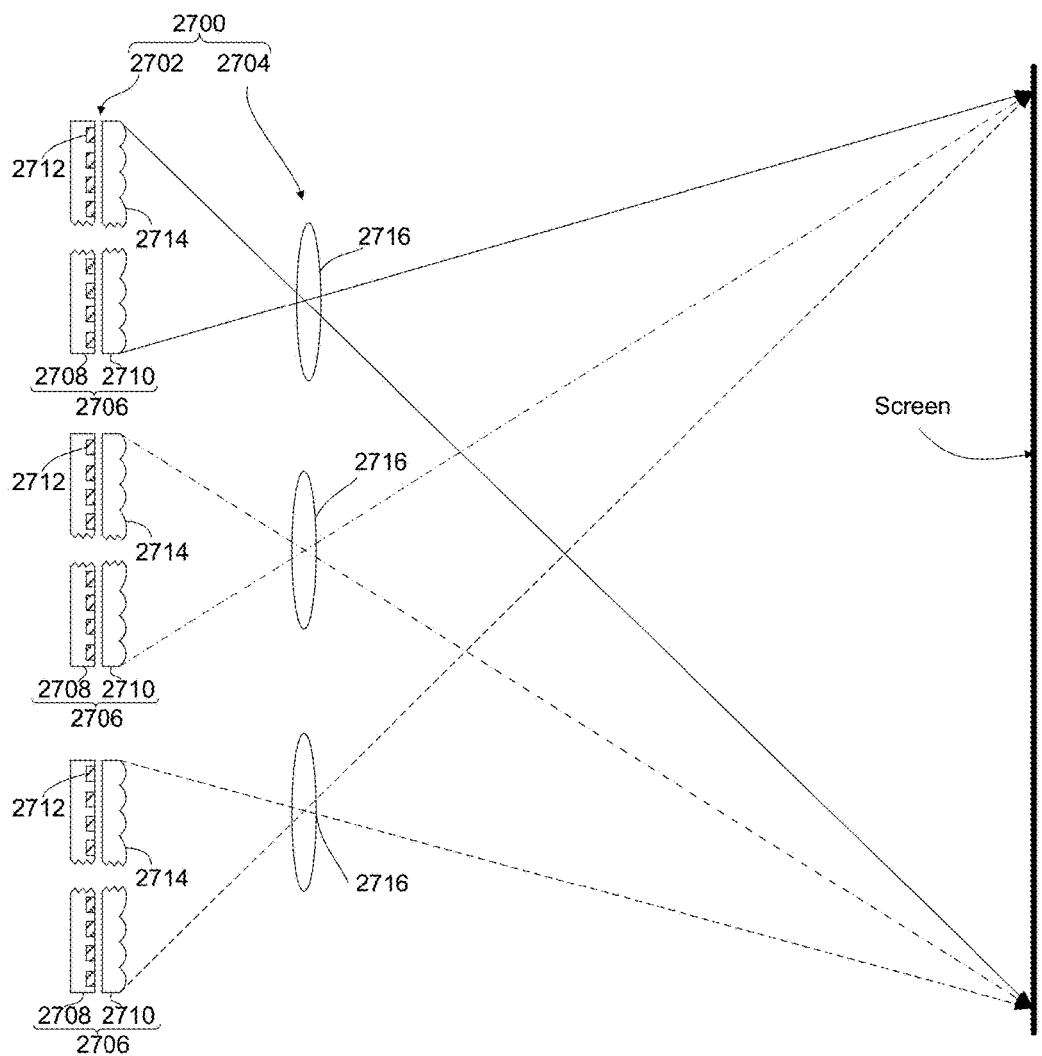
FIG. 27 schematically shows a multi-color LED projector according to another exemplary embodiment.
Figure 28:
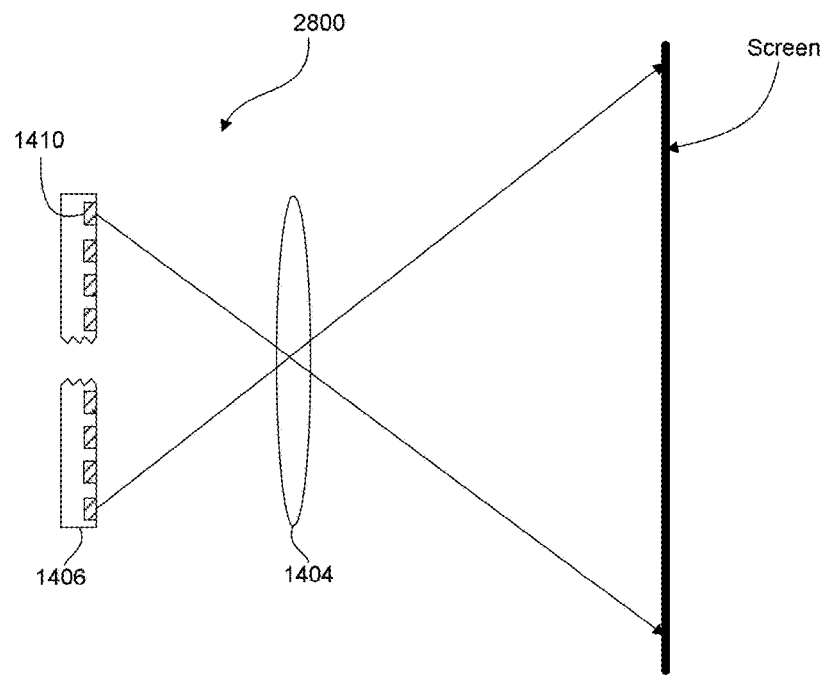
FIG. 28 schematically shows a mono-color LED projector according to another exemplary embodiment.
Figure 29:
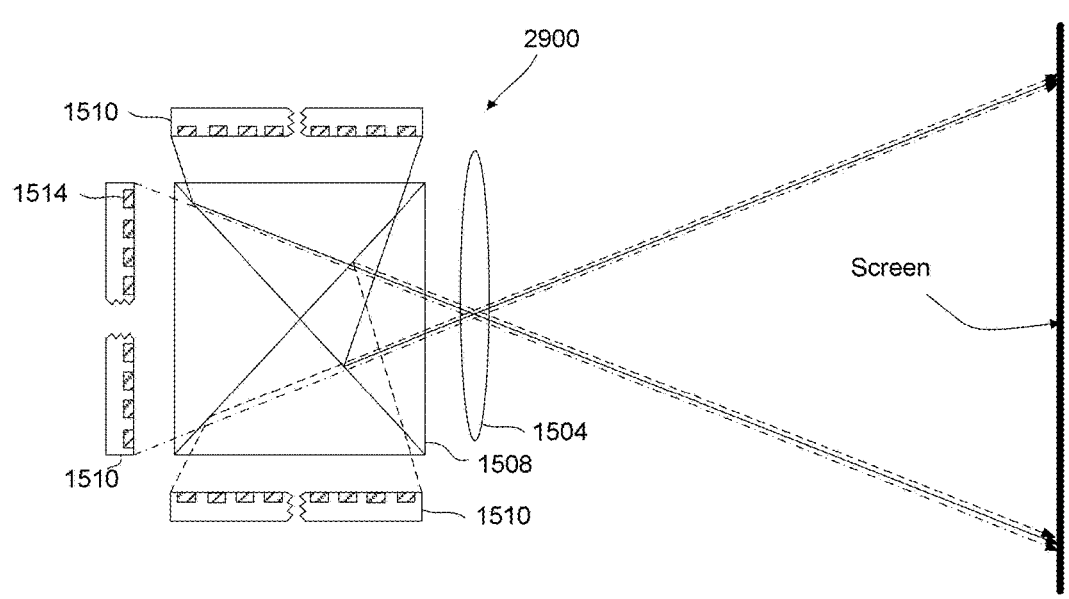
FIG. 29 schematically shows a multi-color LED projector according to another exemplary embodiment.
Figure 30:
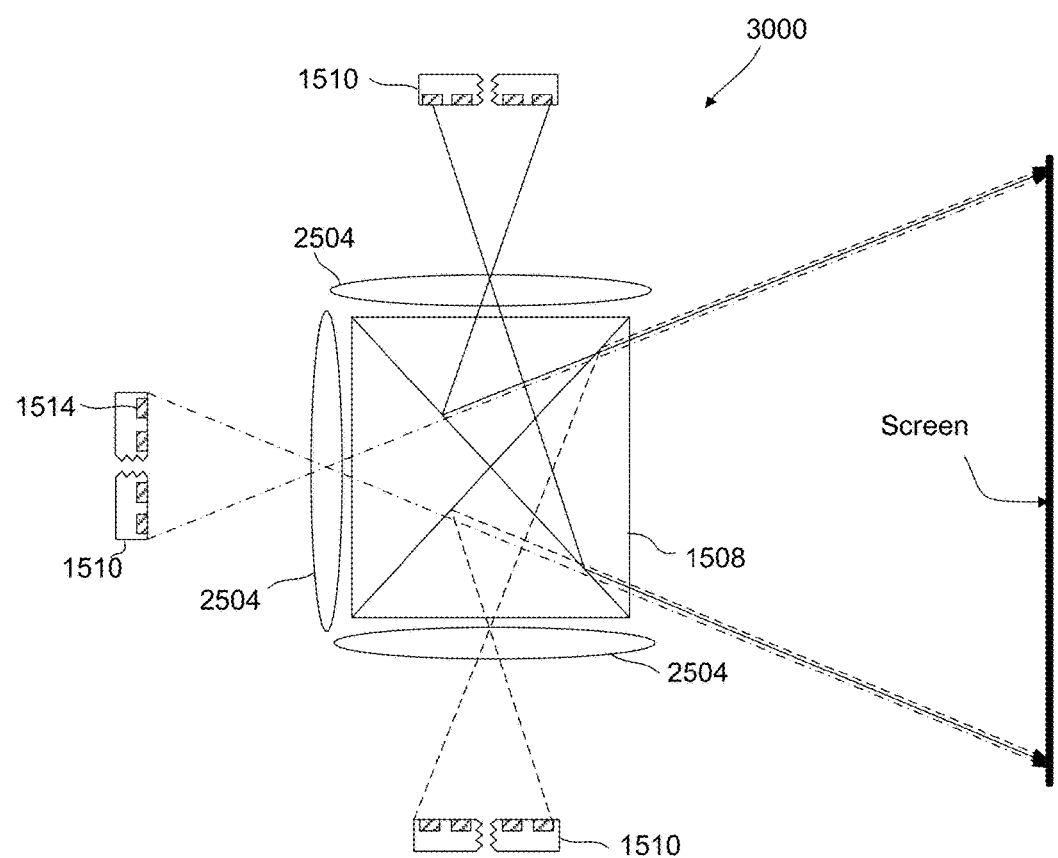
FIG. 30 schematically shows a multi-color LED projector according to another exemplary embodiment.
Figure 31:
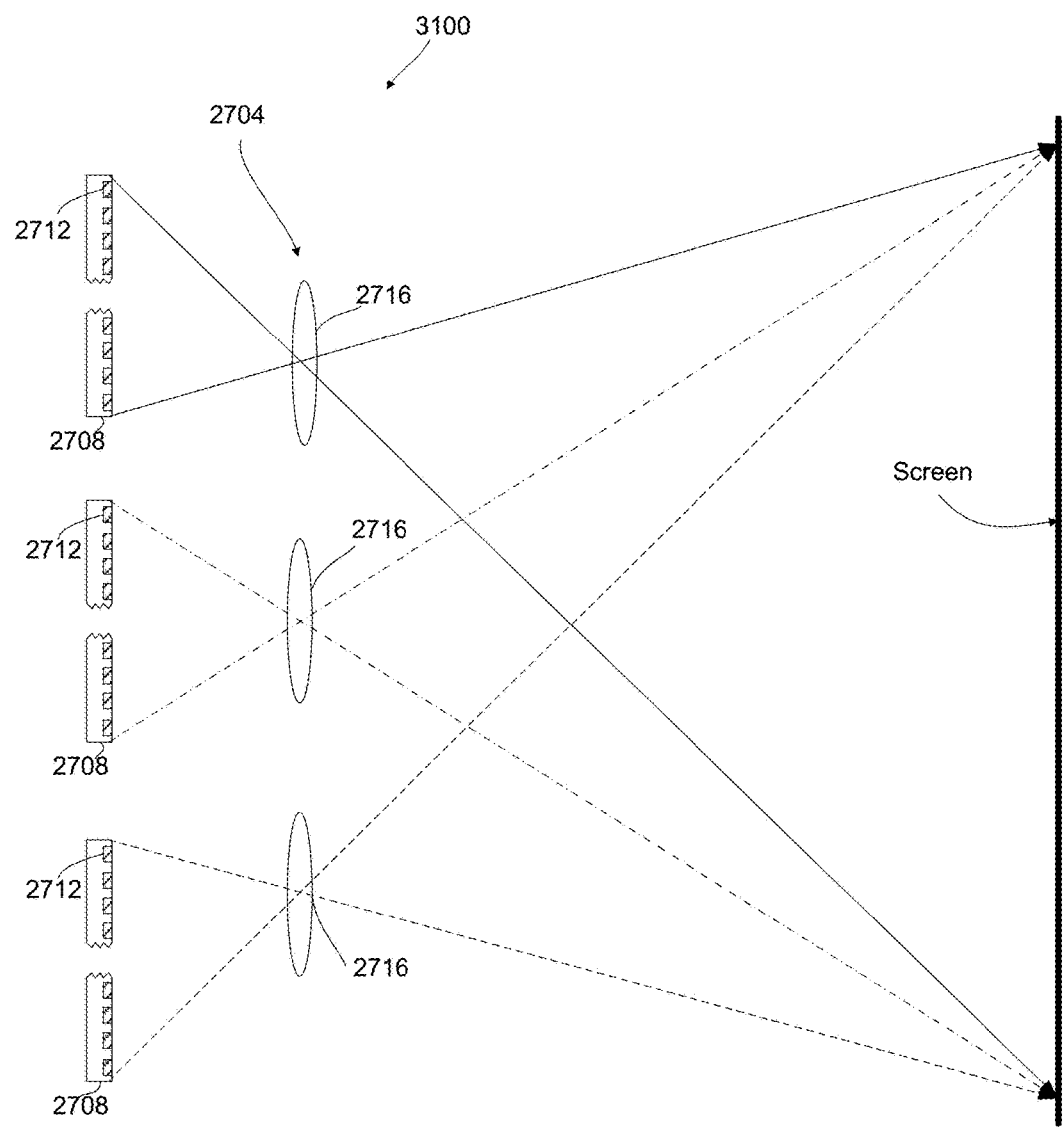
FIG. 31 schematically shows a multi-color LED projector according to another exemplary embodiment.

In some embodiments, the image combining function and the projecting function can be integrated in one set of optics. FIG. 27 schematically shows another exemplary full-color LED projector 2700 consistent with the present disclosure. The full-color LED projector 2700 is essentially a multiplication of the mono-color LED projector 1400 shown in FIG. 14, with LED display panels emitting light of different colors. As shown in FIG. 27, the LED projector 2700 includes an LED display panel set 2702 and a light combining-projecting lens set 2704. The LED display panel set 2702 includes a plurality of LED display panels 2706 respectively emitting light of different colors, such as red, green, and blue. Each of the LED display panels 2706 includes an LED panel 2708 and a micro lens array 2710. Each LED panel 2708 can be any LED panel consistent with the present disclosure, such as the above-described LED panel 1300A or 1300B, and includes a plurality of LED dies 2712 emitting light of a certain color. LED dies 2712 on different LED panels 2708 can emit light of different colors. The micro lens array 2710 can be any micro lens array consistent with the present disclosure, such as the above-described micro lens array 1602 or 2306, and includes a plurality of micro lens 2714. The light combining-projecting lens set 2704 includes a plurality of lens 2716, each of which corresponds to one of the LED display panels 2706 and is configured to project the light from the corresponding LED display panel 2706 to a screen. Consistent with the present disclosure, the lenses 2716 are configured and arranged so that mono-color images generated by the different LED display panels 2706 overlap on the screen to form a full-color image.

The exemplary LED projectors described above in connection with FIGS. 14 and 15 each include at least one LED display panel having an LED panel and a micro lens array. As discussed above, a micro lens array in an LED projector can reduce the divergence angle of the light emitted by the LED dies on the corresponding LED panel, and helps to increase the brightness of the LED projector and to reduce the power consumption. However, LED projectors consistent with the disclosure can be configured without a micro lens array. FIGS. 28, 29, 30, and 31 schematically show exemplary LED projectors 2800, 2900, 3000, and 3100 consistent with the disclosure. The LED projectors 2800, 2900, 3000, and 3100 are similar to the LED projectors 1400, 1500, 2500, and 2700, respectively, except that the LED projectors 2800, 2900, 3000, and 3100 do not include a micro lens array. Thus, in the LED projectors 2800, 2900, 3000, and 3100, light emitted by an LED panel is directly projected onto a screen without first being converged by a micro lens array. Although the LED projectors 2800, 2900, 3000, and 3100 may have a lower image quality (such as lower sharpness), lower brightness, and/or higher power consumption as compared to the corresponding LED projectors 1400, 1500, 2500, and 2700, the manufacturing cost and the complexity of the LED projectors can be reduced.

As discussed above, in a projector consistent with the present disclosure, LED dies are controlled by corresponding driver circuits individually or as groups. This feature allows a more flexible design of the projector and improved properties of the projector. For example, in a conventional projector such as one using a light source device and an LCD imager device, the light source can have a uniform brightness which can only be adjusted at the projector level. That is, the brightness of the entire image projected by the projector is adjusted simultaneously. However, in a projector consistent with the present disclosure, because an LED panel functions as both the light source device and the imager device, and also because the LED dies are controlled individually or as groups, the brightness of the LED dies can be adjusted individually or as groups. This provides further benefit for an LED projector.

In a projector, the projection lens or lens set is usually not ideal and has a limited entrance pupil. Further, as discussed above, LED dies on an LED panel usually have a large divergence angle. Thus, for an LED die in the middle portion of the LED panel, more light can be collected by the projection lens or lens set and projected onto a screen, resulting in a brighter spot. On the other hand, for an LED die located close to an edge of the LED panel, less light can be collected by the projection lens or lens set and projected onto the screen, resulting in a dimmer spot. As a result, brightness of the image projected on the screen will have a non-uniform distribution even if light emitted by an LED panel has uniform brightness. That is, an image intended to have a uniform brightness distribution will become an image having a non-uniform brightness distribution when projected onto the screen.

The amount of light emitted by the LED panel that can be projected onto the screen can be characterized by a transfer function $T(x, y)$ of the projection lens or lens set, which represents the percentage of the light emitted by an LED die at a position $(x, y)$ on the LED panel that is collected and projected by the projection lens or lens set, i.e., the amount of light that eventually reaches the screen. Therefore, the brightness distribution $E_s(x, y)$ on the screen can be expressed as a product of the brightness distribution $E_p(x, y)$ of the LED panel and the transfer function $T(x, y)$ of the projection lens or lens set:

$$E_s(x,y)=E_p(x,y)\times T(x,y).$$

In the present disclosure, the position $(x, y)$ can be defined in relative dimensions rather than absolute dimensions, according to the number of LED dies in each direction on the LED panel. For example, if the LED panel has a resolution of 1024×768, i.e., the LED panel has 1024 LED dies in the x-direction and 768 LED dies in the y-direction, then the value of x can be from 1 to 1024 and the value of y can be from 1 to 768. In some embodiments, the transfer function $T(x, y)$ of the projection lens or lens set can be determined by measuring the brightness distribution $E_s(x, y)$ on the screen and the brightness distribution $E_p(x, y)$ of the LED panel using, for example, a photodetector, and dividing the measured $E_s(x, y)$ by the measured $E_p(x, y)$. In some embodiments, the transfer function $T(x, y)$ is normalized, i.e., the highest value of $T(x, y)$ is normalized to one.

FIG. 32A schematically shows the brightness distribution $E_p(x, y)$ of the LED panel, the transfer function $T(x, y)$ of the projection lens or lens set, and the brightness distribution $E_s(x, y)$ on the screen. In the example shown in FIG. 32A, the LED panel has a uniform brightness distribution. Thus, because of the non-uniform transfer function of the projection lens or lens set, the brightness distribution on the screen is non-uniform. According to the present disclosure, since the LED dies in the projector can be adjusted individually or as groups, this brightness non-uniformity on the screen can be equalized by compensating the brightness of the LED panel according to the transfer function of the projection lens or lens set, as shown in FIG. 32B.

Figure 33A:
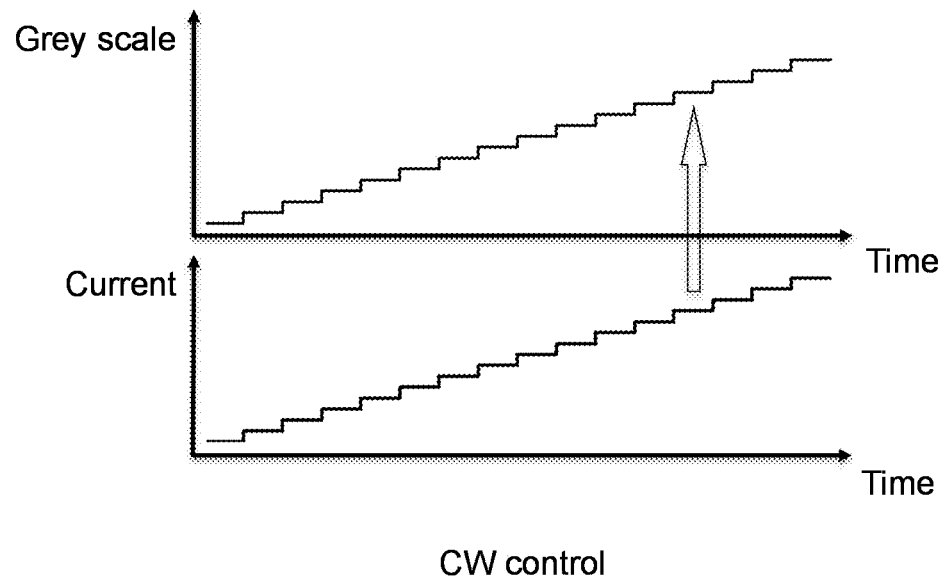
FIGS. 33A and 33B schematically show a continuous-wave scheme and a pulse width modulation scheme for controlling brightness according to exemplary embodiments.
Figure 33B:
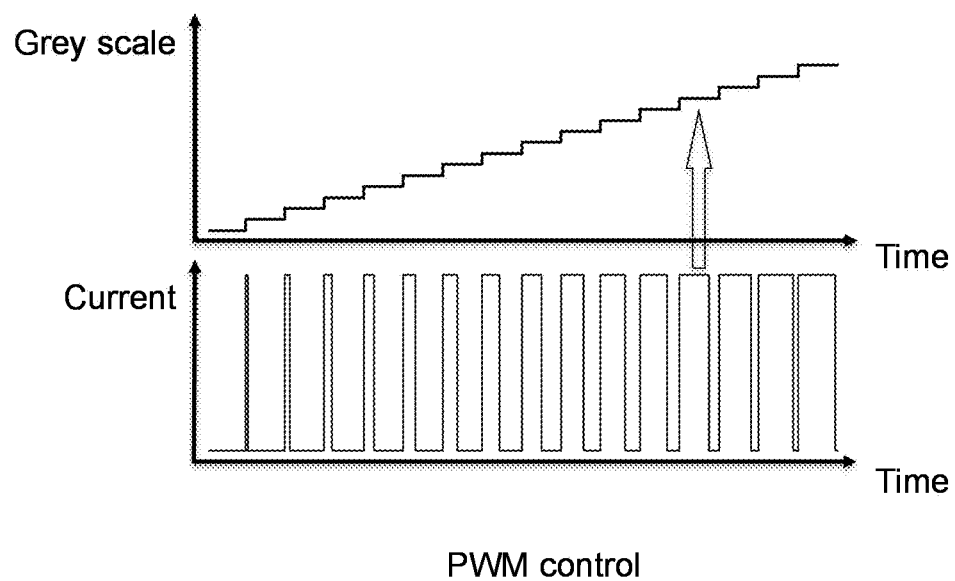

Exemplary devices and methods for compensating the brightness of the LED panel are described below. Usually, the brightness level, i.e., the grey scale, of an individual LED die can be controlled by controlling the current flowing through the LED die, also referred to as a "driving current." Consistent with the present disclosure, the brightness can be controlled according to two schemes—continuous-wave (CW) control and pulse width modulation (PWM) control. FIGS. 33A and 33B schematically show the CW control scheme and the PWM control scheme, respectively. In the CW control scheme, the driving current is input as a continuous wave, and the grey scale is adjusted by adjusting the magnitude of the driving current of the LED die, where a larger driving current corresponds to a higher brightness level, i.e., the brightness level is proportional to the magnitude of the driving current. Consistent with the present disclosure, the driving current for an LED die can be set as a percentage of a maximum driving current, also referred to as a "full current," of the LED die, where the percentage is from 0% to 100%. In the PWM control scheme, the driving current is input as pulses with a constant magnitude, and the grey scale is adjusted by adjusting the pulse width of the pulses, where a wider pulse width corresponds to a higher brightness level, i.e., the brightness level is proportional to the pulse width of the driving current. In the PWM control scheme, the magnitude of the driving current can be controlled at the full current or at a certain percentage of the full current. The pulse width can be set as a percentage of a maximum width, which can be equal to a frame time of the LED panel.

Figure 34:
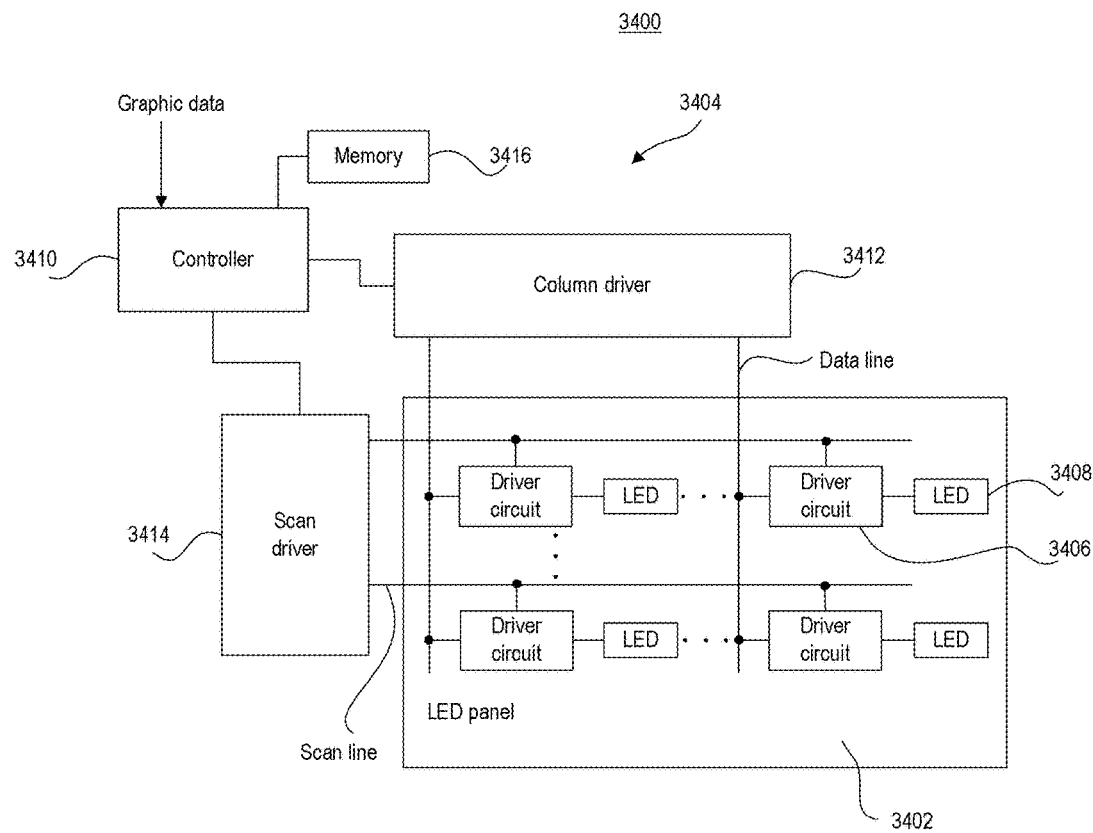
FIG. 34 schematically shows a portion of a projector according to another exemplary embodiment.
Figure 35A:
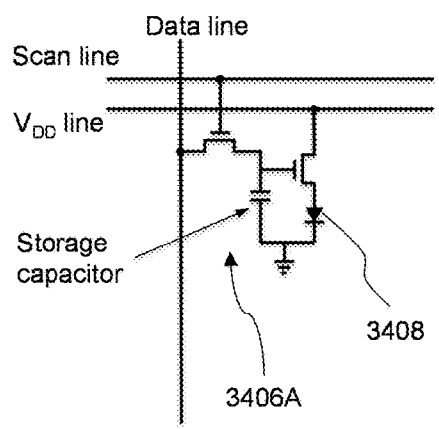
FIGS. 35A-F schematically show driver circuits with different circuit designs according to exemplary embodiments.
Figure 35B:
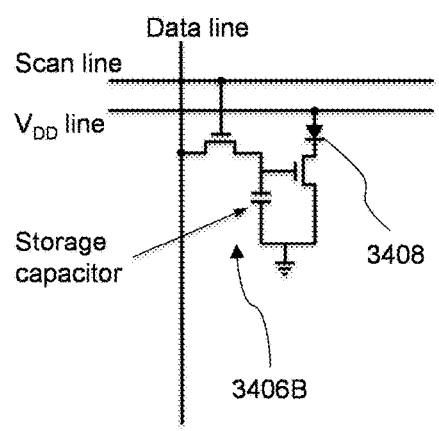
Figure 35C:
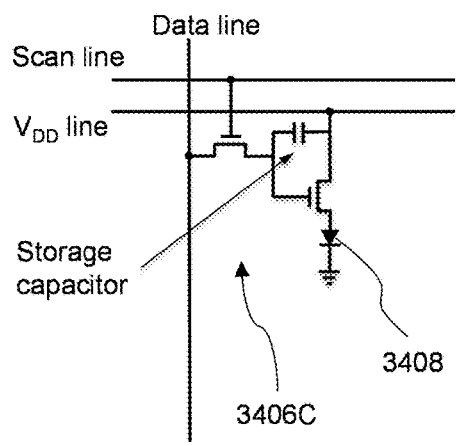
Figure 35D:
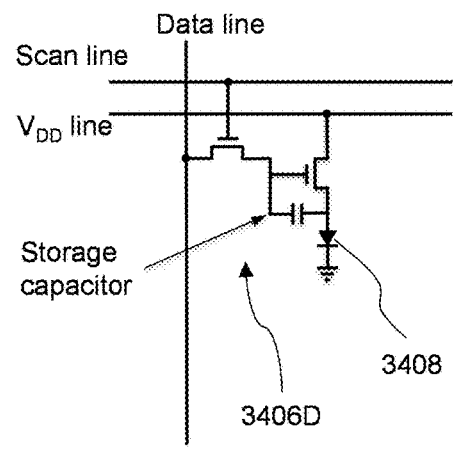
Figure 35E:
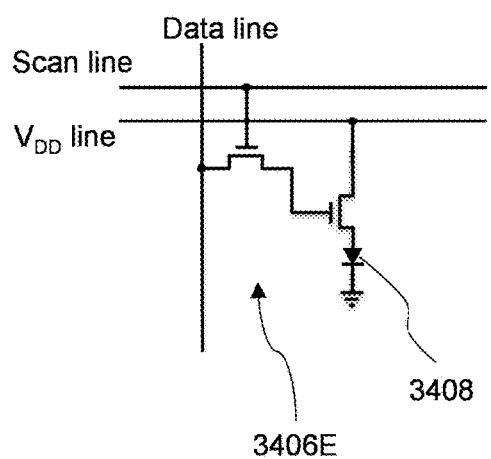
Figure 35F:
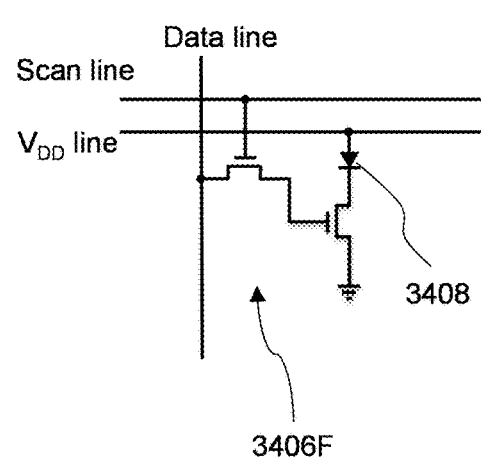

FIG. 34 schematically shows a portion of an exemplary projector 3400 consistent with the present disclosure, including an LED panel 3402 and a panel control circuit 3404 configured to control the operation of the LED panel 3402. Other components of the projector 3400, such as the projection lens or lens set, the (optional) beam combiner, and the (optional) micro lens array, are omitted in FIG. 34. The LED panel 3402 can be any LED panel consistent with the present disclosure, such as one of the exemplary LED panels described above. As shown in FIG. 34, the LED panel 3402 includes a plurality of pixels arranged in columns and rows, each of which includes a driver circuit 3406 configured to drive one or more corresponding LED dies 3408 (only one corresponding LED die 3408 for each driver circuit 3406 is shown in FIG. 34 for illustrative purposes).

The panel control circuit 3404 includes a controller 3410, a data driver 3412 (also referred to as a "column driver") coupled to the driver circuits 3406 through a plurality of data lines, and a scan driver 3414 (also referred to as a "row driver") coupled to the driver circuits 3406 through a plurality of scan lines. The controller 3410 receives graphic data and outputs a column control signal to the data driver 3412 and a row control signal to the scan driver 3414 according to the graphic data. According to the column control signal, the data driver 3412 outputs data signals, which correspond to the graphic data for pixels in one row, to the data lines. Similarly, according to the row control signal, the scan driver 3414 outputs a scan signal to a scan line to turn on the row of pixels coupled to the scan line, for example, by turning on scan control transistors in corresponding driver circuits 3406 in that row, so that data signals output by the data driver 3412 can set the graphic data into the pixels of that row. In some embodiments, the data driver 3412 includes shift registers configured to latch the graphic data of pixels in a row. When a scan signal turns on the scan control transistors in the row, the graphic data latched in the shift registers sets all the pixels in the row simultaneously.

Consistent with the present disclosure, a control signal can be used to indicate the grey scale of an LED die, which is also referred to as a "grey-scale signal." The grey-scale signal can include a binary number, such as an 8-bit binary number or a 16-bit binary number, that represents a brightness level from 0 to a maximum brightness level, such as 255 with an 8-bit grey scale or 65,535 with a 16-bit grey scale. The grey-scale signal can be included as part of the control signals output by the controller 3410.

For example, the column control signals can include the grey-scale signals for the LED dies 3408. Under the CW control scheme, the data driver 3412 adjusts the magnitude of the data signals according to the grey-scale signals, which in turn controls the magnitude of the driving current for each LED die 3408. The magnitude of the driving current of an LED die 3408 can be controlled as a percentage of the full current of the LED die 3408. Thus, under the CW control scheme, the maximum brightness level of the LED die 3408 is obtained when the driving current in the LED die 3408 equals the full current and a brightness level lower than the maximum brightness level is obtained at a driving current smaller than the full current.

Under the PWM control scheme, the data driver 3412 outputs the data signals as pulses at a constant magnitude, and adjusts the pulse width of the data signals according to the grey-scale signals, which in turn controls the pulse width of the driving current for each LED die 3408. Thus, under the PWM control scheme, the maximum brightness level of the LED die 3408 is obtained when the pulse width of the driving current in the LED die 3408 equals the maximum width and a brightness level lower than the maximum brightness level is obtained at a pulse width smaller than the maximum width.

As discussed above, in either the CW control scheme or the PWM control scheme, the brightness of an LED die 3408 is proportional to the current of the LED die 3408. The current of the LED die 3408 can be set by designing the corresponding driver circuit 3406 that drives the LED die 3408. FIGS. 35A-35F schematically show exemplary driver circuits 3406A-3406F with different circuit designs consistent with the present disclosure. As shown in FIGS. 35A-35F, each of the exemplary driver circuits 3406A-3406F includes two transistors with or without a storage capacitor. The LED die 3408 is coupled between a $V_{DD}$ line and a common ground (such as a ground for the LED panel 3402 or a ground for the entire circuit including the LED panel 3402 and the panel control circuit 3404) via one of the two transistors, also referred to as a "data transistor," in the driver circuit 3406. The gate of the data transistor is coupled to a data line through the other one of the two transistors, i.e., the scan control transistor. The gate of the scan control transistor is coupled to a scan line. The data line and the scan line are coupled to the data driver and the scan driver, respectively. In a driver circuit having a storage capacitor, such as one of the driver circuits 3406A-3406D, the storage capacitor can keep the data transistor on, i.e., maintaining the pixel setting of the corresponding pixel, during the period that the scan signals set the pixels in other rows. In some embodiments, the driver circuit 3406 can include more than two transistors and/or more than one storage capacitor.

Therefore, by choosing the design of the driver circuit 3406, such as the number, type, and parameters of the transistors and storage capacitors, the full current of the LED die 3408 can be adjusted. According to the present disclosure, the full current $I_{full}(x, y)$ of an LED die 3408 at position (x, y) can be adjusted by adjusting the circuit design of the corresponding driver circuit 3406 according to the transfer function T(x, y) of the projection lens or lens set. In some embodiments, the driver circuits 3406 are configured so that the full current $I_{full}(x, y)$ of the corresponding LED dies 3408 are preset to be inversely proportional to the transfer function T(x, y) of the projection lens or lens set.

Instead of choosing the design of the driver circuit 3406 to preset the full current of the LED dies 3408, in some embodiments, the driving current of the LED dies 3408 can be adjusted during the operation of the LED panel 3402 according to the transfer function T(x, y) of the projection lens or lens set. In some embodiments, as shown in FIG. 34, the panel control circuit 3404 further includes a memory 3416, which includes a non-transitory computer-readable storage medium and stores instructions that, when executed, cause the controller to adjust the grey-scale signals according to the transfer function T(x, y) of the projection lens or lens set. The adjusted grey-scale signals in turn control the data driver 3412 to adjust the data signals and thus the magnitude of the driving current of the LED dies 3408. For example, for a certain grey scale G(x, y) at position (x, y), if the driving current to generate this grey scale without considering the transfer function T(x, y) is $I_G(x, y)$, then the controller 3410 can adjust the grey-scale signals according to the transfer function T(x, y) in such a way that the actual driving current I(x, y) is inversely proportional to the transfer function T(x, y), i.e.:

$$I(x,y)=I_G(x,y)/T(x,y).$$

In the example shown in FIG. 34, the memory 3416 is depicted as a component separate from the controller 3410. In some embodiments, the memory 3416 can be implemented as a portion of the controller 3410.

Figure 36:
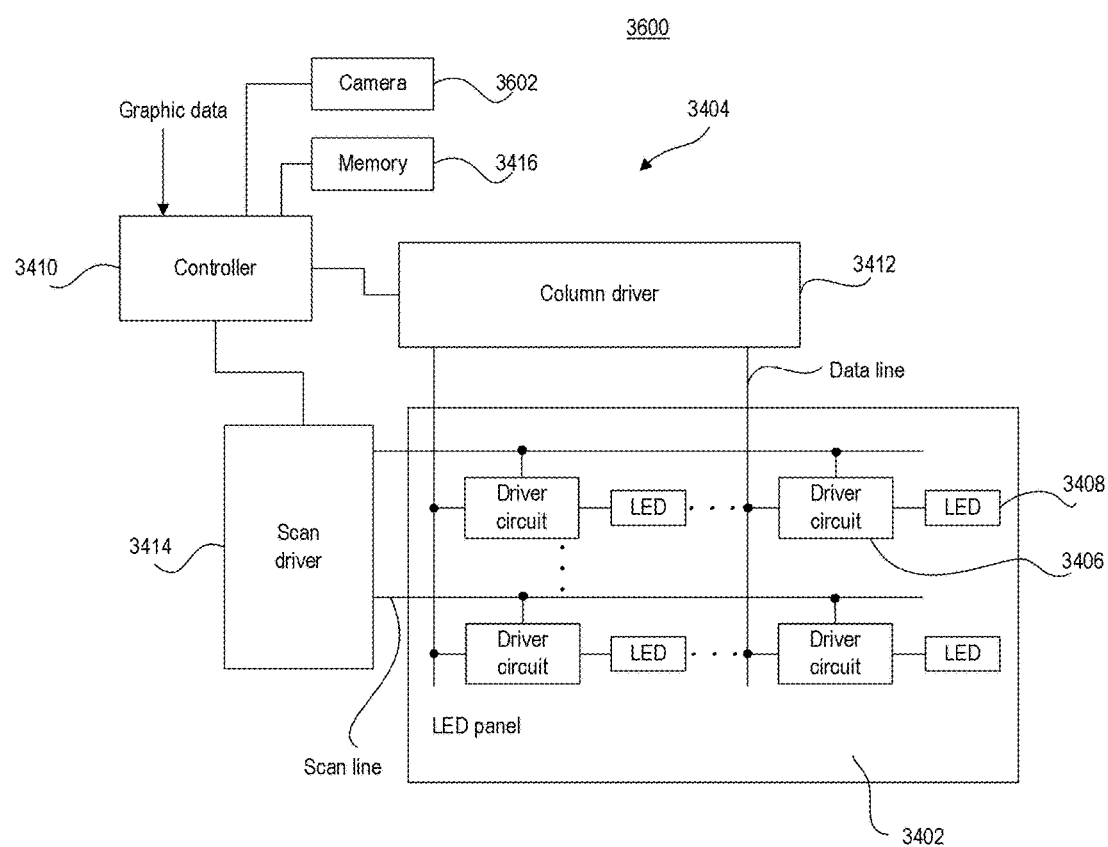
FIG. 36 schematically shows a portion of a projector according to another exemplary embodiment.

In some embodiments, the brightness distribution of the LED panel 3402 can be adjusted dynamically during operation. FIG. 36 schematically shows a portion of an exemplary projector 3600 consistent with the present disclosure. The projector 3600 is similar to the projector 3400, except that the projector 3600 further includes a camera 3602 coupled to the controller 3410. During the operation of the projector 3600, before projecting an actual image intended to be projected, the projector 3600 can project a nominally-uniform test image, i.e., a test image designed to have a same grey scale across the entire image. The test image can be generated, for example, by applying driving currents with an approximately same magnitude to the LED dies 3408. The camera 3602 records the light pattern on the screen, returns the recorded light pattern to the controller 3410, and the controller 3410 adjusts the grey-scale signals for projecting the actual image according to the received light pattern.

Projectors consistent with the present disclosure can be used in various applications, such as family theater systems and presentation projection systems. Further, due to their smaller size as compared to conventional projectors, projectors consistent with the present disclosure are particular suitable for small-size systems, such as virtual reality systems, heads-up display (HUD) systems used in aircrafts or vehicles, or head-mounted display (HMD) systems.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A light-emitting diode (LED) projector, comprising:
a first LED display panel emitting light of a first color and a second LED display panel emitting light of a second color, each one of the first LED display panel and the second LED display panel including:
an LED panel including:
a substrate;
a driver circuit array on the substrate and including a plurality of pixel driver circuits arranged in an array; and
an LED array including a plurality of LED dies each being coupled to one of the pixel driver circuits; and
a micro lens array arranged over the LED array and including a plurality of micro lenses each corresponding to and being arranged over at least one of the LED dies;
a first projection lens arranged in front of the first LED display panel and configured to collect and project light emitted by the first LED display panel; and
a second projection lens arranged in front of the second LED display panel and configured to collect and project the light emitted by the second LED display panel,
wherein the first LED display panel, the second LED display panel, the first projection lens, and the second projection lens are configured and arranged so that:
the first projection lens projects a first image formed by the light emitted by the first LED display panel onto a screen,
the second projection lens projects a second image formed by the light emitted by the second LED display panel onto the screen, and
the first image and the second image overlap on the screen.

2. The LED projector of claim 1, further comprising:
a third LED display panel emitting light of a third color.

3. The LED projector of claim 2, wherein the first, second, and third colors are red, blue, and green, respectively.

4. The LED projector of claim 2, further comprising:
a beam combiner configured to combine the light emitted by the first LED display panel, the light emitted by the second LED display panel, and the light emitted by the third LED display panel.

5. A light-emitting diode (LED) projector, comprising:
a first LED display panel emitting light of a first color and a second LED display panel emitting light of a second color, each one of the first LED display panel and the second LED display panel including:
an LED panel including:
a substrate;
a driver circuit array on the substrate and including a plurality of pixel driver circuits arranged in an array; and
an LED array including a plurality of LED dies each being coupled to one of the pixel driver circuits; and
a micro lens array arranged over the LED array and including a plurality of micro lenses each corresponding to and being arranged over at least one of the LED dies;
a first projection lens arranged in front of the first LED display panel and configured to collect and project light emitted by the first LED display panel;
a second projection lens arranged in front of the second LED display panel and configured to collect and project the light emitted by the second LED display panel; and
a beam combiner configured to combine the light emitted by the first LED display panel and the light emitted by the second LED display panel,
wherein:
the first projection lens is arranged between the first LED display panel and the beam combiner,
the second projection lens is arranged between the second LED display panel and the beam combiner, and
the beam combiner, the first LED display panel, the second LED display panel, the first projection lens, and the second projection lens are configured and arranged so that:
the light emitted by the first LED display panel and the light emitted by the second LED display panel enter the beam combiner at different directions, and
a first image formed by the light emitted by the first LED display panel and a second image formed by the light emitted by the second LED display panel overlap with each other after passing through the beam combiner.

6. The LED projector of claim 5, wherein the beam combiner includes:
a plurality of prisms; and
at least one dichroic mirror to reflect the light emitted by the first LED display panel and allow the light emitted by the second LED display panel to pass through.

7. A light-emitting diode (LED) projector, comprising:
a first LED display panel emitting light of a first color and a second LED display panel emitting light of a second color, each one of the first LED display panel and the second LED display panel including:
an LED panel including:
a substrate;
a driver circuit array on the substrate and including a plurality of pixel driver circuits arranged in an array; and
an LED array including a plurality of LED dies each being coupled to one of the pixel driver circuits; and
a micro lens array arranged over the LED array and including a plurality of micro lenses each corresponding to and being arranged over at least one of the LED dies;
a projection lens arranged in front of the first LED display panel and the second LED display panel and configured to collect and project light emitted by the first LED display panel and the second LED display panel; and
a beam combiner configured to combine the light emitted by the first LED display panel and the light emitted by the second LED display panel, wherein:
the beam combiner is arranged between the first LED display panel and the projection lens, and between the second LED display panel and the projection lens, and
the beam combiner, the first LED display panel, and the second LED display panel are arranged so that:
the light emitted by the first LED display panel and the light emitted by the second LED display panel enter the beam combiner along different directions, and
a first image formed by the light emitted by the first LED display panel and a second image formed by the light emitted by the second LED display panel overlap with each other after passing through the beam combiner.

8. A light-emitting diode (LED) projector, comprising:
a first LED display panel emitting light of a first color, a second LED display panel emitting light of a second color, and a third LED display panel emitting light of a third color, each one of the first and second LED display panels including:
an LED panel including:
a substrate;
a driver circuit array on the substrate and including a plurality of pixel driver circuits arranged in an array; and
an LED array including a plurality of LED dies each being coupled to one of the pixel driver circuits; and
a micro lens array arranged over the LED array and including a plurality of micro lenses each corresponding to and being arranged over at least one of the LED dies;
a projection lens arranged in front of the first through third LED display panels and configured to collect and project light emitted by the first through third LED display panels; and
a beam combiner configured to combine the light emitted by the first LED display panel, the light emitted by the second LED display panel, and the light emitted by the third LED display panel,
wherein the beam combiner includes:
a plurality of prisms;
a first dichroic mirror to reflect the light of the first color and allow the light of the second color and the light of the third color to pass through; and
a second dichroic mirror to reflect the light of the second color and allow the light of the first color and the light of the third color to pass through.

9. The LED projector of claim 8, wherein the beam combiner further includes:
a first input surface through which the light emitted by the first LED display panel enters the beam combiner,
a second input surface through which the light emitted by the second LED display panel enters the beam combiner,
a third input surface through which the light emitted by the third LED display panel enters the beam combiner, and
an output surface through which combined light exits from the beam combiner.

10. The LED projector of claim 9, wherein the third input surface is parallel to the output surface.

11. The LED projector of claim 10, wherein the first input surface and the second input surface are arranged symmetric to each other with respect to a line perpendicular to the output surface.

12. The LED projector of claim 11, wherein the first input surface and the second input surface are perpendicular to the output surface.

13. The LED projector of claim 10, wherein the first input surface and the second input surface are arranged asymmetric to each other.

14. A light-emitting diode (LED) projector, comprising:
an LED display panel including:
an LED panel including:
a substrate;
a driver circuit array on the substrate and including a plurality of pixel driver circuits arranged in an array; and
an LED array including a plurality of LED dies each being coupled to one of the pixel driver circuits; and
a micro lens array arranged over the LED array and including a plurality of micro lenses each corresponding to and being arranged over at least one of the LED dies; and
a projection lens arranged in front of the LED display panel and configured to collect and project light emitted by the LED display panel,
wherein:
the projection lens has a non-uniform transfer function characterizing a percentage of light emitted by the LED dies that is collected and projected by the projection lens,
the pixel driver circuits are configured so that a maximum driving current of an LED die is inversely proportional to a value of the transfer function corresponding to the LED die.

15. A light-emitting diode (LED) projector, comprising:
an LED display panel including:
an LED panel including:
a substrate;
a driver circuit array on the substrate and including a plurality of pixel driver circuits arranged in an array; and
an LED array including a plurality of LED dies each being coupled to one of the pixel driver circuits; and
a micro lens array arranged over the LED array and including a plurality of micro lenses each corresponding to and being arranged over at least one of the LED dies; and
a projection lens arranged in front of the LED display panel and configured to collect and project light emitted by the LED display panel,
wherein the projection lens has a non-uniform transfer function characterizing a percentage of light emitted by the LED dies that is collected and projected by the projection lens,
the LED projector further comprising:
a panel control circuit configured to control operation of the LED panel, the panel control circuit including:
a controller configured to receive data indicating the transfer function and generate grey-scale signals according to the data indicating the transfer function; and
a data driver configured to receive the grey-scale signals and generate data signals for the LED dies on the LED panel according to the grey-scale signals such that a magnitude of a driving current of an LED die is inversely proportional to a value of the transfer function corresponding to the LED die.

16. A light-emitting diode (LED) projector, comprising:
an LED display panel including:
  an LED panel including:
    a substrate;
    a driver circuit array on the substrate and including a plurality of pixel driver circuits arranged in an array; and
    an LED array including a plurality of LED dies each being coupled to one of the pixel driver circuits; and
  a micro lens array arranged over the LED array and including a plurality of micro lenses each corresponding to and being arranged over at least one of the LED dies;
a projection lens arranged in front of the LED display panel and configured to collect and project light emitted by the LED display panel;
a camera configured to capture a light pattern projected by the LED projector while the LED dies are respectively driven by driving currents with an approximately same magnitude; and
a panel control circuit configured to control operation of the LED panel, the panel control circuit including:
  a controller configured to receive the light pattern captured by the camera and generate grey-scale signals according to the captured light pattern; and
  a data driver configured to receive the grey-scale signals and generate data signals for the LED dies on the LED panel according to the grey-scale signals such that a magnitude of a driving current of an LED die is inversely proportional to a brightness level on the light pattern at a position corresponding to the LED die.

* * * * *